(12) United States Patent
Toner et al.

(10) Patent No.: US 12,113,106 B2
(45) Date of Patent: *Oct. 8, 2024

(54) LDMOS WITH SELF-ALIGNED BODY AND HYBRID SOURCE

(71) Applicants: Amplexia, LLC, Durham, NC (US); X-FAB Global Services GmbH, Erfurt (DE)

(72) Inventors: Brendan Toner, Kuching (MY); Zhengchao Liu, Kuching (MY); Gary M Dolny, Mountain Top, PA (US); William R Richards, Cary, NC (US); Manoj Chandrika Reghunathan, Trivandrum (IN); Stefan Eisenbrandt, Erfurt (DE); Christoph Ellmers, Dresden (DE)

(73) Assignees: Amplexia, LLC, Durham, NC (US); X-FAB Global Services GmbH, Erfurt (DE)

( * ) Notice: Subject to any disclaimer, the term of this patent is extended or adjusted under 35 U.S.C. 154(b) by 50 days.

This patent is subject to a terminal disclaimer.

(21) Appl. No.: 17/979,581

(22) Filed: Nov. 2, 2022

(65) Prior Publication Data

US 2023/0054381 A1 Feb. 23, 2023

Related U.S. Application Data

(62) Division of application No. 17/541,592, filed on Dec. 3, 2021, now Pat. No. 11,522,053.

(Continued)

(51) Int. Cl.
*H01L 29/10* (2006.01)
*H01L 29/40* (2006.01)
(Continued)

(52) U.S. Cl.
CPC ...... *H01L 29/1087* (2013.01); *H01L 29/1083* (2013.01); *H01L 29/1095* (2013.01);
(Continued)

(58) Field of Classification Search
CPC ............ H01L 29/1087; H01L 29/1083; H01L 29/1095; H01L 29/401; H01L 29/41783;
(Continued)

(56) References Cited

U.S. PATENT DOCUMENTS

| 3,906,540 A | 9/1975 | Hollins |
| 4,362,597 A | 12/1982 | Fraser et al. |

(Continued)

FOREIGN PATENT DOCUMENTS

| JP | H02 119184 A | 5/1990 |
| WO | 2017192432 A1 | 11/2017 |

(Continued)

OTHER PUBLICATIONS

Information Disclosure Statement (IDS) Letter Regarding Common Patent Application(s), dated Dec. 10, 2022.

(Continued)

*Primary Examiner* — Shahed Ahmed
*Assistant Examiner* — Khatib A Rahman
(74) *Attorney, Agent, or Firm* — Tillman, Wright & Wolgin; James D. Wright; Neal B. Wolgin

(57) ABSTRACT

Devices and methods for providing a power transistor structure with a shallow source region include implanting a dopant of a first dopant polarity into a drift region on a source side of a gate structure to form a body region, the body region being self-aligned to, and extending under, the gate structure, and producing a shallow body region wherein the source side hybrid contact mitigates punch through of the shallow self-aligned body region and suppresses triggering of a parasitic bipolar. A retrograde body well, of the (Continued)

first dopant polarity, may be disposed beneath, and noncontiguous with, the shallow self-aligned body region, wherein the retrograde body well improves the electric field profile of the shallow self-aligned body region. A variety of power transistor structures are produced from such devices and methods.

6 Claims, 55 Drawing Sheets

Related U.S. Application Data

(60) Provisional application No. 63/121,359, filed on Dec. 4, 2020.

(51) Int. Cl.
*H01L 29/417* (2006.01)
*H01L 29/47* (2006.01)
*H01L 29/66* (2006.01)
*H01L 29/78* (2006.01)

(52) U.S. Cl.
CPC ...... *H01L 29/401* (2013.01); *H01L 29/41783* (2013.01); *H01L 29/47* (2013.01); *H01L 29/66484* (2013.01); *H01L 29/66696* (2013.01); *H01L 29/7816* (2013.01); *H01L 29/7831* (2013.01)

(58) Field of Classification Search
CPC .............. H01L 29/47; H01L 29/66484; H01L 29/66696; H01L 29/7816; H01L 29/7831; H01L 21/26586; H01L 29/0619; H01L 29/0623; H01L 29/665; H01L 29/66689; H01L 29/0653; H01L 29/42368; H01L 29/7839; H01L 29/7835
See application file for complete search history.

(56) References Cited

U.S. PATENT DOCUMENTS

| | | |
|---|---|---|
| 4,692,348 A | 9/1987 | Rubloff et al. |
| 4,983,535 A | 1/1991 | Blanchard |
| 5,567,969 A | 10/1996 | Hall |
| 5,585,294 A | 12/1996 | Smayling et al. |
| 5,629,544 A | 5/1997 | Voldman et al. |
| 5,663,584 A | 9/1997 | Welch |
| 5,808,340 A | 9/1998 | Wollesen et al. |
| 5,811,857 A | 9/1998 | Assaderaghi et al. |
| 5,960,271 A | 9/1999 | Wollesen et al. |
| 6,015,993 A | 1/2000 | Voldman et al. |
| 6,232,163 B1 | 5/2001 | Voldman et al. |
| 6,252,278 B1 | 6/2001 | Hsing |
| 6,303,479 B1 | 10/2001 | Snyder |
| 6,339,005 B1 | 1/2002 | Bryant et al. |
| 6,353,520 B1 | 3/2002 | Andresen et al. |
| 6,495,882 B2 | 12/2002 | Snyder |
| 6,686,233 B2 | 2/2004 | Söderbärg et al. |
| 6,744,103 B2 | 6/2004 | Snyder |
| 6,777,745 B2 | 8/2004 | Hshieh et al. |
| 6,876,035 B2 | 4/2005 | Abadeer et al. |
| 6,900,101 B2 | 5/2005 | Lin |
| 6,958,515 B2 | 10/2005 | Hower et al. |
| 7,052,941 B2 | 5/2006 | Lee |
| 7,081,655 B2 | 7/2006 | Maszara |
| 7,173,310 B2 | 2/2007 | Voldman et al. |
| 7,176,537 B2 | 2/2007 | Lee et al. |
| 7,221,019 B2 | 5/2007 | Snyder et al. |
| 7,306,998 B2 | 12/2007 | Maszara |
| 7,432,579 B2 | 10/2008 | Matsudai et al. |
| 7,544,557 B2 | 6/2009 | Levin et al. |
| 7,575,977 B2 | 8/2009 | Levin et al. |
| 7,576,388 B1 | 8/2009 | Wilson et al. |
| 7,745,846 B2 | 6/2010 | Korec et al. |
| 7,851,889 B2 | 12/2010 | Zhu et al. |
| 7,960,997 B2 | 6/2011 | Williams |
| 8,058,167 B2 | 11/2011 | Snyder et al. |
| 8,154,025 B2 | 4/2012 | Snyder et al. |
| 8,508,015 B2 | 8/2013 | Allen et al. |
| 8,889,537 B2 | 11/2014 | Cabral, Jr. et al. |
| 9,337,329 B2 | 5/2016 | Hu et al. |
| 9,425,304 B2 | 8/2016 | Zhang et al. |
| 9,947,787 B2 | 4/2018 | Dolny et al. |
| 10,090,409 B2 | 10/2018 | McGregor et al. |
| 10,510,869 B2 | 12/2019 | Dolny et al. |
| 10,892,362 B1 | 1/2021 | Toner et al. |
| 11,024,733 B2 * | 6/2021 | Snyder ............... H01L 27/0617 |
| 11,322,611 B2 * | 5/2022 | Toner ............... H01L 29/66515 |
| 11,522,053 B2 | 12/2022 | Toner et al. |
| 2004/0027742 A1 | 2/2004 | Miller et al. |
| 2004/0119103 A1 | 6/2004 | Thapar |
| 2005/0035410 A1 | 2/2005 | Yeo et al. |
| 2005/0098845 A1 | 3/2005 | Matsudai et al. |
| 2006/0054967 A1 * | 3/2006 | Ludikhuize ........... H01L 27/088 257/E27.06 |
| 2007/0001223 A1 | 1/2007 | Boyd et al. |
| 2008/0164537 A1 * | 7/2008 | Cai .................. H01L 29/66659 438/303 |
| 2009/0102007 A1 | 4/2009 | Kocon |
| 2009/0230468 A1 * | 9/2009 | Cai ..................... H01L 29/7816 257/337 |
| 2010/0059819 A1 | 3/2010 | Snyder |
| 2010/0230751 A1 * | 9/2010 | Botula .............. H01L 29/7839 257/E21.409 |
| 2011/0049624 A1 | 3/2011 | Guo et al. |
| 2011/0057230 A1 | 3/2011 | Udrea et al. |
| 2012/0080728 A1 | 4/2012 | Malhan |
| 2012/0139047 A1 | 6/2012 | Luo et al. |
| 2012/0175704 A1 * | 7/2012 | Jiang .................. H01L 29/7821 438/237 |
| 2012/0181586 A1 | 7/2012 | Luo et al. |
| 2012/0193747 A1 | 8/2012 | Rassel et al. |
| 2012/0211859 A1 | 8/2012 | Stribley et al. |
| 2012/0220091 A1 | 8/2012 | Challa et al. |
| 2013/0114170 A1 | 5/2013 | Chen et al. |
| 2013/0140625 A1 * | 6/2013 | Piao .................... H01L 29/0847 257/327 |
| 2013/0277791 A1 | 10/2013 | Nassar et al. |
| 2014/0357038 A1 | 12/2014 | Shekar |
| 2015/0001620 A1 | 1/2015 | McGregor et al. |
| 2015/0001666 A1 | 1/2015 | Chiang |
| 2015/0084118 A1 | 3/2015 | Van Brunt et al. |
| 2015/0187928 A1 | 7/2015 | Wang et al. |
| 2015/0243501 A1 | 8/2015 | Thomason et al. |
| 2016/0260831 A1 | 9/2016 | Prasad et al. |
| 2017/0323970 A1 | 11/2017 | Dolny et al. |
| 2017/0373180 A1 | 12/2017 | Haeberlen et al. |
| 2018/0212041 A1 | 7/2018 | Dolny et al. |
| 2018/0261495 A1 * | 9/2018 | Yang ................. H01L 21/76237 |
| 2018/0286857 A1 * | 10/2018 | Wang ............... H01L 29/66734 |
| 2018/0358352 A1 | 12/2018 | Voldman et al. |
| 2019/0237457 A1 * | 8/2019 | Yamada ............. H01L 21/8234 |
| 2019/0288063 A1 * | 9/2019 | Komatsu ............ H01L 29/0696 |
| 2020/0220005 A1 * | 7/2020 | Huang ............... H01L 29/0692 |
| 2021/0028166 A1 * | 1/2021 | Shin ................... H01L 27/088 |
| 2021/0118987 A1 * | 4/2021 | Yao .................... H01L 29/7835 |
| 2021/0134954 A1 * | 5/2021 | Lin .................. H01L 29/66681 |
| 2021/0134999 A1 | 5/2021 | Toner et al. |
| 2021/0167190 A1 * | 6/2021 | Jin .................... H01L 29/66659 |
| 2021/0280680 A1 * | 9/2021 | Xu ..................... H01L 29/407 |
| 2021/0359132 A1 * | 11/2021 | Mun ................. H01L 29/7825 |

(56) References Cited

U.S. PATENT DOCUMENTS

2022/0181444 A1 6/2022 Toner et al.
2022/0254914 A1 8/2022 Toner et al.

FOREIGN PATENT DOCUMENTS

WO 2018227086 A1 12/2018
WO 2021092117 A1 5/2021
WO 2022120175 A1 6/2022

OTHER PUBLICATIONS

Chen, Chi-Kuang, Huang, Chien-Fu, Chang, Yi-Feng, Lee, Jam-Wem, Cheng, Shui-Ming, Song, Ming-Hsiang, Schottky Emmitter High Holding Voltage ESD Clamp in BCD Power Technology, Aug. 2012, (6 pages).
Jain, A. & Parthavi, U.M.; "Schottky Laterally Double Diffused Metal Oxide Semiconductor", Department of Electrical Engineering, Indian Institute of Technology, Delhi, Hauz Khas, New Delhi—110016, India, May 2010.
Atsuhiro Kinoshita, "Dopant Segregated Schottky S/D and Application to High Performance MOSFETs", Ext. Abs. the th International Workshop on Junction Technology, 2009, pp. 34-37.
Atsuhiro Kinoshita, "Dopant-Segregated Source/Drain Technology for High-Performance CMOS", IEDM 2008.
T. Kinoshita, R. Hasumi, M. Hamaguchi, K. Miyashita, T. Komoda, A. Kinoshita, J. Koga, K. Adachi, Y. Toyoshima, T. Nakayama, S. Yamada and F. Matsuoka, "Ultra-Low Voltage Operations in Bulk CMOS Logic Circuits with Dopant Segregated Schottky Source/Drain Transistors", IEDM 2006.
A. Kinoshita, C. Tanaka, K. Uchida and J. Koga, "High-performance 50-nm-Gate-Length Schottky-Source/Drain MOSFETs with Dopant-Segregation Junctions", Symposium on VLSI Technology Digest of Technical Papers, 2005, pp. 158-159.
A. Kinoshita, Y. Tsuchiya, A. Yagishita, K. Uchida and J. Koga, "Solution for High-Performance Schottky-Source/Drain MOSFETs: Schottky Barrier Height Engineering with Dopant Segregation Technique", Symposium on VLSI Technology Digest of Technical Papers, pp. 168-169, 2004.
Lee et al. "Schottky LDNMOS for HV ESD Protection". Globalfoundries Inc., (10 pages).
Lin, Chun-Yu, "Diode String With Reduced Clamping Voltage for Efficient On-Chip ESD Protection". IEEE Transaction on Device and Materials Reliability, vol. 16, No. 4 Dec. 2016, pp. 688-690, (3 pages).
Nishi, Yoshifumi, et al., "Schottky barrier height modulation by atomic dipoles at the silicide/silicon interface", Physical Review B 84, 115323 (2011), published Sep. 26, 2011, (6 pages).
Nishisaki et al. "Schottky SOI MOSFET with Shallow Doped-Extension" The Japan Society of Applied Physics, Japanese Journal of Applied Physics, vol. 42, Part 1 No. 4B, (2009).
U.S. Appl. No. 62/333,073, Dolny et al., Filed May 6, 2016, Drawings, Specification, Claims, Abstract.
Toner et al. "Schottky Source LDMOS—Electrical SOA Improvement through BJT Suppression", (4 pages).
Zhang et al., "Probing the Interface Barriers of Dopant-Segregated Silicide-Si Diodes With Internal Photoemission" IEEE Transactions of Electron Devices, vol. 59, No. 8, Aug. 2012, pp. 2027-2032, (6 pages).
"International Search Report" and "Written Opinion of the International Searching Authority" (ISA/US) in Silicet, LLC, International Patent Application Serial No. PCT/US2021/061818, mailed Mar. 25, 2022 (10 pages).

\* cited by examiner

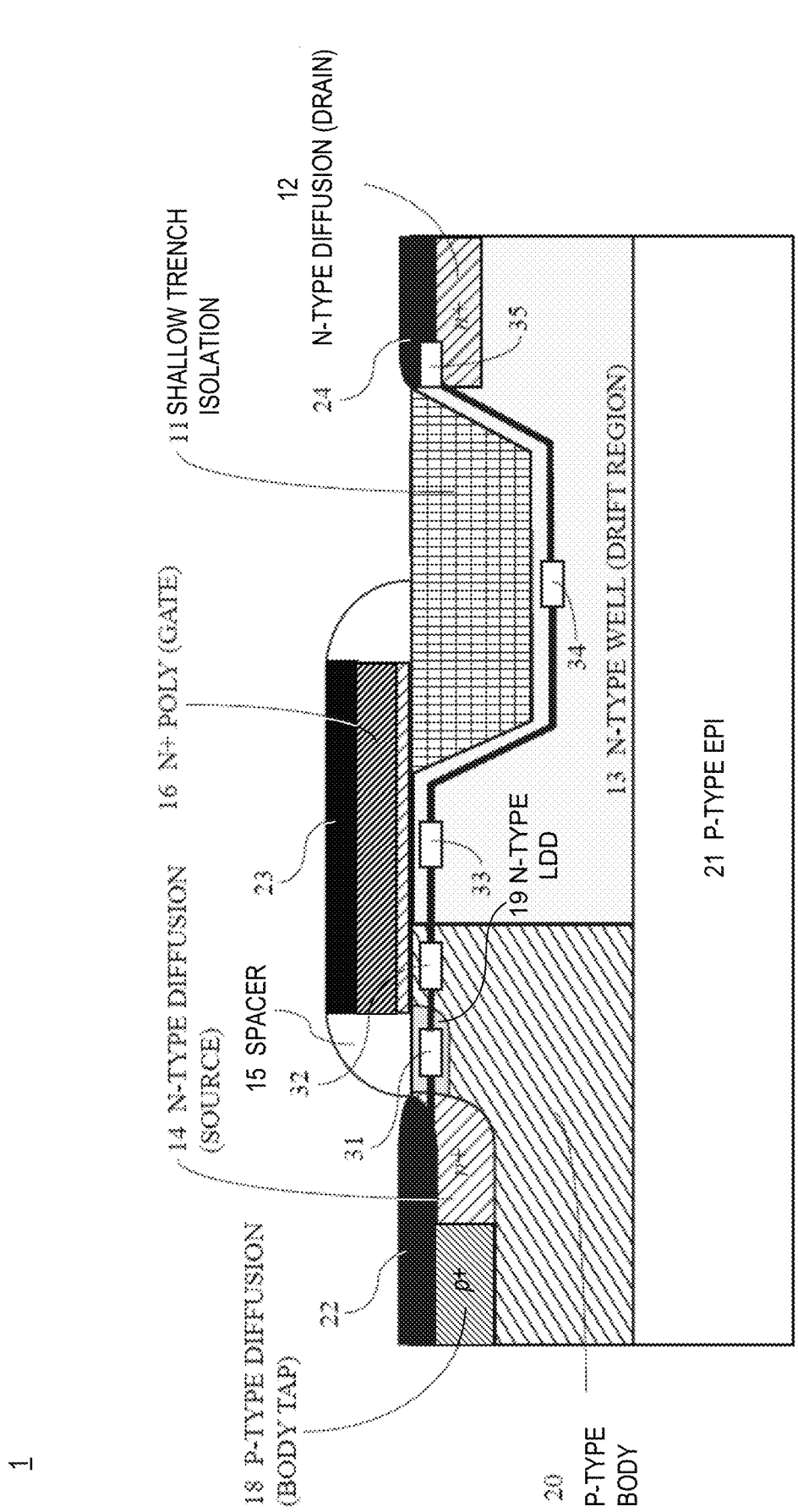
FIG. 1 *prior art*

*prior art*

| STEP # | STEP NAME | | |
|---|---|---|---|
| 1 | Shallow Trench Isolation | No/Active Isolation: Skip Step | STI – skip step | Active | Gate to Drain Isolation |
| 2 | N-type Diffusion | Across Entire Device (n-drift) (Global) | Across Partial Device (n-drift) (Mask-defined) — N-Drift | |
| 3 | Deep Body Well | No Deep Well | Deep Well — Buried Body, or Retrograde — Deep Body Well | |
| 4 | Gate Structure Formation | Poly on Gate Oxide | Adjacent/Overlay to Oxide | Poly on Gate Oxide — Gate Structure |
| 5 | Self-Aligned Implants (order does not matter) | Self-Aligned Body & Hybrid Contact Formation (Source-side only) | or | S-A Body & H.C. Formation (Source & Drain-side) |
| 6 | Spacer Structure Formation | Spacer Structure | | |
| 7 | Diffusion Implants (order does not matter) | N+ Drain Diffusion / P+ Body Tie Diffusion | | |
| 8 | Silicide Block | No/Active Isolation: Skip Step | Silicide block oxide formed partially on gate and extending to drain | |
| 9 | Oxide Silicidation | Silicidation | | |

LDMOS WITH SELF-ALIGNED BODY AND HYBRID SOURCE

CROSS-REFERENCE TO RELATED APPLICATIONS

For purposes of the United States, the present application is a divisional patent application of, and claims the benefit under 35 U.S.C § 120 to U.S. patent application Ser. No. 17/541,592, filed Dec. 3, 2021, (the "'592 application"), which issues Dec. 6, 2022, as U.S. Pat. No. 11,522,053, which is a non-provisional patent application of, and claims the benefit under 35 U.S.C § 119(e) to, U.S. Provisional Patent Application No. 63/121,359, filed Dec. 4, 2020, the entirety of which is expressly incorporated herein by reference.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The disclosure relates generally to structures and corresponding design methods of metal oxide semiconductor field effect transistors (MOSFETs), and more particularly, to the device structures and associated methods used to create lateral double-diffused LDMOS transistor(s) with a body region self-aligned to the gate polysilicon and a Schottky source hybrid contact.

Background

In the field of MOSFET power transistors, improving semiconductor performance, reliability and robustness is a particular focus for the development of high voltage/high current capabilities in LDMOS device architectures readily found in Bipolar-CMOS-DMOS (BCD) process technologies. Primary metrics include low-area specific on-resistance (Rsp), drive current (Idsat), electrical safe operating area (E-SOA), and electrostatic discharge (ESD) robustness. In at least some embodiments, the present invention addresses and improves one or more of these or other items by integrating a Schottky source hybrid contact with a self-aligned body to provide a shallow source and an ultra-short channel. The self-aligned body enables a reduction in the specific-on resistance and higher drive current, and the hybrid source mitigates punch through, improves the ESD capability and enhances the safe operating area of the LDMOS device.

For purposes of illustration, FIG. 1 is a cross-sectional view of an exemplary prior art single-finger LDMOS device 1 illustrating various constituent resistances 31,32,33,34,35 seen by the current passing from the source to the drain of the LDMOS. The LDMOS device 1 of FIG. 1 has a p-type substrate 21, a p-type body 20, an n-type well 13, a body tap 18 (made of p-type diffusion) to prevent float in the body region, shallow trench isolation 11, a polysilicon gate structure 16 (polysilicon on gate oxide) and gate sidewall spacer structure 15, a source region 14 (made of n-type diffusion), a lightly doped drain (LDD) 19 (made of n-type diffusion), a drain region 12 (made of n-type diffusion), and ohmic contacts 22,23,24 at the source (with abutted body tap 18), at the gate and at the drain, respectively, created by silicide placement. Resistance R1 is the source resistance 31, resistance R2 is the channel resistance 32, resistance R3 is the accumulation region resistance 33, resistance R4 is the drift region resistance 34, and resistance R5 is the drain resistance 35. Generally, for Power Transistors, the Figure of Merit (FoM) used to report the resistance is the specific on-resistance (Rsp), whose units are typically milli-Ohm by square millimeter ($mm^2$). From the units, it is clearly advantageous to minimize both the constituent resistances of the LDMOS device 1 and the overall area required for the device.

One approach to achieve both reduced resistance and device area is the use of a self-aligned body, whose channel length is much shorter than that of a conventional LDMOS. In this regard, FIG. 2A illustrates a conventional LDMOS body implantation 28 which relies on a photolithography-defined opening in a photoresist coating 59 to define which area is to be implanted, thus creating the body 20, while FIG. 2B illustrates a self-aligned LDMOS body implantation 29 which uses the polysilicon gate 16 as a mask during ion implantation to define the edge of the body region, thus creating the body 20. A conventional LDMOS body formation, shown in FIG. 2A, occurs before the polysilicon gate is formed, using a vertical implant 28, where the opening in the photoresist coating 59 defines both boundaries of the implanted p-type body well 20. On the other hand, body formation in a self-aligned body LDMOS, as shown in FIG. 2B, utilizes the polysilicon gate 16 as well as the photoresist coating 59 to mask the body implantation 29, and a tilted implant is normally used to form the p-type body well 20, where some of the implanted species extends under the polysilicon gate to enable a short channel region to be formed when the gate is biased. This approach minimizes the channel resistance 32 contribution shown as R2 in FIG. 1.

The self-aligned body approach shown in FIG. 2B illustrates several key differences. A first difference is that the body implant 29 occurs after the gate formation as opposed to the conventional implant 28, in which it occurs before the gate formation. A second difference is that the photoresist pattern 59 is modified such that the channel side of the implant is masked by the polysilicon gate 16 in FIG. 2B rather than by the photoresist coating 59 in FIG. 2A. A third difference is that a rotated, quad body implant 29 is used to enable the LDMOS devices to be oriented in 90 degree increments, allowing flexibility in device layout orientation. In this regard, it will be appreciated that FIG. 2B only illustrates one quarter of the quad implant, but it should be clear to one skilled in the art that a quad rotated, tilted implant requires proper adjustments of dose as well as angle to achieve the required electrical behavior.

Fundamental differences between the two architectures are apparent when a conventional LDMOS is contrasted against a self-aligned body LDMOS. In this regard, FIG. 3A is a cross-sectional view of a single-finger conventional prior art LDMOS device 30, and FIG. 3B is a cross-sectional view of a single-finger self-aligned body prior art LDMOS device 31. The conventional LDMOS device 30 of FIG. 3A has a p-type substrate 21, a p-type body 20, a channel length 53, an n-type well 13, a body tap 18 (made of p-type diffusion), shallow trench isolation 11, a gate structure 16

(polysilicon on gate oxide) and gate sidewall spacer structure 15, a source region 14 (made of n-type diffusion), a lightly doped drain (LDD) 19 (made of n-type diffusion), a drain region 12 (made of n-type diffusion), and ohmic contacts 22,23,24 at the source (with abutted body tap 18) at the gate, and at the drain, respectively, created by silicide placement. The self-aligned body LDMOS device 31 of FIG. 3B has a p-type substrate 21, a p-type body 40, a noticeably shorter channel length 52, and n-type well 13, a body tap 18 (made of p-type diffusion), shallow trench isolation 11, a gate structure 16 (polysilicon on gate oxide) and gate sidewall spacer structure 15, a source region 14 (made of n-type diffusion), a lightly doped drain (LDD) 19 (made of n-type diffusion), a drain region 12 (made of n-type diffusion), and ohmic contacts 22,23,24 at the source (with abutted body tap 18), gate, and drain, respectively, created by silicide placement. Because the self-aligned body region typically extends laterally beneath the gate structure 16 only a short distance (usually less than 0.2 micron in current technologies), the channel length 52 of the self-aligned body LDMOS device 31 is shorter than the channel length 53 of a conventional LDMOS device 30, resulting in reduced channel resistance (R2) 32 (the channel resistance being illustrated in FIG. 1). If the channel length is shortened, the accumulation region length and thus R3 33 would increase, but then modification of the layout may be done to maintain the same accumulation length. This, in turn, results in a reduction of the pitch of a two-finger LDMOS device (examples of which are described hereinbelow) as well as a reduction 55 of the half pitch 73,72, which as shown in FIGS. 3A and 3B is the distance from the center of the source region contact to the center of the drain contact. The resulting half pitch reduction 55 is the equal to the difference between the respective channel lengths 53,52. Reducing channel resistance and device pitch are both helpful in reducing the specific on-resistance and overall device area of an LDMOS device.

The use of a polysilicon gate structure as an implant mask to create a self-aligned body LDMOS device is widely practiced. U.S. Pat. No. 7,776,700 to Yang et al. ("Yang") discloses using the polysilicon gate as a mask for both the self-aligned body implant "HALO pocket" and for the source region "n-type implant." For the body implant, Yang advocates an implant angle of 45 to 60 degrees. The source "n-type implant" is implanted at an angle of 0 degrees. U.S. Pat. No. 6,686,233 to Soderbarg et al. also advocates such an approach, whereby the source implantation is vertical and the body implants are tilted, and both implants are "self-aligned to the edge of the gate region . . . to thereby create the doped channel region partly underneath the gate region."

Unfortunately, although the self-aligned body improves drive current and reduces on-resistance (Rsp), there are also some intrinsic disadvantages. With the channel only being tens of nanometers long, there is an inherent risk of punch through between the source region and the drift region. For example, FIG. 4 plots current density for a PN source, illustrating the punch through mechanism from n+ source to n-type drift well. Even in the absence of punch through, the small radius of the self-aligned body region can result in high electric fields at the corner of the body region under the polysilicon gate, as illustrated for example, in FIG. 5. This high electric field results in higher leakage and lower breakdown. In an LDMOS device, the p-type well is both the body of the transistor and the base of a parasitic bipolar junction transistor (BJT). This is illustrated in FIG. 6, which is a cross-sectional view of a single-finger conventional self-aligned body LDMOS device 60. The LDMOS device 60 of FIG. 6 has a p-type substrate 21, a p-type body 40, an n-type well 13, a body tap 18 (made of p-type diffusion), shallow trench isolation 11, a gate structure 16 (polysilicon on gate oxide) and gate sidewall spacer structure 15, a source region 14 (made of n-type diffusion), a drain region 12 (made of n-type diffusion), and ohmic contacts 22,23,24 at the source (with abutted body tap 18), at the gate and at the drain, respectively, created by silicide placement. During an ESD event, hole current (hi) 42 flows through the body/base resistance, Rbulk 49, and creates a base-emitter voltage, triggering the parasitic BJT 41 and causing the BJT to snapback—decreasing the safe operating area and thus decreasing the ruggedness of LDMOS device 60. Both punch through and ruggedness issues are discussed in more detail by Contiero (ISPSD 1996).

Efforts have been made to mitigate some of the problems associated with self-aligned body LDMOS transistors. U.S. Pat. No. 9,087,774 to Jung et al. ("Jung '774") addresses the issue of punch through between the n+ source and the n-type region through the use of a deep, p-type implant after the self-aligned body formation. Notably, the deeper body region and the shallow region form a continuous well of the same doping polarity. Moreover, the continuous nature of these wells and the high doping just under the source are key factors in remedying the stated punch through and robustness problems. This has the effect of reducing the parasitic BJT body resistance 49, thereby suppressing the triggering of the BJT and enabling an extension to the safe operating area.

U.S. Pat. No. 6,958,515 Hower et al. ("Hower") discloses an "n-channel LDMOS with buried p-type region to prevent parasitic bipolar" and refers to a "buried body" beneath the source region and normal body diffusions, providing a low impedance path for holes emitted at the drain region. FIG. 7 is a cross-sectional view of a single-finger conventional LDMOS device 70 with deep p-type buried body 58 as described by Hower. Hower's LDMOS device 70 has a p-type substrate 21, a p-type body 20, a p-type buried body 58, an n-type well 13, shallow trench isolation 11, a polysilicon gate structure 16 (polysilicon on gate oxide) and gate sidewall spacer structure (not shown), a source region 14 (made of n-type diffusion), a lightly doped drain (LDD) (made of n-type diffusion) (not shown), and a drain region 12 (made of n-type diffusion). The traditional approach to mitigate the parasitic BJT 41 illustrated in FIG. 6 is to use a highly-doped buried body 58, as shown in FIG. 7. The effect of this approach is to reduce the base resistance, Rbulk 49 in FIG. 6. With lower Rbulk 49, less base-emitter voltage can be developed across this resistance in response to hole current ($h_{hi}$) 42 from the drain-bulk junction breakdown. With lower base-emitter voltage, the triggering of the bipolar is suppressed. Hower's approach is widely utilized in a non-self-aligned body LDMOS like the device 30 of FIG. 3A. Unfortunately, in the context of a self-aligned LDMOS like the device 31 of FIG. 3B, the use of conventional highly-doped, deep body implantation becomes more problematic. The use of deeper p-type implants to improve ESD requires an implant mask thicker than the gate polysilicon alone can offer. There are two approaches to do such an implant, as a standard lithographically-defined implant early in the process or during the gate structure formation. However, in both cases, the implant must be under the source region to suppress the parasitic BJT, and in both cases, problems can arise.

U.S. Pat. No. 9,887,288 to Edwards et al. ("Edwards") discloses a standard lithographically-defined deep, high energy p-type implantation early in the process of a conventional self-aligned body LDMOS. Edwards states that the "deep p-body doping . . . provided by SPW1 . . . increases the base doping level to suppress the parasitic lateral NPN bipolar" (described in FIG. 6 as BJT 41), but due to the deep nature of this high energy implant under the source, some lateral spread of the implantation can be expected. The lateral spread of the deep p-type implant can extend beyond the gate polysilicon, and even beyond the p-type self-aligned body, thereby increasing the channel length of the device, which negatively influences the electrical parameters such as threshold voltage and saturation current. Moreover, since the body region is extended by a lithographically-defined deep p-type implant, it ceases to be truly self-aligned, which impacts the saturation current as a function of the lateral spacing between the deep p-type implant and the polysilicon gate. If the lithographically-defined position is moved laterally away from the gate polysilicon, other problems such as punch through from the n+ source region to the drift region can be observed, as disclosed in U.S. Pat. No. 10,090,409 to McGregor et al. ("McGregor"). Both the lateral spread and the lithographically-defined position result in problems if placed on device 31 in FIG. 3B.

U.S. Pat. No. 8,796,100 to Jung ("Jung '100"), addresses the issue of high electric fields at the corner of the shallow body region. Jung '100 discloses a standard lithographically-defined deep, high energy p-type implantation before gate formation in the process of a conventional self-aligned body LDMOS. Jung '100 states that "the electric field crowding occurs at the turning point of the Pbase (p-type body), wherein the body curvature . . . is controlled by adjusting the layout width of the Pwell (deep p-type body)." The continuous, p-type regions form a "combined outline that reduces the body curvature," increasing "breakdown voltage for a certain range of the layout width." However, by increasing the width, either the Pbase region or the Pwell gets larger, resulting in the lateral spread problem outlined above.

ISPSD 2019 "The Lowest On-Resistance and Robust 130 nm BCDMOS Technology implementation utilizing HFP and DPN for mobile PMIC applications" to Kim et al. ("Kim") discloses placing a deeper p-type implant during the gate structure formation, such that the implant is self-aligned to the edge of the gate polysilicon. This approach highlights other lithographic related problems. The channel region is still negatively impacted by the deep p-well as observed in the threshold voltage and on-resistance. Kim discloses the negative impact is a function of both the photoresist slope and the width of the photoresist opening.

The solutions outlined in the previous paragraphs, to issues presented by the use of a self-aligned body, generally involve creating a deep body in order to increase the distance between the source and drift regions. In doing this, the risk of punch through is reduced and the body/base resistance is increased, thereby improving the electrical SOA. U.S. Pat. No. 10,892,362 to Toner et al. ("Toner") (which is incorporated herein by reference) takes a different approach to creating an LDMOS device "improving the E-SOA . . . " and with "low junction leakage using a simple cost-effective manufacturing process." More particularly, Toner discloses a "hybrid contact" on a MOSFET. In this regard, FIG. 8 is an enlarged cross-sectional view of an exemplary hybrid contact 10. The hybrid contact 10 includes a hybrid contact implant 117, placed in a p-type body 144, and silicide metal 122 adjacent the hybrid contact implant 117, and an ohmic contact 123 at the gate. A hybrid contact implant 117 having first and second portions is aligned to the gate structure 116 prior to the placement of a gate sidewall spacer structure 115 (which then covers the first portion), and the second portion extends beyond the spacer structure into the source region. After silicidation, a source hybrid contact 10 has been created, whereby a vertical Schottky junction 130 is formed between the silicide and underlying p-type body and a lateral ohmic junction 132 is formed between the silicide and the hybrid contact implant 117. Advantageously, Toner discloses the use of a hybrid contact for improved E-SOA, while at the same time using a simple manufacturing process. However, Toner does not consider use of a hybrid contact in a self-aligned LDMOS, and fails to recognize any synergies that might result from such a combination.

Currently, many low on-resistance (Rsp) architectures utilize the self-aligned body approach to reduce the channel length and overall device pitch. However, such self-aligned body devices have intrinsic weaknesses that include a propensity for punch through, higher leakage, and a limited safe operating area (SOA). These devices also create lithographic limitations and lithographic sensitivity which complicate the manufacturing process. Accordingly, a need exists to mitigate the punch through and high electric field, of these shallow body architectures while simultaneously improving ESD robustness (broader SOA) and reducing overall device pitch using a simple cost-effective manufacturing process.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of power transistor structures, the present invention is not limited to use only in power transistor structures, as will become apparent from the following summaries and detailed descriptions of aspects, features, and one or more embodiments of the present invention.

Broadly defined, the present invention according to another aspect relates to a method of fabricating a power transistor structure, including steps of: implanting a dopant of a first dopant polarity into a drift region on a source side of a gate structure to form a body region, the body region being self-aligned to, and extending under, the gate structure; and producing a hybrid contact that defines first, second, and third electrical junctions, wherein the first electrical junction is a Schottky junction formed vertically between a silicide and a substrate, wherein the second electrical junction is an ohmic junction formed laterally between the silicide and a first portion of the hybrid contact implant, and wherein the third electrical junction is a rectifying PN junction between the first portion of the hybrid contact implant and a channel region.

Broadly defined, the present invention according to another aspect relates to a power transistor structure, including: a body region, of a first dopant polarity, on a source side of a gate structure, the body region being self-aligned to, and extending under, the gate structure; and a hybrid contact that defines first, second, and third electrical junctions, wherein the first electrical junction is a Schottky junction formed vertically between a silicide and a substrate, wherein the second electrical junction is an ohmic junction formed laterally between the silicide and a first portion of the hybrid contact implant, and wherein the third electrical junction is a rectifying PN junction between the first portion of the hybrid contact implant and a channel region.

Broadly defined, the present invention according to another aspect relates to a method of fabricating a power transistor structure that includes the steps of: providing a substrate of a first dopant polarity; forming a drift region, of a second dopant polarity, on or within the substrate; forming a gate structure by oxide growth, polysilicon deposition, and polysilicon etch at least over a portion of the drift region, wherein the gate structure has a source side and a drain side; implanting a dopant of the first dopant polarity into the drift region on the source side of the gate structure to form a body region, the body region being self-aligned to, and extending under, the gate structure; implanting a dopant of the second dopant polarity into the self-aligned body region, the implanted dopant defining a hybrid contact implant that has a first depth; forming a gate sidewall spacer structure such that a first portion of the hybrid contact implant is disposed beneath the gate sidewall spacer structure and a second portion of the hybrid contact implant is exposed adjacent to the gate sidewall spacer structure; diffusing a dopant of the first dopant polarity into the body region to form a body tap; applying a photoresist coating to the body region, including the body tap, but leaving the gate structure and drift region entirely or nearly entirely exposed; diffusing a dopant of the second dopant polarity into the gate structure and into the drift region to form a drain region; depositing a blanket layer of metal; annealing the metal of the blanket layer to react with exposed silicon/polysilicon on the body tap, the drain region, the gate structure and the second portion of the hybrid contact implant to form a silicide, wherein the silicide formed on the second portion of the hybrid contact implant has a second depth, and wherein the second depth is greater than the first depth; and removing unreacted portions of the blanket layer of metal, thereby resulting in metal contacts to the body tap, the drain region, the gate structure, and the hybrid contact implant; whereby the silicide, the first portion of the hybrid contact implant, and the second portion of the hybrid contact implant together form a hybrid contact, which constitutes a source region, and wherein a channel region is established between the source region and the drift region; and whereby the resulting hybrid contact defines first, second, and third electrical junctions, wherein the first electrical junction is a Schottky junction formed vertically between the silicide and the substrate, wherein the second electrical junction is an ohmic junction formed laterally between the silicide and the first portion of the hybrid contact implant, and wherein the third electrical junction is a rectifying PN junction between the first portion of the hybrid contact implant and the channel region.

In a feature of this aspect, the step of implanting a dopant to form a body region includes implanting the dopant via tilted implantation.

In another feature of this aspect, the step of forming a drift region on or within the substrate includes forming the drift region across the entirety of the power transistor structure, and the step of implanting a dopant via tilted implantation to form a body region includes implanting the dopant via tilted implantation into the drift region on the source side of the gate structure to form the body region. In further features, the method further includes a step of forming a trench structure isolating the gate structure from the drain region, and the step of forming the gate structure includes forming the gate structure over both a portion of the drift region and a portion of the trench structure; the method further includes a step of implanting a deep buried body, of the first dopant polarity, under and continuous with the self-aligned body region; the method further includes a step of designing the deep buried body and the hybrid contact to suppress triggering of a parasitic bipolar, thereby enhancing at least one of (i) ESD robustness and (ii) safe operating area; the self-aligned body region is a shallow self-aligned body region, and the method further includes a step of implanting a retrograde body well, of the first dopant polarity, beneath and noncontiguous with the self-aligned body region; the method further includes a step of depositing a stepped layer of silicon dioxide over at least a portion of the drift region, and the step of forming the gate structure includes forming the gate structure over both a portion of the drift region and a portion of the stepped layer of silicon dioxide; the self-aligned body region is a shallow self-aligned body region, and the method further includes a step of implanting a retrograde body well, of the first dopant polarity, beneath and noncontiguous with the self-aligned body region; the method further includes a step of forming a silicide block, adjacent the drift region, that extends at least partially over the gate structure and defines an isolation region; the self-aligned body region is a shallow self-aligned body region, and the method further includes a step of implanting a retrograde body well, of the first dopant polarity, beneath and noncontiguous with the self-aligned body region; the isolation region defined by the silicide block is adapted to modify the electric field between the drain side of the gate structure and the drift region; the hybrid contact implant is a first hybrid contact implant, and the method further includes, via tilted implantation, implanting a body implant, of the first dopant polarity, on the drain side of the gate structure, the body implant being self-aligned to, and extending under, the gate structure, and implanting a dopant of the second dopant polarity into the body implant, the implanted dopant defining a second hybrid contact implant; the method further includes a step of forming a silicide block, adjacent the drift region, that extends over the body implant, and at least partially over the gate structure, and defines an isolation region; the self-aligned body region is a shallow self-aligned body region, and the method further includes a step of implanting a retrograde body well, of the first dopant polarity, beneath and noncontiguous with the self-aligned body region; and/or the step of implanting the first hybrid contact implant and the step of implanting the second hybrid contact implant are carried out as part of the same manufacturing step.

In another feature of this aspect, the step of forming a drift region on or within the substrate includes forming the drift region only partially across the power transistor structure, and wherein the step of implanting a dopant via tilted implantation to form a body region includes implanting the dopant via tilted implantation into the substrate on the source side of the gate structure to form the body region.

In further features, the method further includes a step of forming a trench structure isolating the gate structure from the drain region, and the step of forming the gate structure includes forming the gate structure over both a portion of the drift region and a portion of the trench structure; the method further includes a step of depositing a stepped layer of silicon dioxide over at least a portion of the drift region, and the step of forming the gate structure includes forming the gate structure over both a portion of the drift region and a portion of the stepped layer of silicon dioxide; the hybrid contact implant is a first hybrid contact implant, and the method further includes, via tilted implantation, implanting a body implant, of the first dopant polarity, on the drain side of the gate structure, the body implant being self-aligned to, and extending under, the gate structure, and implanting a dopant of the second dopant polarity into the body implant, the implanted dopant defining a second hybrid contact implant; the method further includes a step of forming a silicide block, adjacent the drift region, that extends over the body implant, and at least partially over the gate structure, and defines an isolation region; the method further includes a step of forming a silicide block, adjacent the drift region, that extends at least partially over the gate structure and defines an isolation region; and/or the self-aligned body region is a shallow self-aligned body region, and the method further includes a step of implanting a retrograde body well, of the first dopant polarity, beneath and noncontiguous with the self-aligned body region.

In another feature of this aspect, the step of implanting a dopant of the first polarity is carried out before or after the step of implanting a dopant of the second polarity but is carried out using the same mask.

Broadly defined, the present invention according to another aspect relates to a power transistor structure, including: a substrate, of a first dopant polarity; a drift region, of a second dopant polarity; a gate structure extending over a portion of the drift region, the gate structure having a source side and a drain side, wherein the gate structure includes a polysilicon on a gate oxide; a drain region on or within the drift region; a shallow body region, of a first dopant polarity, on the source side of the gate structure, the body region having a depth that is less than a thickness of the polysilicon, and the shallow body region being self-aligned to, and extending under, the gate structure; a source region on or within the shallow self-aligned body region; a hybrid contact implant, of the second dopant polarity, in the source region, the hybrid contact implant being aligned to the gate structure; a channel region, beneath the gate structure, whose length is defined by the distance the shallow self-aligned body region extends laterally beneath the gate structure; a respective metal contact on or within each of the source region, the gate structure, and the drain region; wherein the hybrid contact implant and the metal contact that is on or within the source region combine to form a hybrid contact that defines first, second, and third electrical junctions, wherein the first electrical junction is a Schottky junction formed vertically between the source metal contact and the shallow self-aligned body region, wherein the second electrical junction is an ohmic junction formed laterally between the source metal contact and the hybrid contact implant, and wherein the third electrical junction is a rectifying PN junction between the hybrid contact implant and the channel region; wherein the source side hybrid contact mitigates punch through of the shallow self-aligned body region, thereby enabling higher operating voltage and reduced channel length; and wherein the source side hybrid contact suppresses triggering of a parasitic bipolar, thereby enhancing at least one of (i) electrostatic discharge (ESD) robustness and (ii) safe operating area.

In a feature of this aspect, the drift region extends across the entirety of the power transistor structure. In further features, the power transistor structure further includes a shallow trench isolating the gate structure from the drain region; the power transistor structure further includes a retrograde body well, of the first dopant polarity, disposed beneath, and noncontiguous with, the shallow self-aligned body region, wherein the retrograde body well improves the electric field profile of the shallow self-aligned body region; the hybrid contact implant is a first hybrid contact implant, the power transistor structure further includes a body implant, of the first dopant polarity, on the drain side of the gate structure, the body implant being self-aligned to the shallow trench isolation, and the power transistor structure further includes a second hybrid contact implant, of the second dopant polarity, in the body implant and self-aligned to the shallow trench isolation; the power transistor structure further includes a silicide block, adjacent the drain region, that extends at least partially over the gate structure, wherein the silicide block defines an isolation region between the gate structure and the drain region; the power transistor structure further includes a retrograde body well, of the first dopant polarity, disposed beneath, and noncontiguous with, the shallow self-aligned body region, and the retrograde body well improves the electric field profile of the shallow self-aligned body region; the power transistor structure further includes a body implant, of the first dopant polarity, on the drain side of the gate structure, the body implant being self-aligned to, and extending under, the gate structure, and a second hybrid contact implant, of the second dopant polarity, in the body implant and aligned to the gate structure, and the silicide block entirely covers the body implant and the second hybrid contact implant; the power transistor structure further includes a stepped layer of silicon dioxide disposed over at least a portion of the drift region, and wherein the gate structure partially extends over the stepped layer of silicon dioxide; the power transistor structure further comprises a retrograde body well, of the first dopant polarity, disposed beneath, and noncontiguous with, the shallow self-aligned body region, and wherein the retrograde body well improves the electric field profile of the shallow self-aligned body region; and/or a deep buried body, of the first dopant polarity, is implanted under, and continuous with, the shallow self-aligned body region such that the source side hybrid contact combines with the deep buried body to suppress triggering of a parasitic bipolar, thereby enhancing at least one of (i) ESD robustness and (ii) safe operating area.

In another feature of this aspect, the drift region extends only partially across the power transistor structure. In further features, the power transistor structure further includes a shallow trench isolating the gate structure from the drain region; the power transistor structure further includes a stepped layer of silicon dioxide disposed over at least a portion of the drift region, and the gate structure partially extends over the stepped layer of silicon dioxide; the power transistor structure further includes a silicide block, adjacent the drain region, that extends at least partially over the gate structure, and the silicide block defines an isolation region that modifies the electric field between the drain side of the gate structure and the drift region; the power transistor structure further includes a retrograde body well, of the first dopant polarity, disposed beneath, and noncontiguous with, the shallow self-aligned body region, and the retrograde body well improves the electric field profile of the shallow self-aligned body region; and/or the power transistor structure further includes a body implant, of the first dopant polarity, on the drain side of the gate structure, the body implant being self-aligned to, and extending under, the gate structure, and a second hybrid contact implant, of the second dopant polarity, in the body implant and aligned to the gate structure, wherein the silicide block entirely covers the body implant and the second hybrid contact implant.

In another feature of this aspect, the shallow self-aligned body region extends laterally beneath the gate structure a distance of less than 0.2 micron.

In another feature of this aspect, the hybrid contact implant has an as-implanted depth that defines a first depth, the metal contact of the hybrid contact has a second depth, and the first depth is less than that of the second depth.

In another feature of this aspect, the power transistor structure further includes a line of non-continuous, intermittent, body taps that are diffused into the shallow self-aligned body region.

In another feature of this aspect, the power transistor structure further includes a retrograde body well, of the first dopant polarity, disposed beneath, and noncontiguous with, the shallow self-aligned body region and extending under the gate structure, and the retrograde body well improves the electric field profile of the shallow self-aligned body region.

Broadly defined, the present invention according to another aspect relates to a power transistor structure of at least two fingers (gates), including: a substrate, of a first dopant polarity; a drift region, of a second dopant polarity; first and second gate structures, each extending over a respective portion of the drift region, each gate structure having a source side and a drain side, wherein each gate structure includes a polysilicon on a gate oxide; a pair of drain regions on or within the drift region; a shallow body region, of a first dopant polarity, on the source side of the respective gate structures, the body region having a depth that is less than a thickness of the polysilicon, and the shallow body region being self-aligned to, and extending under, the gate structure; a source region on or within the shallow self-aligned body region; a body tap, of the first dopant polarity, diffused into the shallow self-aligned body region and abutting the source region; a retrograde body well, of the first dopant polarity, disposed beneath, and noncontiguous with, the shallow self-aligned body region, and wherein the retrograde body well improves the electric field profile of the shallow self-aligned body region; a pair of channel regions, each beneath a respective gate structure, each of whose length is defined by the distance the shallow self-aligned body region extends laterally beneath the respective gate structure; a respective metal contact on or within each of the source region, the gate structures, and the drain regions; and a source/body contact adapted to connect the metal contact on or within the source region to a first metal interconnect layer, the source/body contact having a length; wherein the retrograde body well manipulates high electric fields at least one corner of the shallow self-aligned body region, thereby enhancing leakage current and breakdown voltage without impacting the respective channel region.

In a feature of this aspect, the shallow self-aligned body region is separated from the retrograde body well by a narrow portion of the drift region. In further features, the retrograde body well extends under the gate structures; the body tap is a continuous body tap, the body tap has a length, the body tap length is greater than the source/body contact length, a first poly-to-body tap length is defined as a length from an inner edge of the first gate structure to a first edge of the body tap, a second poly-to-body tap length is defined as a length from an inner edge of the second gate structure to a second edge of the body tap, a poly-to-poly length is defined as a length from an inner edge of the first gate structure to an inner edge of the second gate structure, and a minimum poly-to-poly length is established as a sum of the first poly-to-body tap length, the body tap length, and the second poly-to-body tap length; and/or the body tap includes a line of non-continuous, intermittent, body taps, a first poly-to-contact length is defined as a length from an inner edge of the first gate structure to a first edge of the source/body contact, a second poly-to-contact length is defined as a length from an inner edge of the second gate structure to a second edge of the source/body contact, a poly-to-poly length is defined as a length from an inner edge of the first gate structure to an inner edge of the second gate structure, and a minimum poly-to-poly length is established as a sum of the first poly-to-contact length, the source/body contact length, and the second poly-to-contact length.

In a feature of this aspect, the power transistor structure further includes a hybrid contact implant, of the second dopant polarity, in the source region, the hybrid contact implant being aligned to the gate structures, and the hybrid contact implant and the metal contact that is on or within the source region combine to form a hybrid contact that defines first, second, and third electrical junctions, wherein the first electrical junction is a Schottky junction formed vertically between the source metal contact and the shallow self-aligned body region, wherein the second electrical junction is an ohmic junction formed laterally between the source metal contact and the hybrid contact implant, and wherein the third electrical junction is a rectifying PN junction between the hybrid contact implant and the channel region. In further features, the drift region extends across the entirety of the power transistor structure; the power transistor structure further includes a pair of shallow trenches, each isolating a respective gate structure from a corresponding drain region; the power transistor structure further includes a silicide block, adjacent the drain region, that extends at least partially over the first gate structure, wherein the silicide block defines an isolation region that modifies the electric field between the drain side of the first gate structure and the drift region; the power transistor structure further includes a body implant, of the first dopant polarity, on the drain side of the first gate structure, the body implant being self-aligned to, and extending under, the first gate structure, and the power transistor structure further includes a second hybrid contact implant, of the second dopant polarity, in the body implant and aligned to the first gate structure, wherein the silicide block entirely covers the body implant and the second hybrid contact implant; the power transistor structure further includes a stepped layer of silicon dioxide disposed over at least a portion of the drift region, and the first gate structure partially extends over the stepped layer of silicon dioxide; the drift region extends only partially across the power transistor structure; the power transistor structure further includes a shallow trench isolating the first gate structure from the drain region; the power transistor structure further includes a stepped layer of silicon dioxide disposed over at least a portion of the drift region, and the first gate structure partially extends over the stepped layer of silicon dioxide; the power transistor structure further includes a silicide block, adjacent the drain region, that extends at least partially over the first gate structure, wherein the silicide block defines an isolation region that modifies the electric field between the drain side of the first gate structure and the drift region; the power transistor structure further includes a body implant, of the first dopant polarity, on the drain side of the first gate structure, the body implant being self-aligned to, and extending under, the first gate structure, and the power transistor structure further includes a second hybrid contact implant, of the second dopant polarity, in the body implant and aligned to the first gate structure, wherein the silicide block entirely covers the body implant and the second hybrid contact implant; the shallow self-aligned body region extends laterally beneath each gate structure a distance of less than 0.2 micron; the hybrid contact implant has an as-implanted depth that defines a first depth, wherein the metal contact of the hybrid contact has a second depth, and wherein the first depth is less than that of the second depth; the shallow self-aligned body region is separated from the retrograde body well by a narrow portion of the drift region; the hybrid contact is one of a plurality of hybrid contacts, and the body tap includes a plurality of non-continuous, intermittent, body taps that are in line and interspersed with the hybrid contacts.

Further areas of applicability of the present invention will become apparent from the detailed description provided hereinafter. It should be understood that the detailed description and specific examples, while indicating preferred embodiment(s) of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein:

FIG. 1 is a cross-sectional view of an exemplary prior art LDMOS device illustrating various constituent resistances;

FIG. 9 is a block diagram illustrating detailed steps of a general Self-Aligned body and hybrid source (SAHS) LDMOS device fabrication process in accordance with one or more preferred methods of the invention;

DETAILED DESCRIPTION OF THE PREFERRED EMBODIMENTS

Figure 2A:
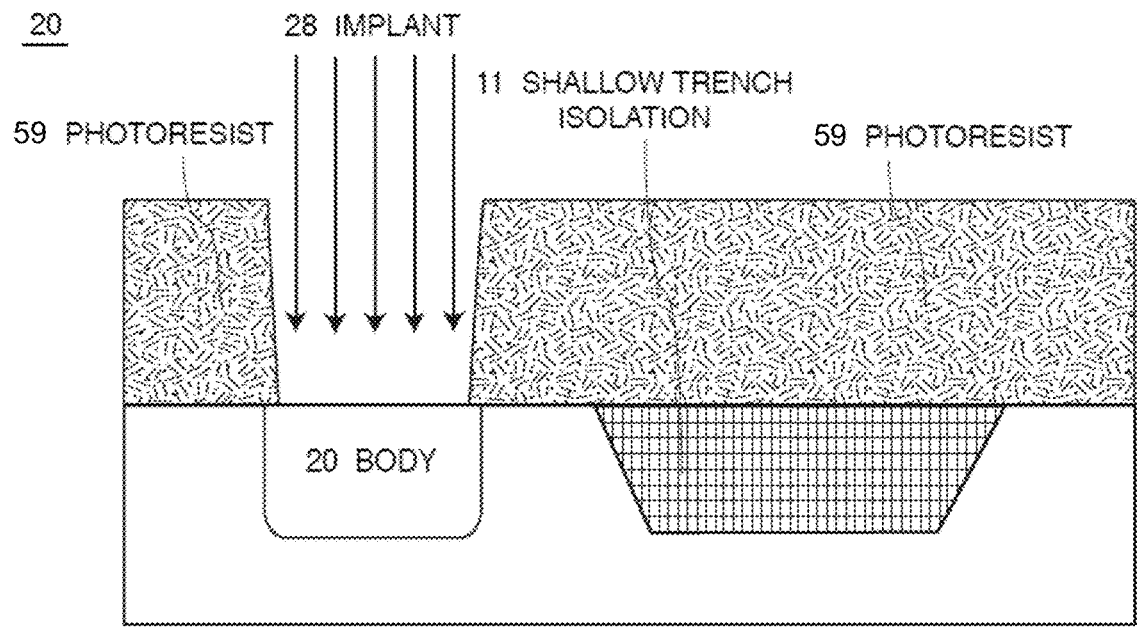
FIG. 2A illustrates a conventional prior art LDMOS body implantation.
Figure 2B:
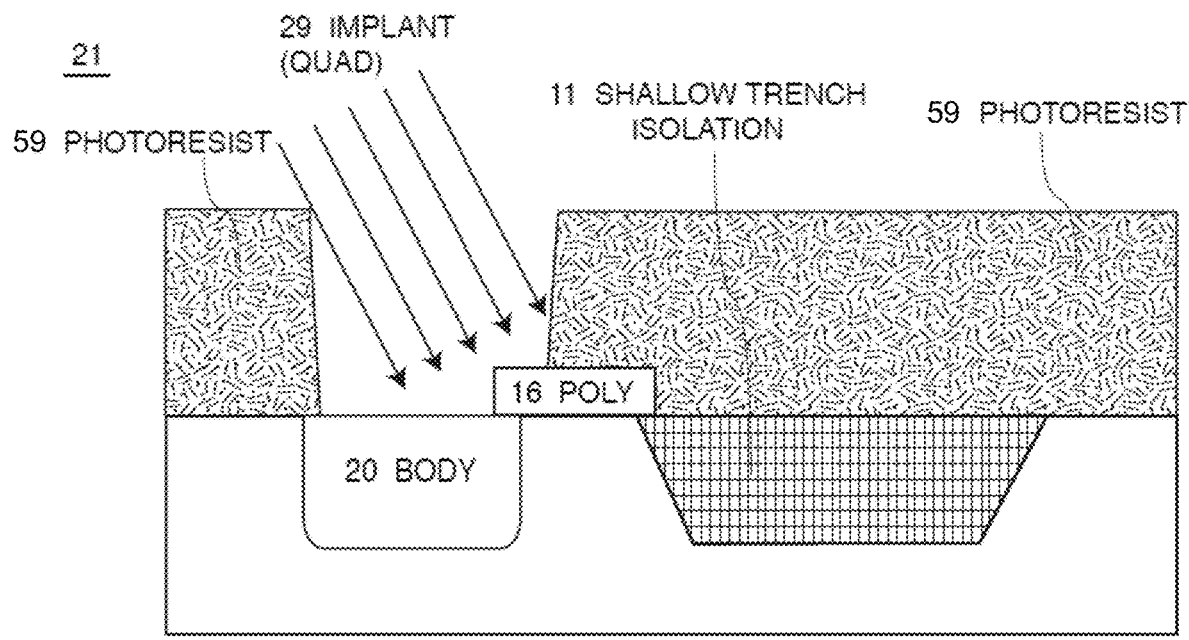
FIG. 2B illustrates a self-aligned prior art LDMOS body implantation.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 9 is a block diagram illustrating detailed steps of a general Self-Aligned body and hybrid Source (SAHS) LDMOS device fabrication process 10000 in accordance with one or more preferred methods of the invention. The general process 10000 of FIG. 9 includes nine (9) fabrication steps, where steps 1, 2, 3, 4, 5, and 8 have more than one option or in some embodiments, may be omitted. The general process 10000 (including the various options) is described in more detail in a subsequent section, but is first introduced here in summary form. In Step 1, a p-type substrate is patterned and shallow trench isolation (STI) formed through etch, oxide deposition and Chemical Mechanical Polishing (CMP) processes to form a gate-to-drain isolation region. In some embodiments, an alternative isolation process occurs later in the process. In Step 2, an n-type well acting as a drift region is created. The n-type well may be created using ion-implantation in combination with a lithographic mask pattern, either across the entirety of the device (a global well) or partially across the device. In Step 3, a p-type ESD deep well, or p-type retrograde well, may optionally be created. A retrograde well may be referred to as a retrograde body well, or simply a retrograde body. However, a deep well in Step 3 is not required for all embodiments as will be detailed below. In Step 4, a gate structure is formed through gate oxide growth, polysilicon deposition and etch. In some embodiments, an adjacent and/or overlay to oxide is also formed. The polysilicon gate forms a mask for Step 5, which is the ion implantation of a self-aligned tilted p-type body and a self-aligned vertical n-type hybrid contact implant on the source of the polysilicon gate, wherein these two operations may use the same mask but are order independent. In some embodiments, the self-aligned p-type implant and self-aligned vertical n-type hybrid contact are also simultaneously implanted on the drain side of the polysilicon gate to form a drain-side region that influences the electric field distribution. Step 6 is gate sidewall spacer structure formation adjacent at least the source side of the gate structure. In some embodiments, the sidewall spacer may also be formed on the drain side of the polysilicon gate. Step 7 includes two operations which are order independent, lithographically patterned diffusion of the p+ body tap, and lithographically patterned diffusion of n+ drain and polysilicon gate. (Notably, although certain steps described and illustrated herein may be referred to as "diffusing" or "diffusion," it will be appreciated by those of ordinary skill in the art that, in many cases, ion implantation may replace the older process of diffusion in semiconductor fabrication in various technologies, and that unless otherwise indicated, or apparent from the circumstances, it should be assumed that any activity or step that references diffusion or the process of diffusion in this application may alternatively be accomplished by a process of ion implantation.) Step 8 is the formation of silicide block oxide partially on the gate and extending into the drain region to form a gate-to-drain isolation region, but as illustrated in FIG. 9, Step 8 is not required for all embodiments as will be detailed below. Finally, silicidation occurs in Step 9.

A variety of SAHS LDMOS devices may be formed using the general fabrication process 10000 of FIG. 9. Many such devices are described and illustrated herein. For example, FIGS. 10-16 are cross-sectional views of various SAHS LDMOS devices in accordance with one or more preferred embodiments of the invention. Notably, the devices of FIGS. 10-16 are "single-finger" devices, wherein only a cross-section of a single gate is shown. In practice, the single-finger (gate) may be mirrored to create a pair of fingers (gates) by sharing the source region, and devices with still larger numbers of fingers (gates) may be created by further mirroring by sharing the source and drain regions. In view of this, subsequent illustrations show examples of various two-finger LDMOS devices, including SAHS LDMOS devices. Each of these devices is formed through variations of the general fabrication process 10000 of FIG. 9.

As noted previously, SAHS LDMOS devices in accordance with some preferred embodiments of the present invention utilize shallow trench isolation (STI). In this regard, FIGS. 10-13 are cross-sectional views of exemplary SAHS LDMOS devices 80,90,100,110, each having the gate-to-drain isolation which may be formed by etching a trench into the silicon and subsequently depositing silicon dioxide, resulting in shallow trench isolation (STI) 11. The STI is formed as part of Step 1 in the general fabrication process 10000.

Figure 10:
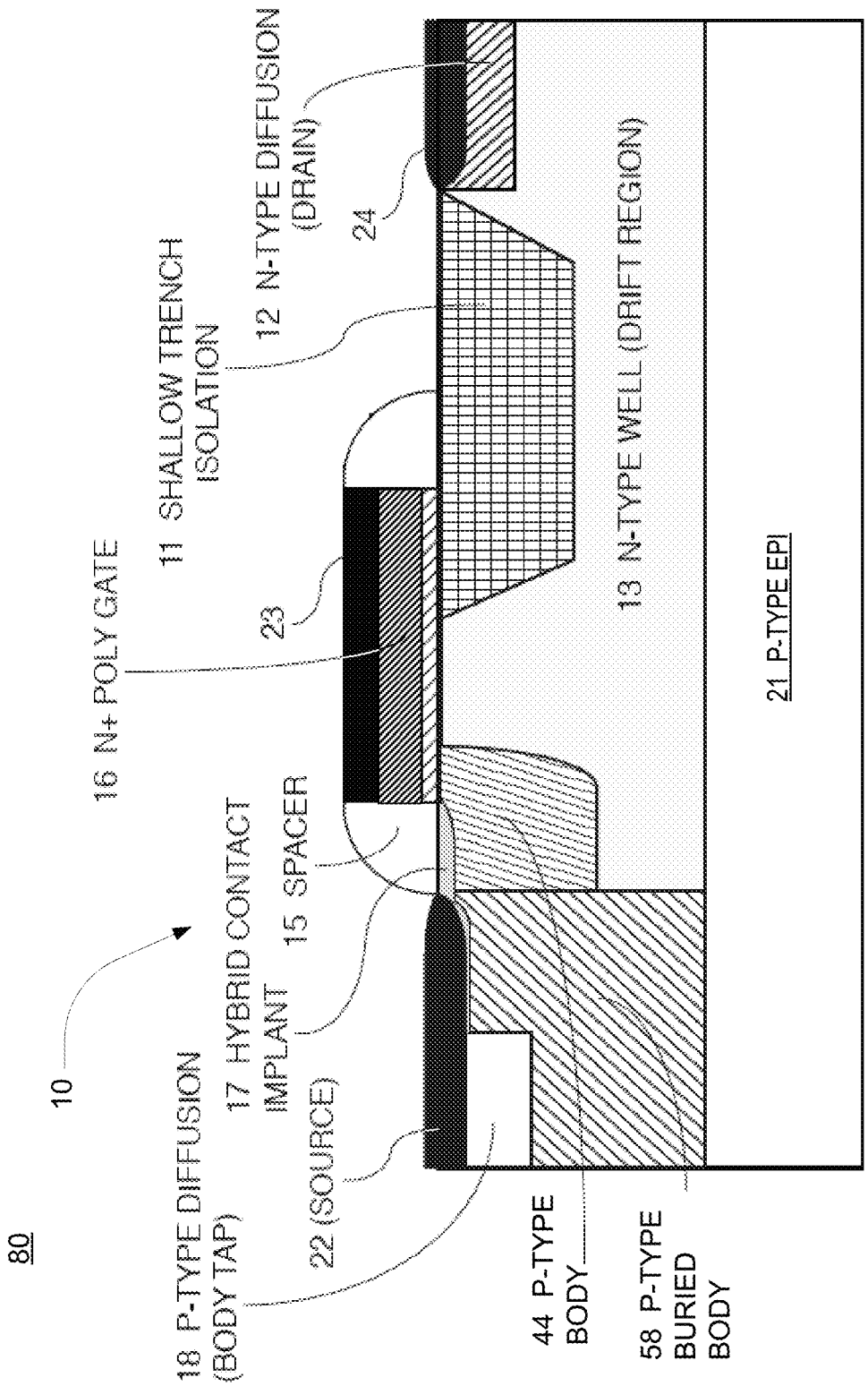
FIG. 10 is a cross-sectional view of an exemplary single-finger SAHS LDMOS device with shallow trench isolation (STI) in accordance with one or more preferred embodiments of the present invention.

FIG. 10 is a cross-sectional view of an exemplary single-finger SAHS LDMOS device 80 with shallow trench isolation (STI) in accordance with one or more preferred embodiments of the present invention. The LDMOS device 80 of FIG. 10 includes a self-aligned p-type body 44, a Schottky source through the use of a hybrid contact 10 (hybrid source), a global n-type well 13 (extends the entirety of the device) and a p-type buried body 58. In addition, the LDMOS device 80 of FIG. 10 includes standard LDMOS features such as a p-type substrate 21, a body tap 18, shallow trench isolation 11, a gate structure 16 (polysilicon on gate oxide) and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22.

Figure 11:
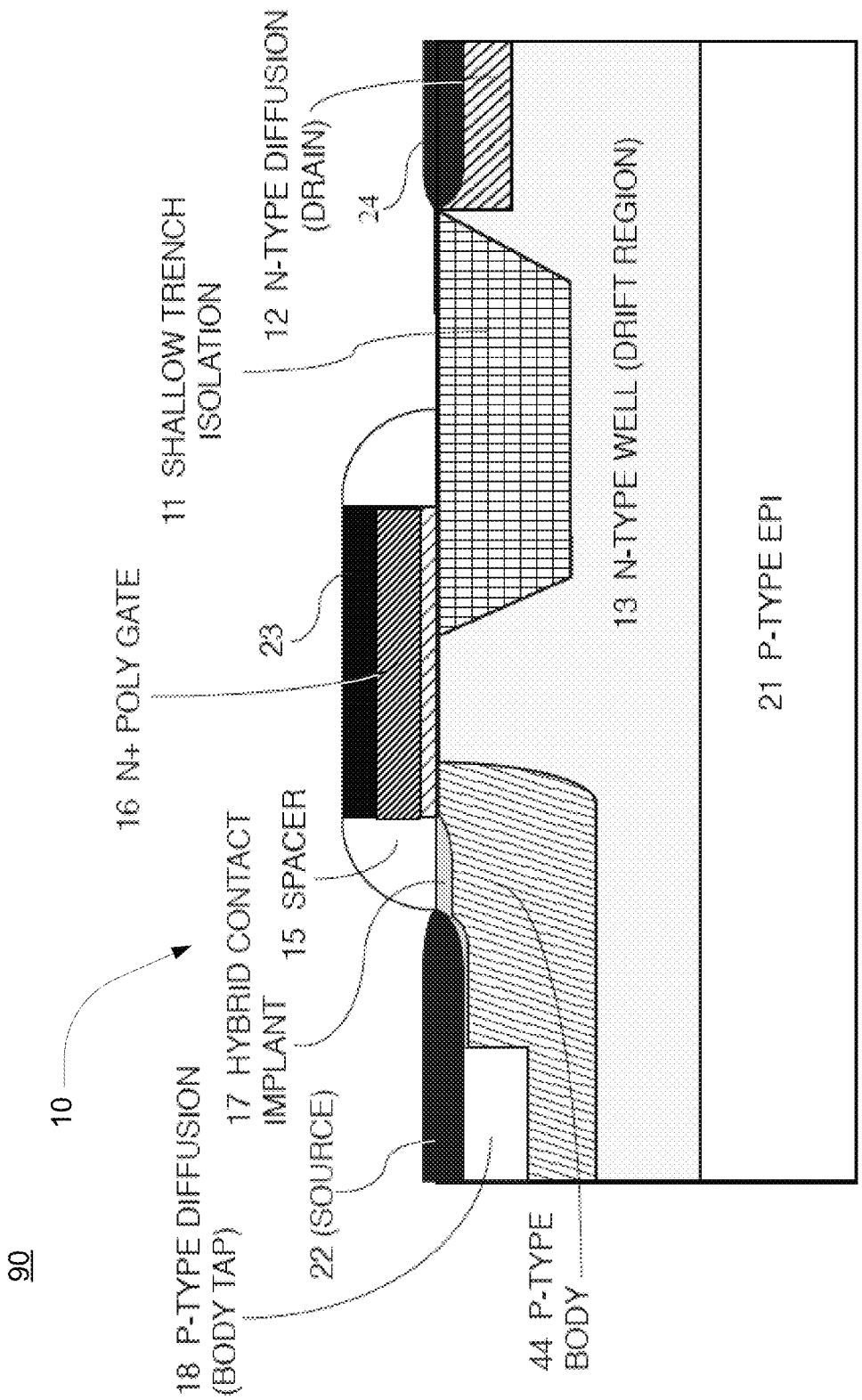
FIG. 11 is a cross-sectional view of another exemplary single-finger SAHS LDMOS device with shallow trench isolation (STI) in accordance with one or more preferred embodiments of the present invention.

FIG. 11 is a cross-sectional view of another exemplary single-finger SAHS LDMOS device 90 with shallow trench isolation (STI) in accordance with one or more preferred embodiments of the present invention. The LDMOS device 90 of FIG. 11 includes the specific features of a self-aligned p-type body 44, a Schottky source through the use of a hybrid contact 10 (hybrid source), and a global n-type well 13 (extends the entirety of the device). Different from FIG. 10, the LDMOS device 90 does not include a p-type buried body 58. The LDMOS device 90 of FIG. 11 also includes standard LDMOS features such as a p-type substrate 21, a body tap 18, shallow trench isolation 11, a gate structure 16 (polysilicon on gate oxide) and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22. Notably, the STI 11 in the device 90 of FIG. 11 extends from under the n+ poly gate 16 to the drain n-type diffusion 12. It will be appreciated, however, that in various alternative embodiments (not illustrated), STI may only partially extend to the drain n-type diffusion, thereby creating an active (non-STI) ndrift region from the edge of the STI to the drain n-type diffusion 12.

Figure 12:
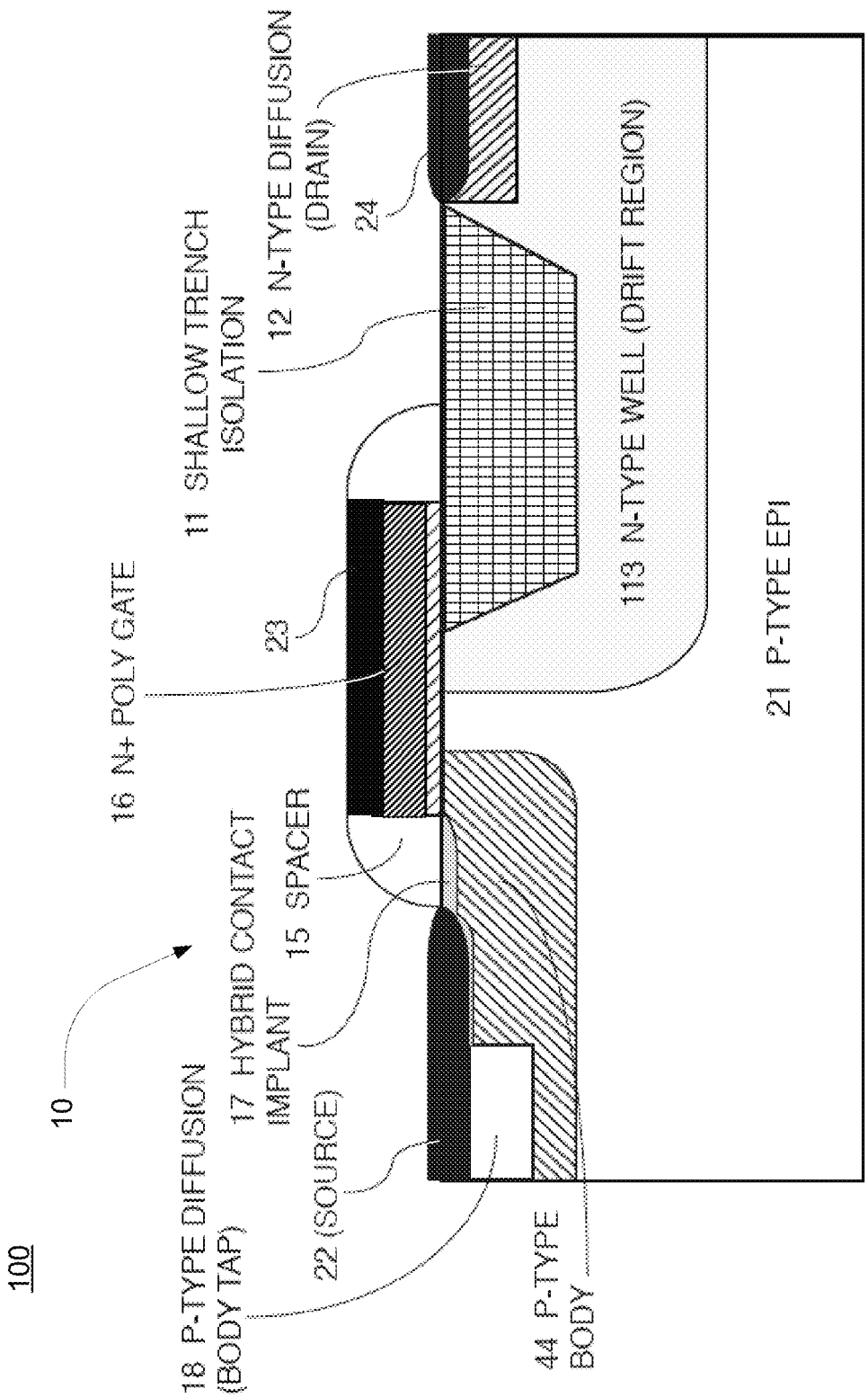
FIG. 12 is a cross-sectional view of another exemplary single-finger SAHS LDMOS device with shallow trench isolation (STI) in accordance with one or more preferred embodiments of the present invention.

FIG. 12 is a cross-sectional view of another exemplary single-finger SAHS LDMOS device 100 with shallow trench isolation (STI) in accordance with one or more preferred embodiments of the present invention. The LDMOS device 100 of FIG. 12 is similar to the device 90 in FIG. 11 in that it includes the specific features of a self-aligned p-type body 44, Schottky source through the use of a hybrid contact 10 (hybrid source); however, it includes a partial n-type well 113 (extends partially under the gate structure 16). The LDMOS device 100 of FIG. 12 also includes standard LDMOS features such as a p-type substrate 21, a body tap 18, shallow trench isolation 11, a gate structure 16 (polysilicon on gate oxide) and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22.

Figure 13:
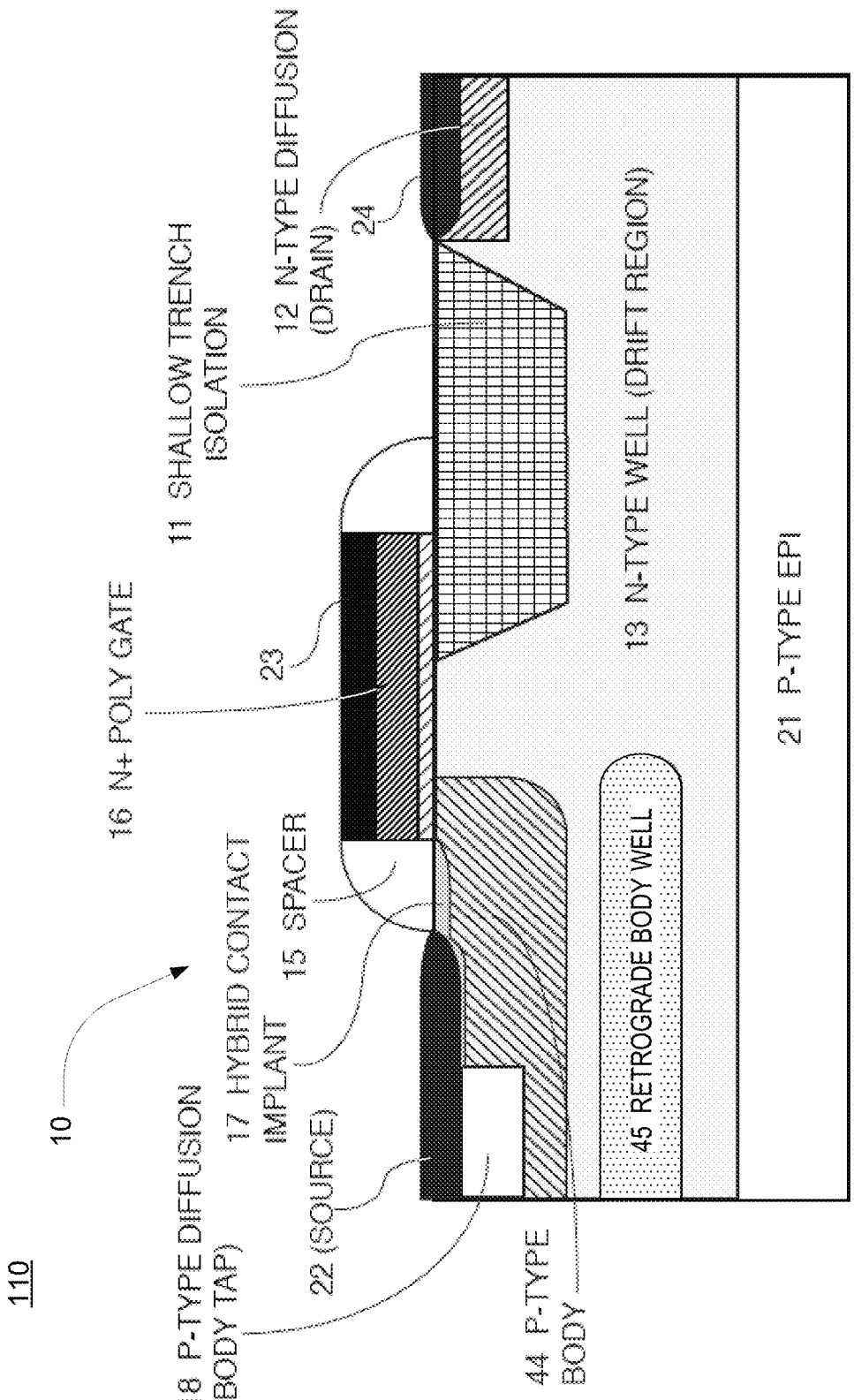
FIG. 13 is a cross-sectional view of another exemplary single-finger SAHS LDMOS device with shallow trench isolation (STI) in accordance with one or more preferred embodiments of the present invention.

FIG. 13 is a cross-sectional view of another exemplary single-finger SAHS LDMOS device 110 with shallow trench isolation (STI) in accordance with one or more preferred embodiments of the present invention. The LDMOS device 110 of FIG. 13 is similar to the device 90 in FIG. 11 in that it includes the specific features of a self-aligned body 44, Schottky source through the use of a hybrid contact 10 (hybrid source), and a global n-type well 13 (extends the entirety of the device). The LDMOS device 110 of FIG. 13 also features a retrograde body well 45 that is below, and noncontiguous with, the body region. LDMOS device 110 of FIG. 13 also includes standard LDMOS features such as a p-type substrate 21, a p-type body 44, a body tap 18, shallow trench isolation 11, a gate structure 16 (polysilicon on gate oxide) and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22.

Figure 25:
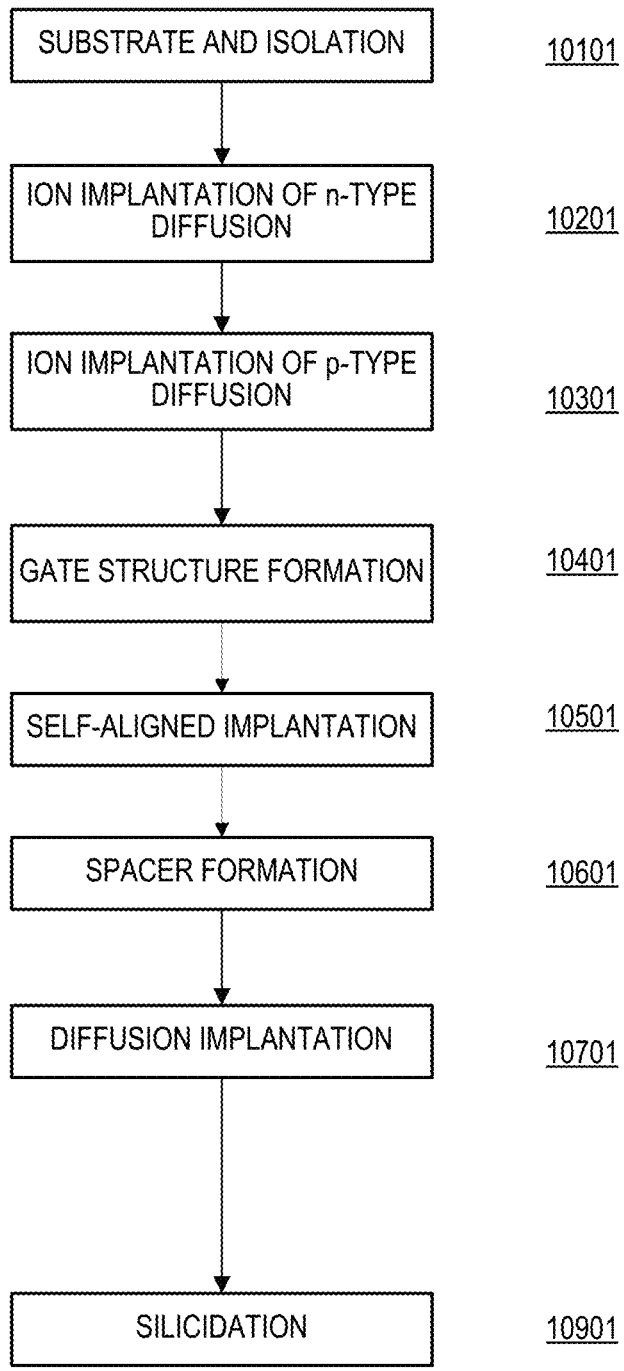
FIG. 25 illustrates a fabrication process for a SAHS LDMOS device of FIG. 10.
Figure 26:
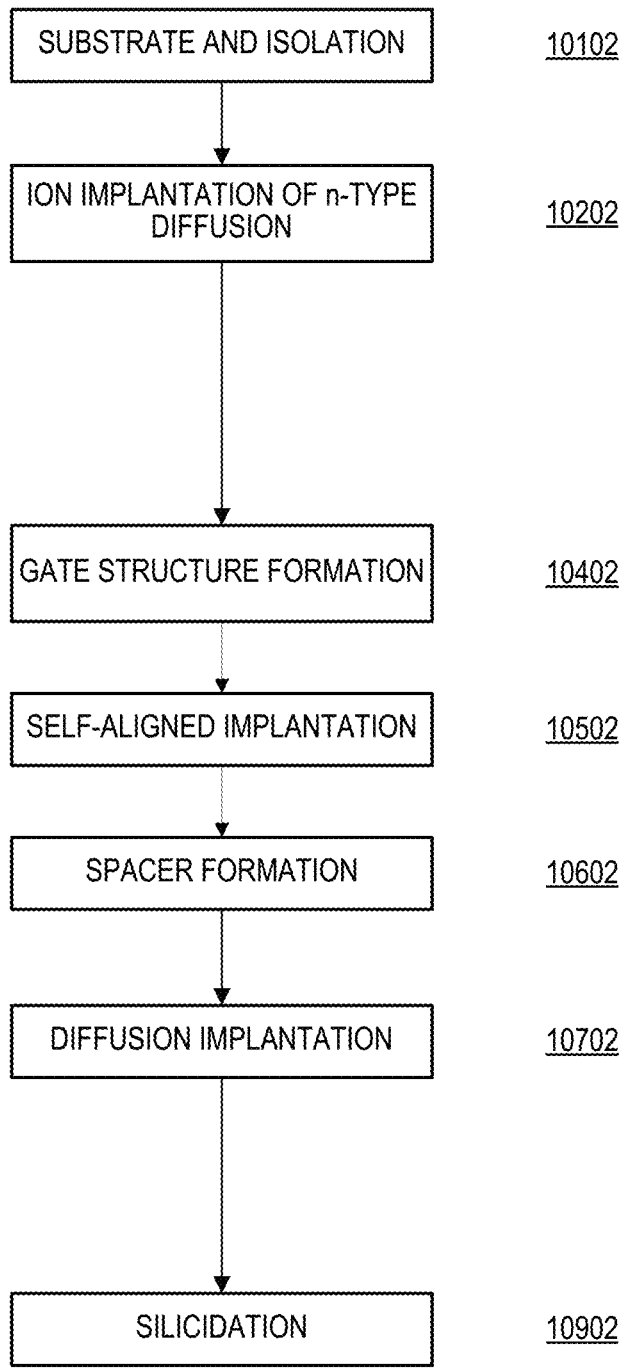
FIG. 26 illustrates a fabrication process for a SAHS LDMOS device of FIG. 11, except with no buried body.

FIG. 25 is a flowchart illustrating a fabrication process 10001 for the SAHS LDMOS device 80 of FIG. 10, in accordance with one or more preferred embodiments of the present invention, and is an example of a specific implementation of the general Self-Aligned body and hybrid source (SAHS) LDMOS device fabrication process 10000 defined in FIG. 9. The fabrication process 10001 of FIG. 25 includes the lithographic placement of n-type diffusion across the entire device thus creating a global n-type well region, an STI, and a deep p-type diffusion which serves as a buried body. Similar to FIG. 25, FIG. 26 illustrates a fabrication process 10002 for a SAHS LDMOS device 90 of FIG. 11, except with no buried body. In the first fabrication process step, substrate and isolation 10102, a p-type substrate is patterned and shallow trench isolation (STI) formed through etch, oxide deposition and Chemical Mechanical Polishing (CMP) processes to form a gate-to-drain isolation region. In the next process step, ion implantation of diffusion 10202, n-type diffusion implanted across the entirety of the substrate, creates a global n-type well region. Next, gate structure formation 10402 is done through gate oxide growth, polysilicon deposition and etch. This polysilicon gate structure forms a mask for self-aligned implantation 10502, of the subsequent ion implantation of self-aligned tilted p-type body and self-aligned vertical n-type hybrid contact implants on the source side of the gate structure. The next step is spacer formation 10602 adjacent the source side of the gate. Then diffusion implantation occurs 10702 where n-type diffusion is implanted into both the polysilicon gate and the n-type well or drift region created in step 10202, and p-type diffusion is implanted into the body region created in step 10502. Finally, silicidation 10902 of the blanket layer of metal is performed to form ohmic contacts to the body tap, gate structure, and drain region. It is also the final step in creating a source hybrid contact, whereby a vertical Schottky junction is formed between the silicide and underlying self-aligned p-type body and a lateral ohmic junction is formed between the silicide and hybrid contact implant.

Figure 27:
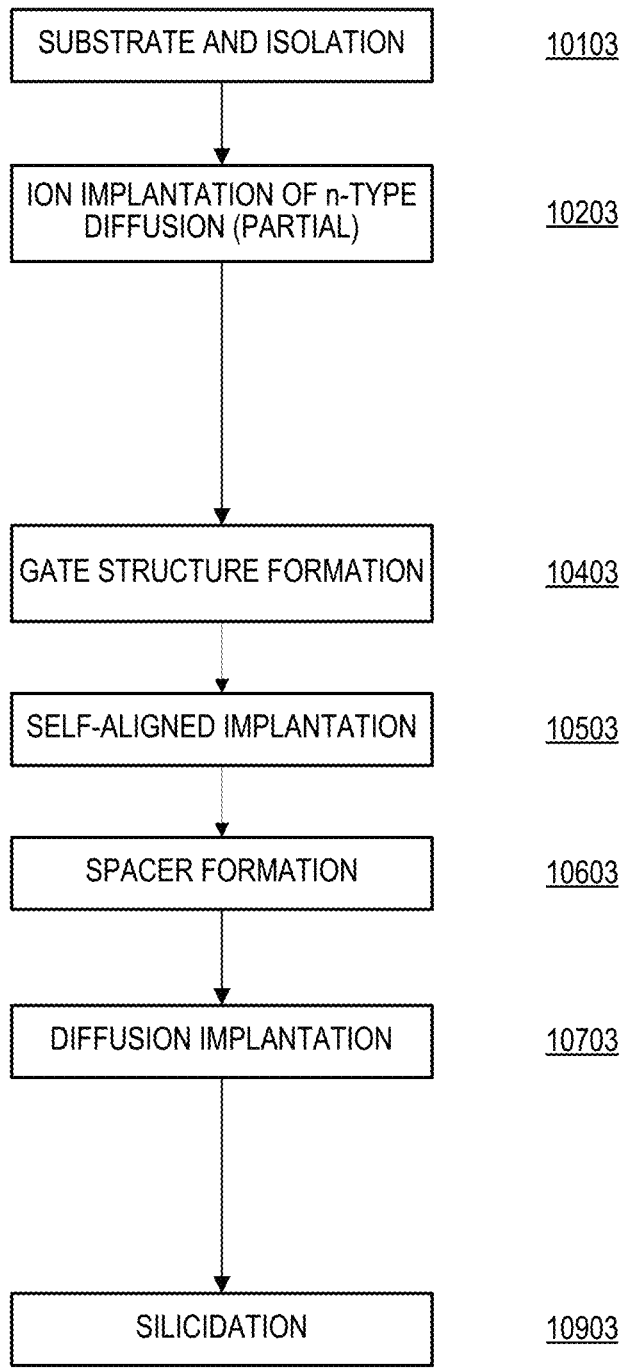
FIG. 27 illustrates a fabrication process for a SAHS LDMOS device of FIG. 12.

FIG. 27 illustrates a fabrication process 10003 for a SAHS LDMOS device 100 of FIG. 12 in accordance with one or more preferred embodiments of the present invention. The fabrication process 10003 of FIG. 27 is generally similar to the process 10002 of FIG. 26, except the photoresist opening restricts the n-type diffusion implant 10203 from covering the entirety of the device, thus creating a partial n-type well region.

Figure 28:
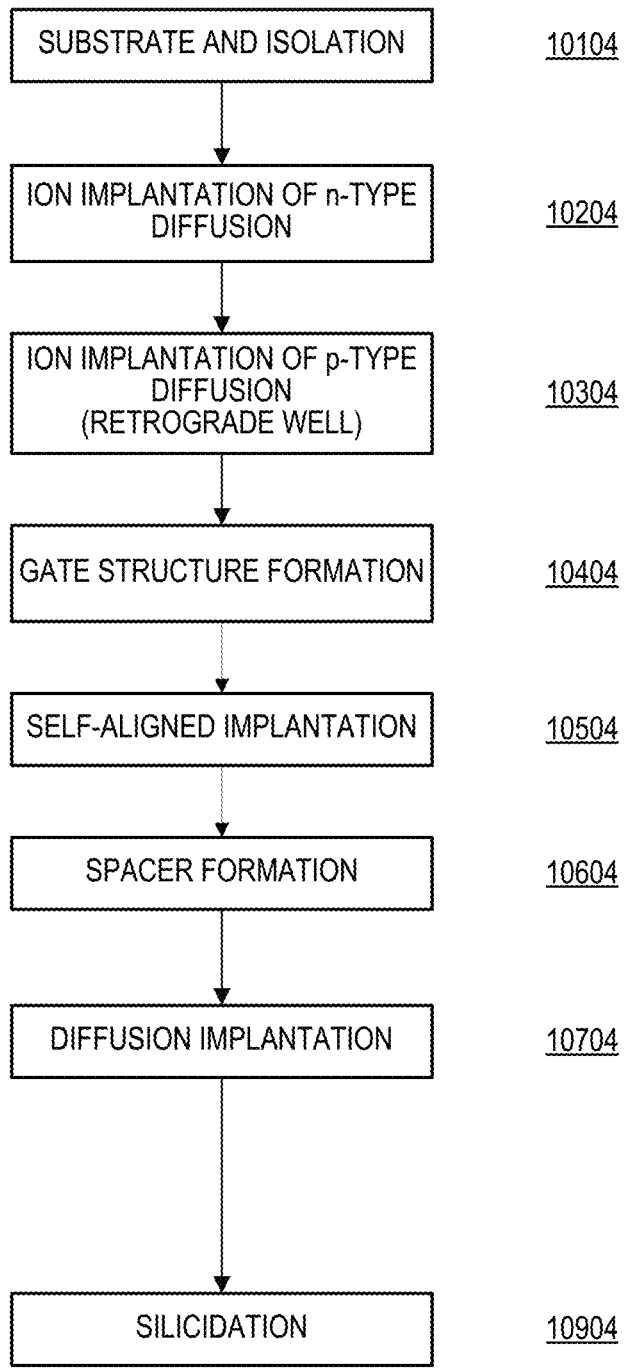
FIG. 28 illustrates a fabrication process for a SAHS LDMOS device of FIG. 13.

FIG. 28 illustrates a fabrication process 10004 for a SAHS LDMOS device 110 of FIG. 13 in accordance with one or more preferred embodiments of the present invention. The fabrication process 10040 of FIG. 28 is generally similar to the fabrication process 10001 in FIG. 25, except that lithographic patterning is used with a deep p-type diffusion to create a retrograde well instead of a buried body. In the first fabrication process step 10104, labeled "substrate and isolation," a p-type substrate is patterned and shallow trench isolation (STI) formed through etch, oxide deposition and Chemical Mechanical Polishing (CMP) processes to form a gate-to-drain isolation region. In the next process step 10204, "ion implantation of n-type diffusion," n-type diffusion implanted across the entirety of the substrate, creates a global n-type well region. Next, at step 10304, the ion implantation of p-type diffusion with lithographically patterned retrograde well region results in a deep p-type well. Next, at step 10404, gate structure formation is done through gate oxide growth, polysilicon deposition and etch. This polysilicon gate structure forms a mask for self-aligned implantation, shown at step 10504, of the subsequent ion implantation of self-aligned tilted p-type body and self-aligned vertical n-type hybrid contact implants on the source side of the gate structure. The next step 10604 is spacer formation adjacent the source side of the gate. Then diffusion implantation occurs at step 10704 where n-type diffusion is implanted into both the polysilicon gate and the n-type well or drift region created in step 10204, and p-type diffusion is implanted into the body region created in step 10504. Finally, at step 10904, silicidation of the blanket layer of metal is performed to form ohmic contacts to the body tap, gate structure, and drain region. It is also the final step in creating a source hybrid contact, whereby a vertical Schottky junction is formed between the silicide and underlying self-aligned p-type body and a lateral ohmic junction is formed between the silicide and hybrid contact implant.

Figure 38A:
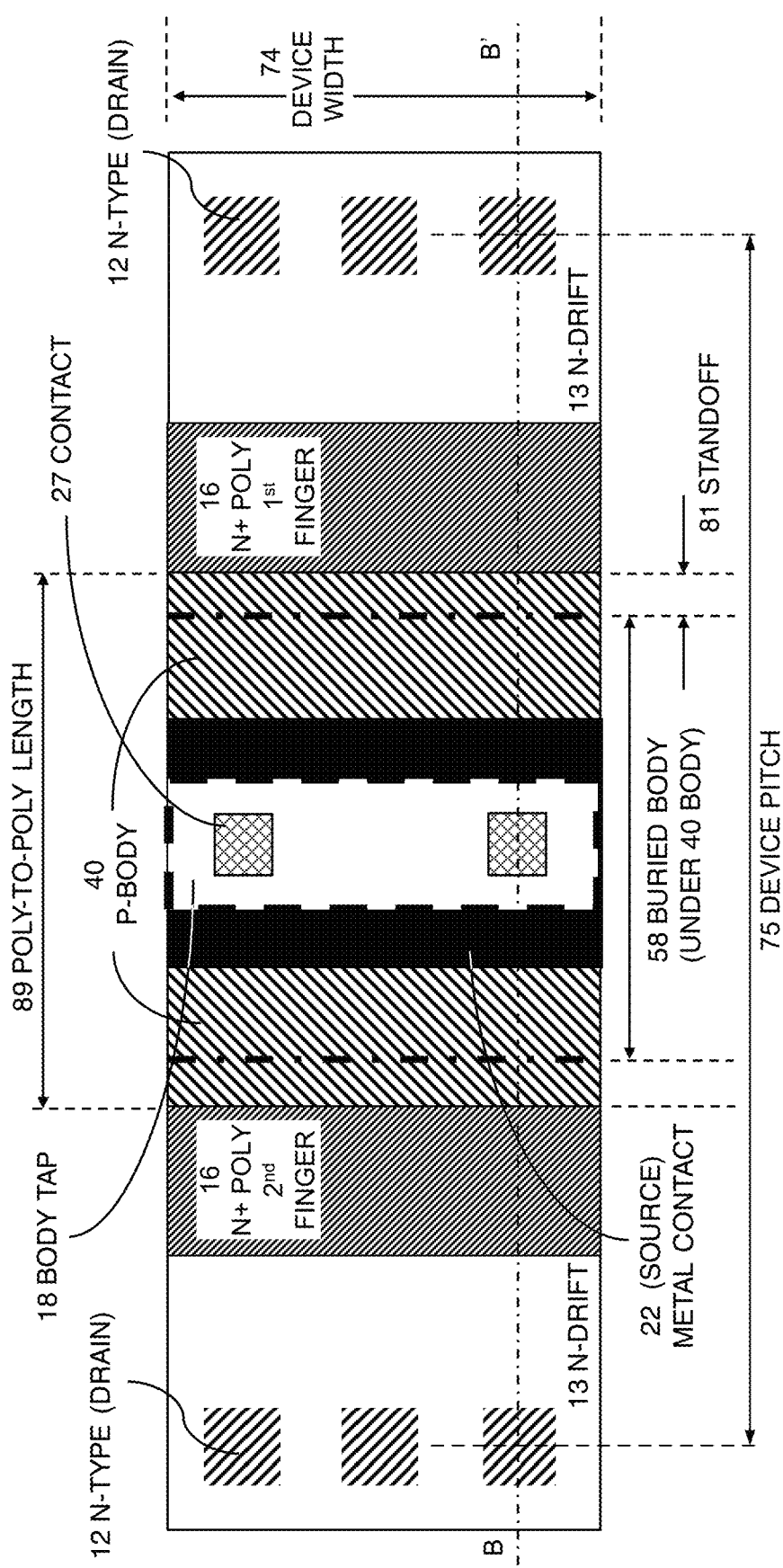
FIG. 38A is a layout view of an exemplary two-finger self-aligned body LDMOS device with deep p-type buried body, utilizing a body tap in continuous contact with the source in accordance with one or more preferred embodiments of the present invention.
Figure 38B:
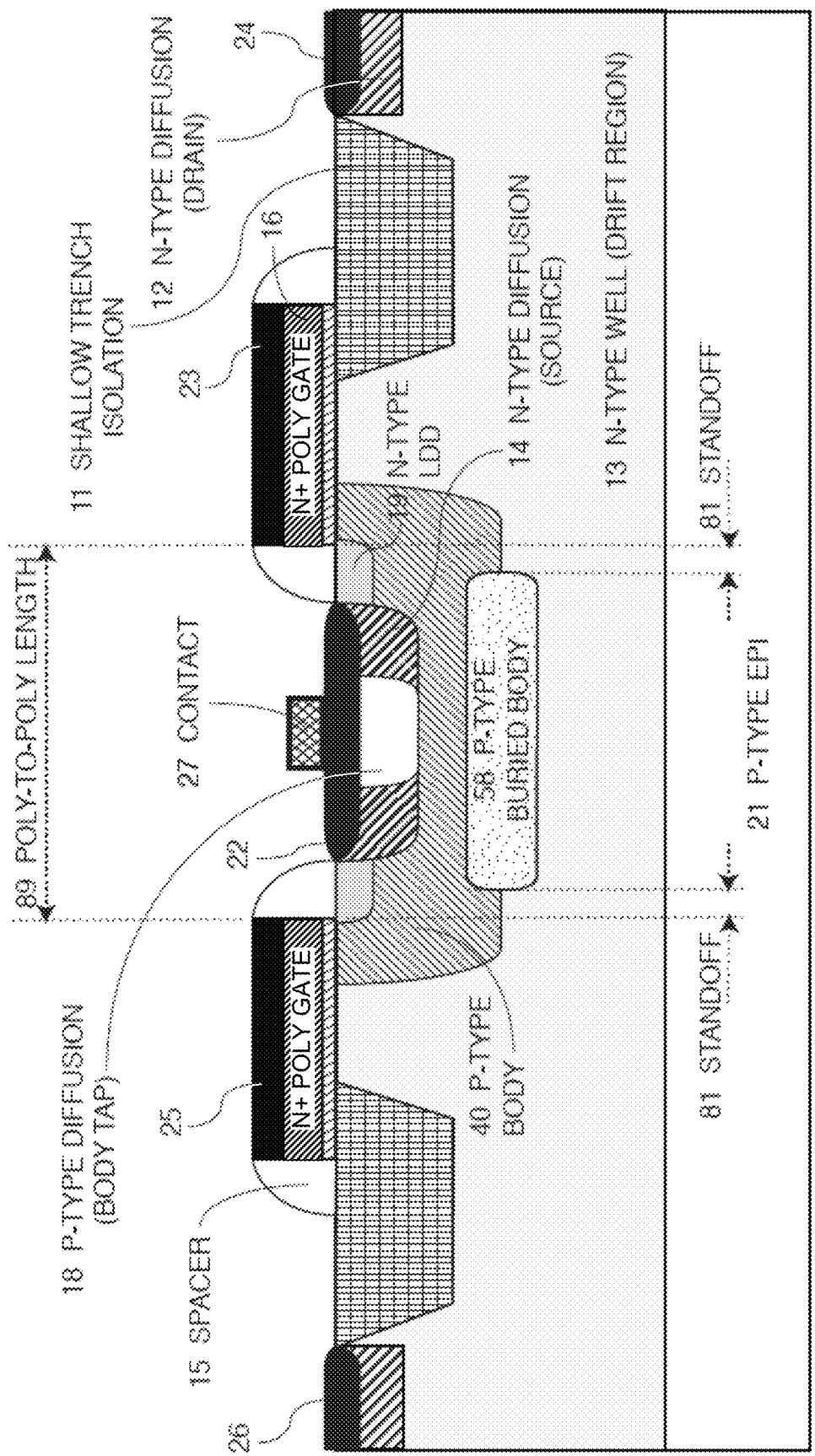
FIG. 38B is a cross-sectional view of the device of FIG. 38A, taken along line B-B'.
Figure 39A:
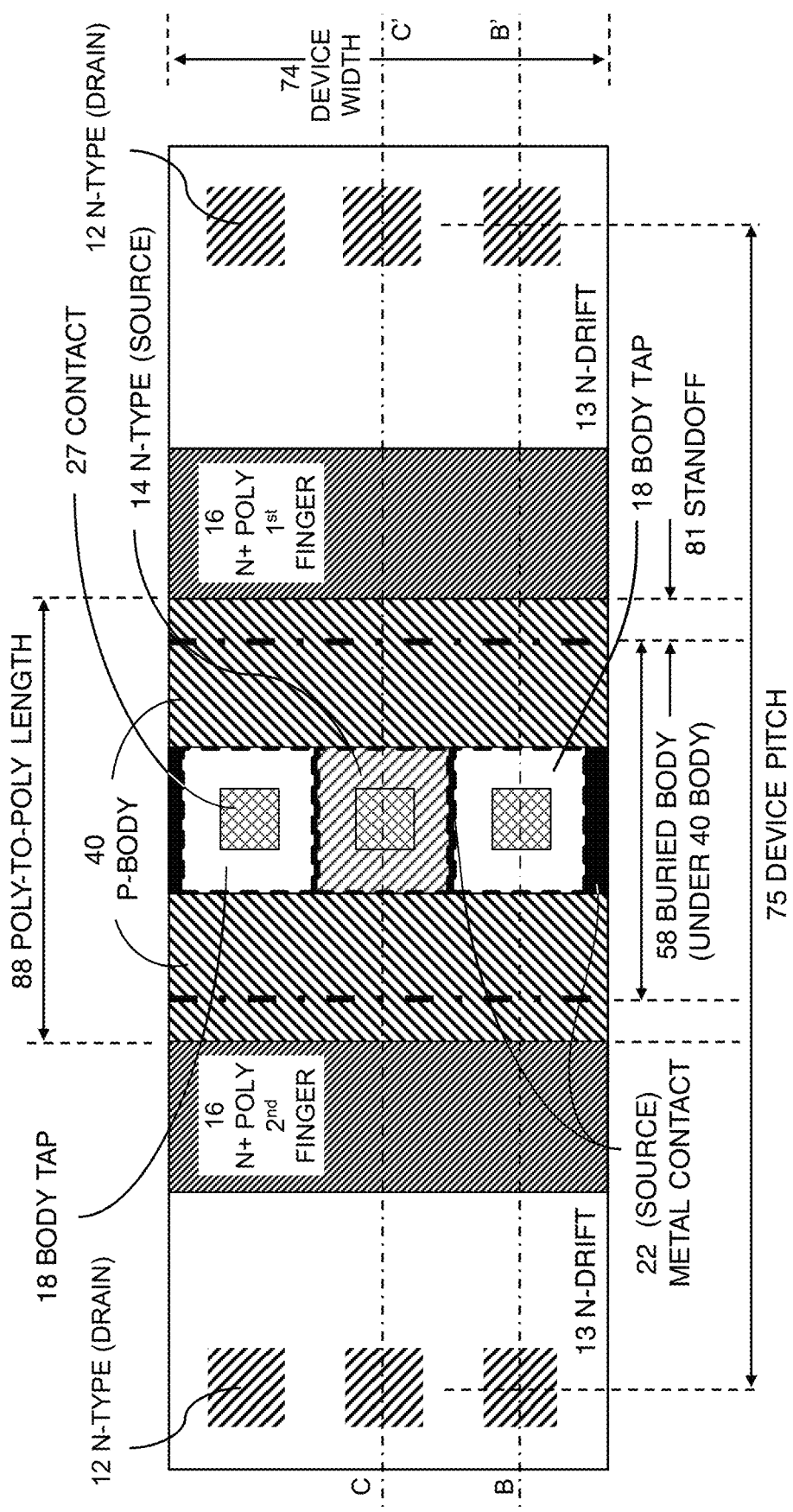
FIG. 39A is a layout view of an exemplary two-finger self-aligned body LDMOS device with deep p-type buried body, utilizing a body tap in non-continuous contact with the source in accordance with one or more preferred embodiments of the present invention.
Figure 40A:
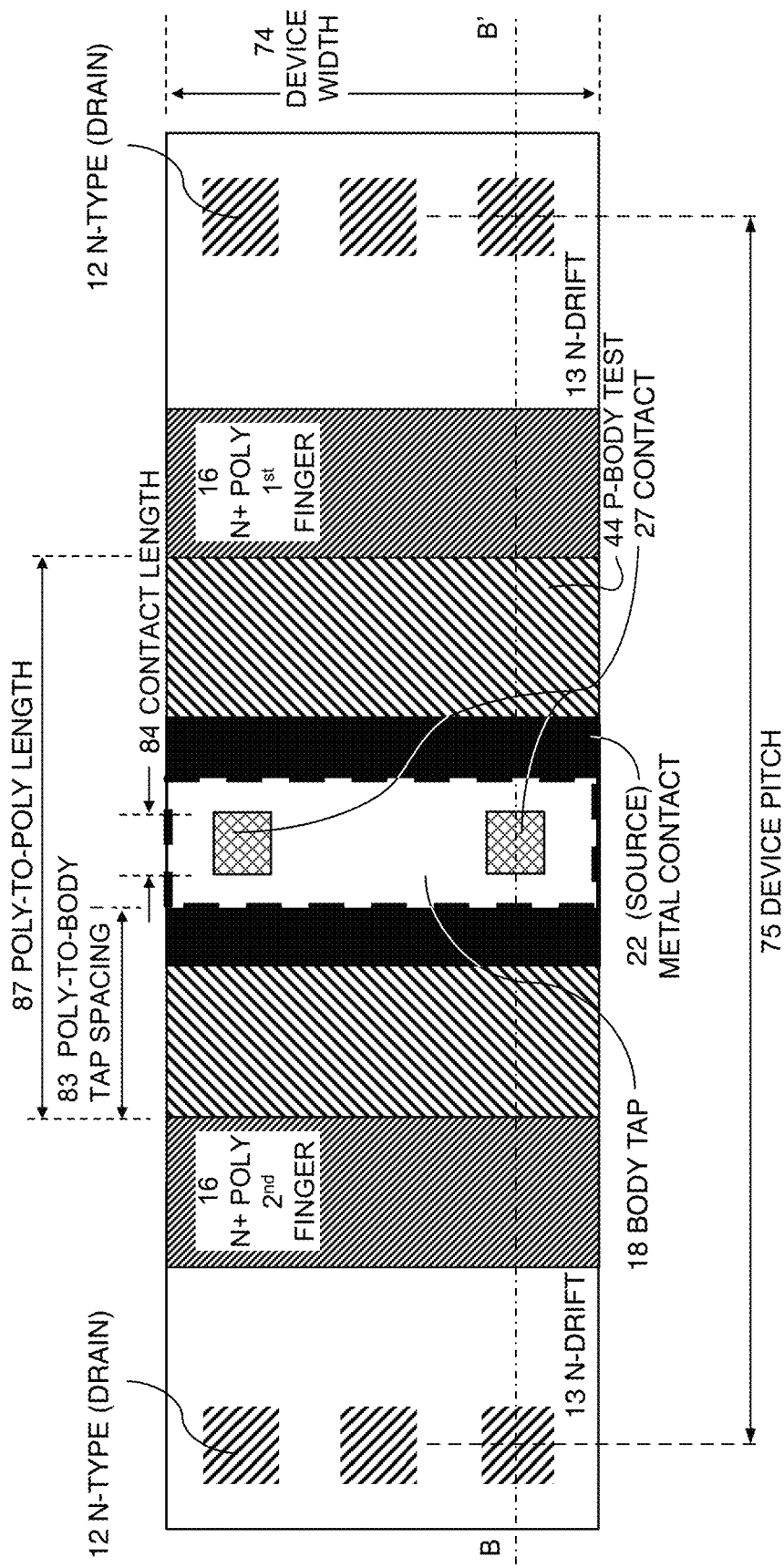
FIG. 40A is a layout view of an exemplary two-finger SAHS LDMOS device with retrograde body well, utilizing a body tap in continuous contact with the source in accordance with one or more preferred embodiments of the present invention.
Figure 40B:
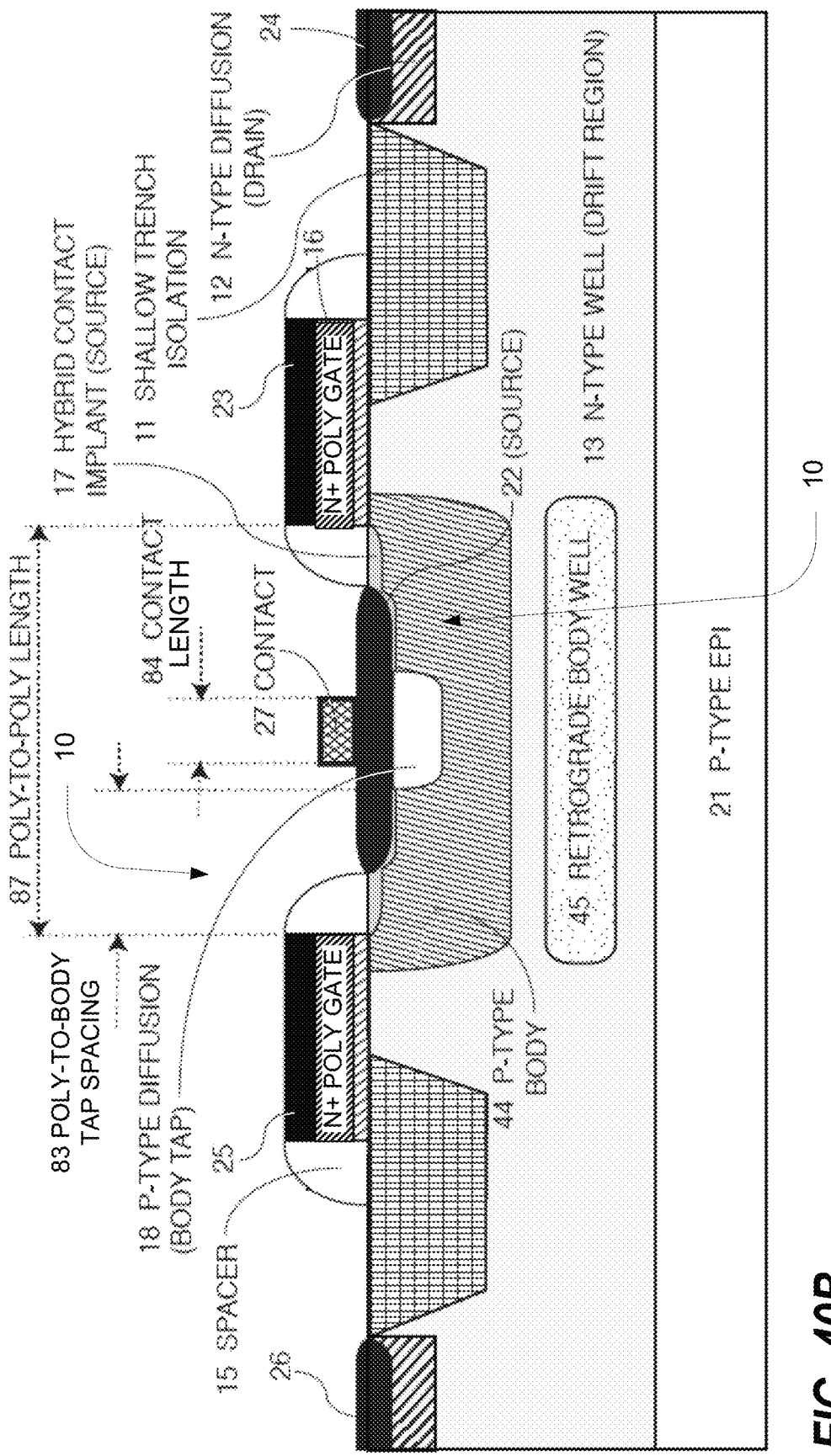
FIG. 40B is a cross-sectional view of the device of FIG. 40A, taken along line B-B'.
Figure 41A:
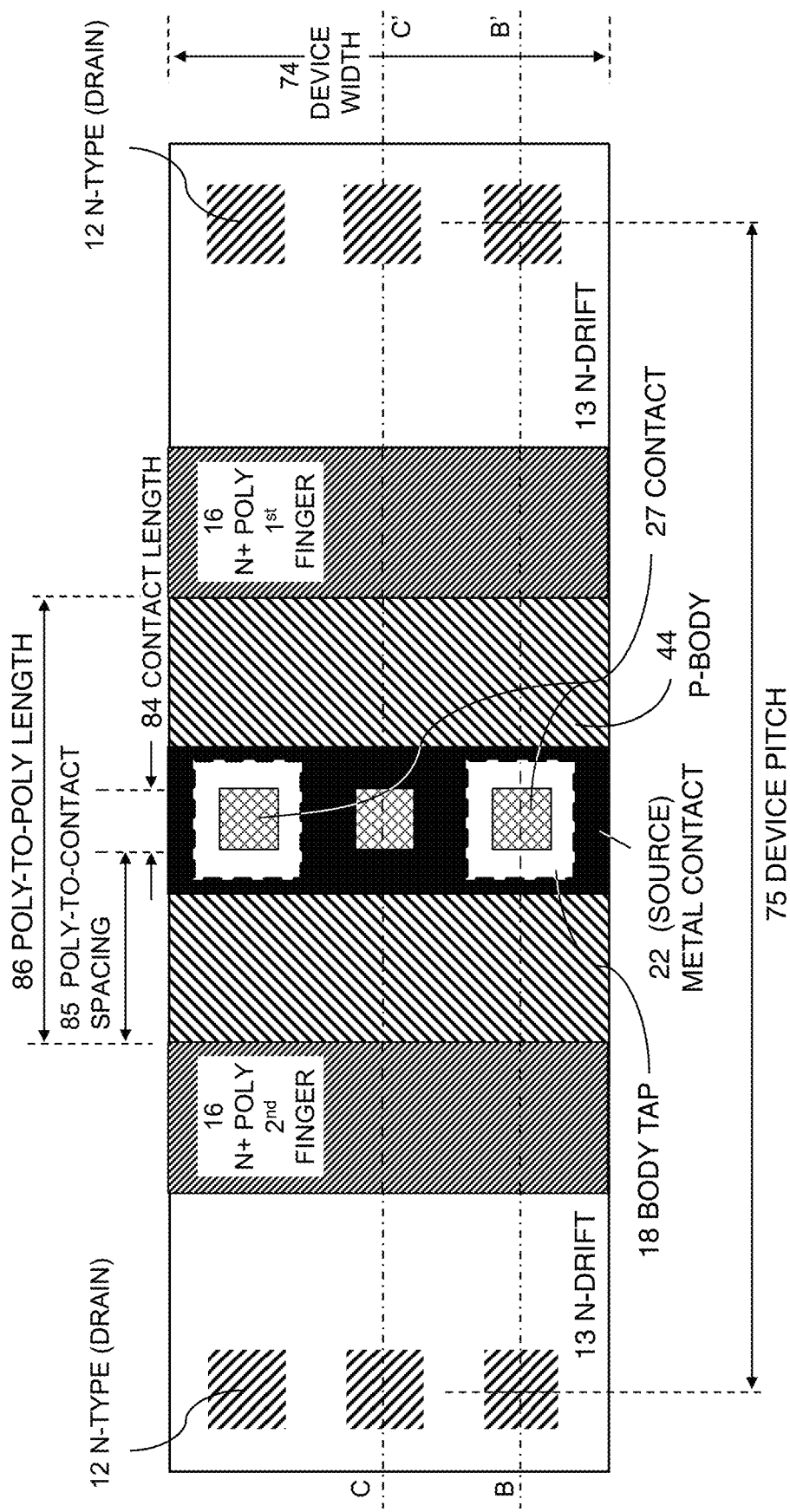
FIG. 41A is a layout view of an exemplary two-finger SAHS LDMOS device with retrograde body well, utilizing a body tap in non-continuous contact with the source in accordance with one or more preferred embodiments of the present invention.

The devices discussed thus far, including those of FIGS. 6, 7, 10, 11, 12, and 13, are single-finger LDMOS devices, which are devices with one transistor gate. As discussed previously, common practice is to mirror the single-finger (gate) to create an even number of fingers (gates) by sharing the source and drain regions. In two-finger LDMOS devices, examples of which are shown in FIGS. 38A-41C, the device area is a product of the device width 74 and the device pitch 75, where the device pitch 75 is the distance between the centers of each drain in a two-finger LDMOS (as shown in FIGS. 39A and 41A).

Depending on the design parameters and applications for a particular device, it may be desirable to reduce the device area, such as by reducing the device pitch 75. In this regard, some benefit can be achieved in a self-aligned body LDMOS through use of a buried body and a body tap in contact with the source. For example, FIG. 38A is a layout view of an exemplary two-finger self-aligned body LDMOS device with deep p-type buried body, utilizing a body tap in continuous contact with the source in accordance with one or more preferred embodiments of the present invention, and FIG. 38B is a cross-sectional view of the device of FIG. 38A, taken along line B-B'. The LDMOS device 380 of FIGS. 38A and 38B is similar in many ways to a two-finger version of FIG. 6 (a conventional self-aligned body LDMOS device 60) but with a deep p-type buried body 58. The two-finger self-aligned body LDMOS device 380 includes a p-type substrate 21, an n-type well 13, a deep p-type buried body 58, a p-type body 40, a continuous body tap 18 (made of p-type diffusion), shallow trench isolation 11, gate structures 16 (n+ polysilicon on gate oxide) and gate sidewall spacer structures 15, a lightly doped drain (LDD) 19 (made of n-type diffusion), a source region 14 (made of n-type diffusion), drain regions 12 (made of n-type diffusion), and ohmic contacts 22,23,24,25,26 at the source with abutted body tap, at the gates and at the drains, respectively, formed by silicidation. (In FIG. 38A, the buried body 58, which is not visible from above, is indicated in broken line in its relative location beneath the body 40, and the continuous body tap 18, which is likewise not visible from above, is indicated in broken line in its relative location beneath the source/body contact.) The source/body contact 27 connects the first layer of metal interconnect to the ohmic contact 22 of the LDMOS device 380. The minimum poly-to-poly length 89 for LDMOS device 380 is limited by the minimum length of the buried body 58 plus a standoff 81 on each side of the buried body. The standoff 81 length indicates the separation between the edge of the gate structure 16 and the edge of the buried body diffusion 58. The standoff 81 prevents the buried body implant from extending under the poly-edge of the gate structures 16 and adversely impacting the electrical performance of the device 380.

Figure 39B:
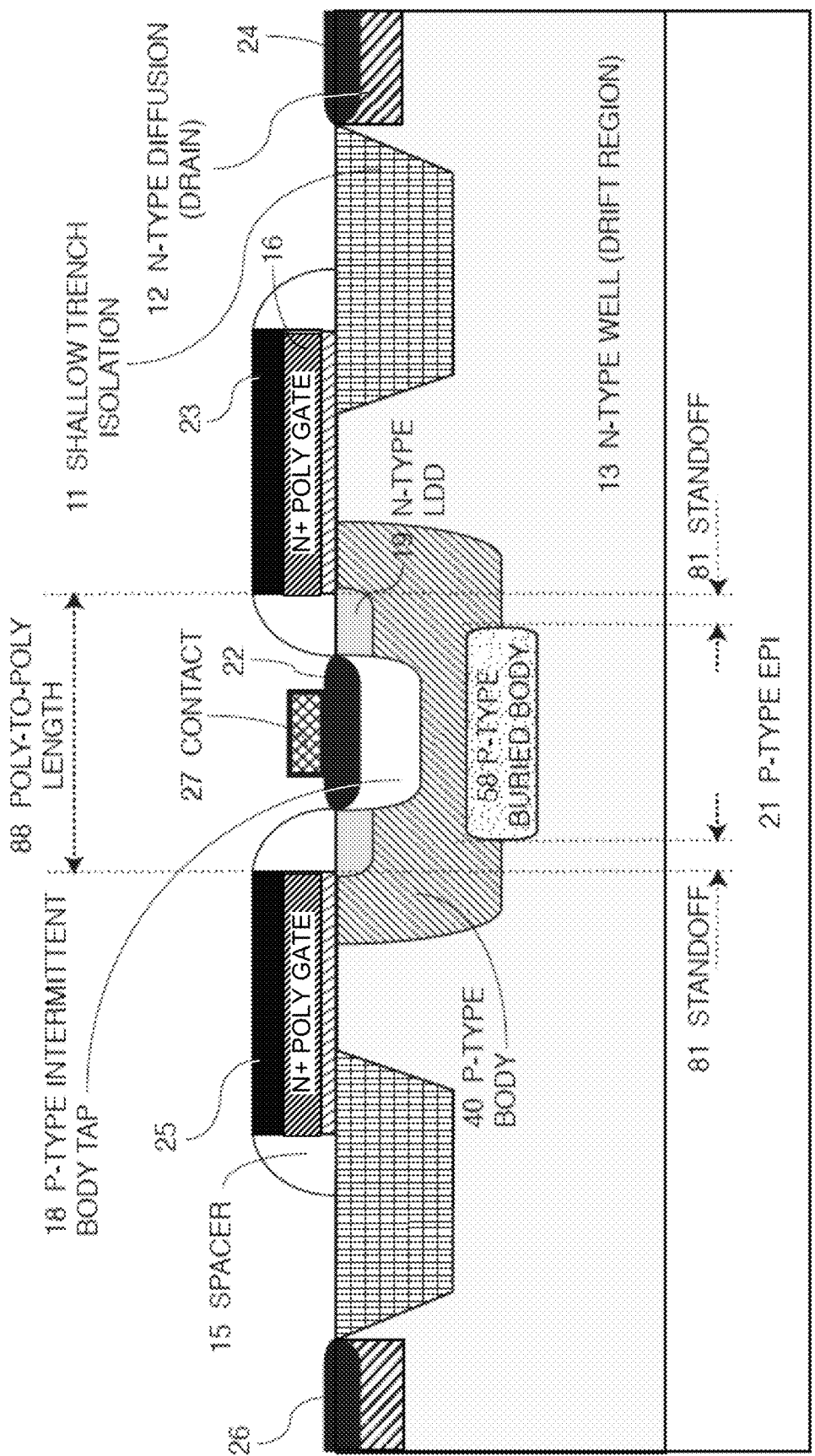
FIG. 39B is a cross-sectional view of the device of FIG. 39A, taken along line B-B'.
Figure 39C:
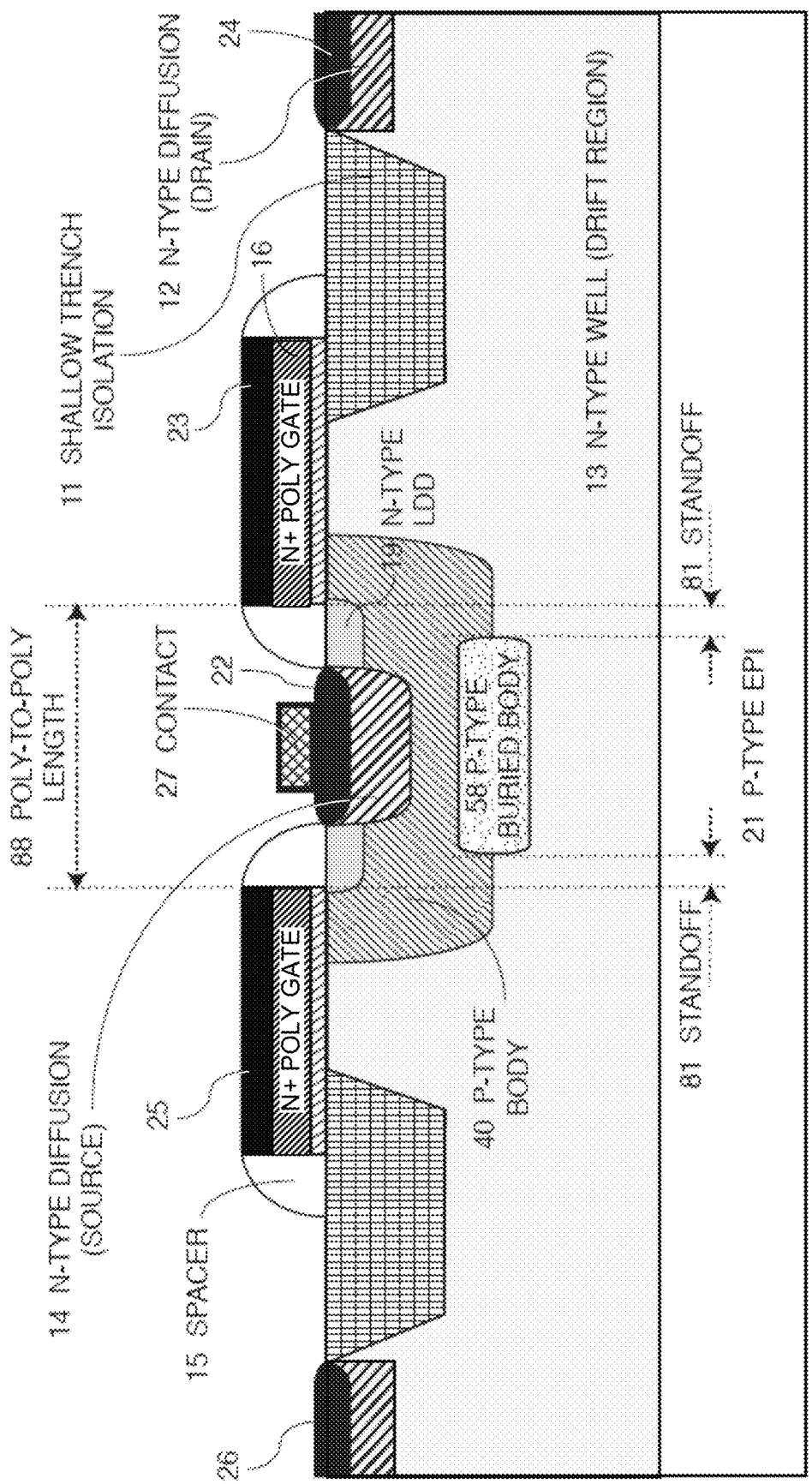
FIG. 39C is a cross-sectional view of the device of FIG. 39A, taken along line C-C'.

If desired, the length of the device 380 of FIGS. 38A and 38B may be reduced through the use of non-continuous, intermittent, body taps in place of a continuous body tap. In this regard, FIG. 39A is a layout view of an exemplary two-finger self-aligned body LDMOS device with deep p-type buried body, utilizing a body tap in non-continuous contact with the source in accordance with one or more preferred embodiments of the present invention; FIG. 39B is a cross-sectional view of the device of FIG. 39A, taken along line B-B'; and FIG. 39C is a cross-sectional view of the device of FIG. 39A, taken along line C-C'. The LDMOS device 390 of FIGS. 39A and 39B includes a p-type substrate 21, an n-type well 13, a deep p-type buried body 58, a p-type body 40, non-continuous body taps 18 (made of p-type diffusion), shallow trench isolation 11, gate structures 16 (n+ polysilicon on gate oxide) and gate sidewall spacer structures 15, a lightly doped drain (LDD) 19 (made of n-type diffusion), a source region 14 (made of n-type diffusion), drain regions 12 (made of n-type diffusion), and ohmic contacts 22,23,24,25,26 at the source, at the gates, and at the drains, respectively, formed by silicidation. (In FIG. 39A, the buried body 58, which is not visible from above, is indicated in broken line in its relative location beneath the body 40, and the non-continuous body taps 18 and the interspersed source region 14, which are likewise not visible from above, are indicated in broken line in their relative locations beneath the source/body contact.) As shown in FIG. 39A, the p-type body tap 18 diffusions are interspersed in line with the n-type source diffusion 14. The source/body contact 27 connects the first layer of metal interconnect to the ohmic contact 22 of the LDMOS device 380.

Because the p-type body taps 18 may be placed periodically along the source contact 22, the poly-to-poly length 88 can be reduced. Notably, however, even though the source/body tap length has been reduced, the minimum poly-to-poly length 88 for this LDMOS device 390 is limited by the minimum buried body length 58 plus a standoff 81 on each side of the buried body. The standoff 81 length indicates the separation between the edge of the gate structure 16 and the edge of the buried body diffusion 58. The standoff 81 prevents the buried body implant from extending under the poly-edge of the gate structures 16 and adversely impacting the electrical performance of the device 380.

Another way to reduce the length of the device 380 of FIGS. 38A and 38B is to utilize a retrograde body well and hybrid contact in the manner shown in FIG. 13. In this regard, FIG. 40A is a layout view of an exemplary two-finger SAHS LDMOS device 400 with a retrograde body well 45 and hybrid contact 10 in accordance with one or more preferred embodiments of the present invention, and FIG. 40B is a cross-sectional view of the device 400 of FIG. 40A, taken along line B-B'. The SAHS LDMOS device 400 of FIGS. 40A and 40B is similar in many ways to a two-finger version of the device 110 of FIG. 13 and includes a p-type substrate 21, an n-type well 13, a retrograde body well 45, a self-aligned p-type body 44, a Schottky source through the use of a hybrid contact 10 (hybrid source), a continuous body tap 18 (made of p-type diffusion), shallow trench isolation 11, gate structures 16 (n+ polysilicon on gate oxide) and gate sidewall spacer structures 15, drain regions 12 (made of n-type diffusion), and ohmic contacts 22,23, 24,25,26 at the source with abutted body tap, at the gates and at the drains, respectively, formed by silicidation. (In FIG. 40A, the continuous body tap 18, which is not visible from above, is indicated in broken line in its relative location beneath the source/body contact.) The hybrid contact 10 is created from the placement of a hybrid contact implant 17 and subsequent silicidation of metal 22. The retrograde body well 45 is below, and noncontiguous with, the body region. The source/body contact 27 connects the first layer of metal interconnect to the ohmic contact 22 of the LDMOS device 400.

Notably, the retrograde body well 45 can extend under the gate poly, as there is little surface dopant to impact the channel region of the device, and the standoff length is thus eliminated. However, the minimum poly-to-poly length 87 is still limited by the poly-to-p-type body tap spacing 83 and the p-type body tap 18 length, which is greater than and encompasses the contact length 84.

Figure 41B:
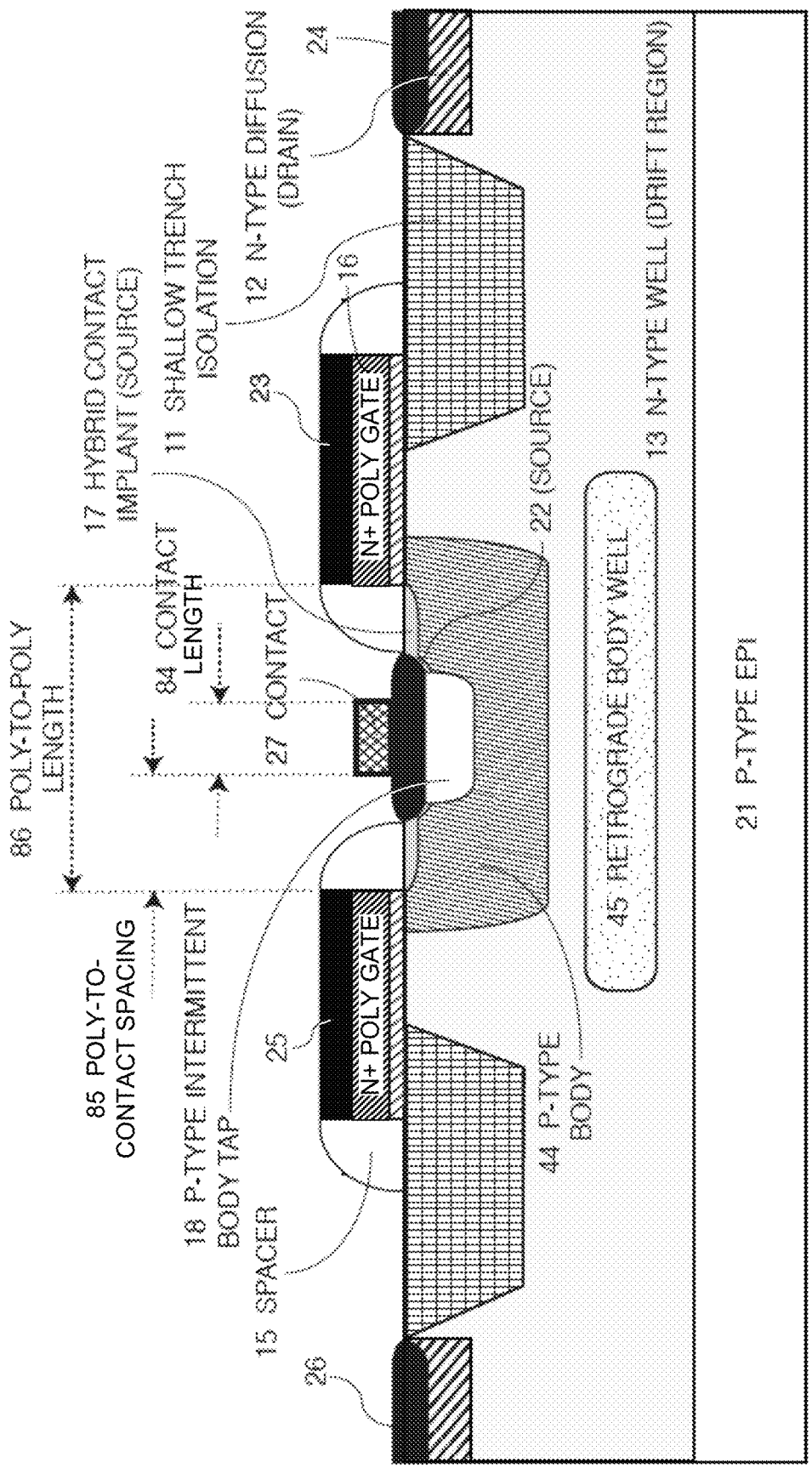
FIG. 41B is a cross-sectional view of the device of FIG. 41A, taken along line B-B'.
Figure 41C:
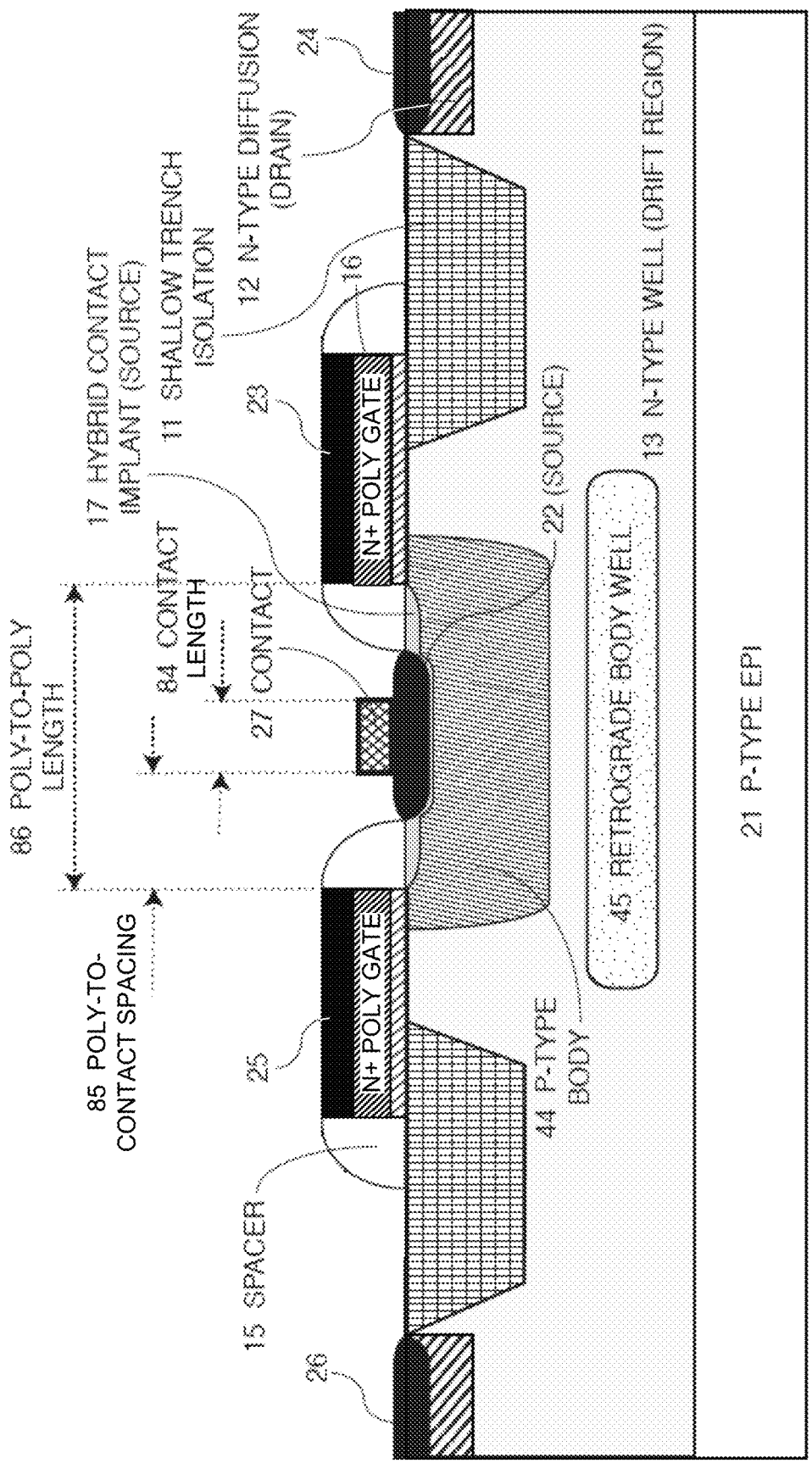
FIG. 41C is a cross-sectional view of the device of FIG. 41A, taken along line C-C'.

However, the length of the device can be minimized by using both the non-continuous, intermittent, body taps of FIGS. 39A-39C and the retrograde body well 45 and hybrid contact 10 of FIGS. 40A and 40B. In this regard, FIG. 41A is a layout view of an exemplary two-finger SAHS LDMOS device 410 with retrograde body well, utilizing a body tap in non-continuous contact with the source in accordance with one or more preferred embodiments of the present invention; FIG. 41B is a cross-sectional view of the device of FIG. 41A, taken along line B-B'; and FIG. 41C is a cross-sectional view of the device of FIG. 41A, taken along line C-C'. The SAHS LDMOS device 410 of FIGS. 41A and 41B includes a p-type substrate 21, an n-type well 13, a retrograde body well 45, a self-aligned p-type body 44, a Schottky source through the use of a hybrid contact 10 (hybrid source), non-continuous body taps 18 (made of p-type diffusion), shallow trench isolation 11, gate structures 16 (n+ polysilicon on gate oxide) and gate sidewall spacer structures 15, drain regions 12 (made of n-type diffusion), and ohmic contacts 22,23,24,25,26 at the source, at the gates, and at the drains, respectively, formed by silicidation. (In FIG. 41A, the non-continuous body taps 18 and the interspersed source region 14, which are not visible from above, are indicated in broken line in their relative locations beneath the source/body contact.) The retrograde body well 45 is below, and noncontiguous with, the body region. The hybrid contact 10 is created from the placement of a hybrid contact implant 17 and subsequent silicidation of metal 22. The source/body contact 27 connects the first layer of metal interconnect to the ohmic contact 22 of the LDMOS device 400.

As with the device 400 of FIGS. 40A and 40B, the retrograde body well 45 can extend under the gate poly, as there is little surface dopant to impact the channel region of the device, and the standoff length is thus eliminated. In addition, however, no extra space for the p-body is required, and the poly-to-poly length 86 becomes a function only of the contact length 84 and the poly-to-contact spacing 85 on each side of the contact 27. In this way, minimum poly-to-poly length 86 may be achieved.

Another embodiment of the SAHS LDMOS device is a two-finger version of the LDMOS device 90 of FIG. 11 but utilizing a body tap 18 that is in non-continuous contact with source contact 22 (not shown). Such a device includes the specific features of a self-aligned body 44 and Schottky source through the use of a hybrid contact 10 (hybrid source), is only limited by the contact length 84 and the poly-to-contact spacing 85 on each side of the contact 27. Moreover, since both the contact 84 width and poly-to-contact spacing 85 shrink with each technology node, all variants of the self-aligned body with hybrid contact utilizing a non-continuous contact, with or without the retrograde body, achieve the minimum poly-to-poly length spacing, enabling the minimum poly-to-poly length to scale with the design rules at smaller technology nodes.

In addition to the SAHS LDMOS devices 400,410 shown in FIGS. 40A-41C, it will be appreciated that in other embodiments of the SAHS LDMOS devices, alternative methods to shallow trench isolation 11 may be used during fabrication. These alternative methods involve omitting the STI generation in Step 1 of the general fabrication process 10000 and generating isolation later in the process. For example, in one embodiment, stepped oxide isolation 62 may be used. The gate structure is formed adjacent and/or overlay to deposited oxide in Step 4 of process 10000, where the stepped oxide isolation 62 forms a gate-to-drain isolation region.

Figure 14:
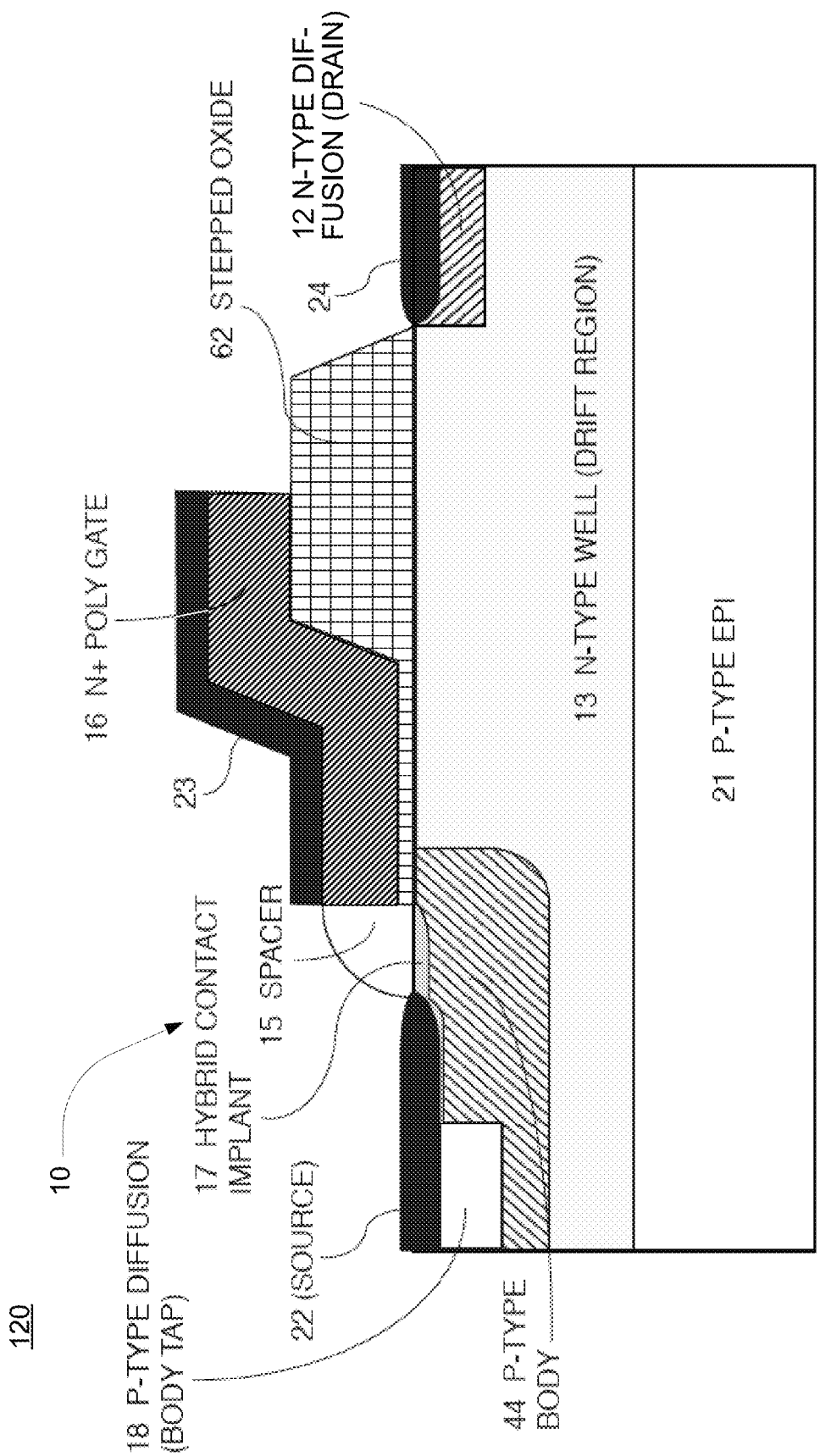
FIG. 14 is a cross-sectional view of an exemplary single-finger SAHS LDMOS device using stepped oxide isolation in accordance with one or more preferred embodiments of the present invention.

FIG. 14 is a cross-sectional view of an exemplary single-finger SAHS LDMOS device 120 using stepped oxide isolation 62 in accordance with one or more preferred embodiments of the present invention. The LDMOS device 120 includes the specific features of a self-aligned p-type body 44, Schottky source through the use of a hybrid contact 10 (hybrid source), a stepped oxide isolation region 62 and a global n-type well 13. LDMOS device 120 of FIG. 14, also includes standard LDMOS features such as a p-type substrate 21, a body tap 18, a gate structure 16 and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22. Alternative variations of device 120 are described in fabrication (manufacturing) flows (methods) below where the global n-type well 13 may also contain a p-type buried body 58 similar to the device 80 in FIG. 10, or a retrograde body well 45 as shown in FIG. 13. Other variations are described where a device may have a partial n-type well 113 in place of a global n-type well 13, similar to device 100 in FIG. 12.

Figure 29:
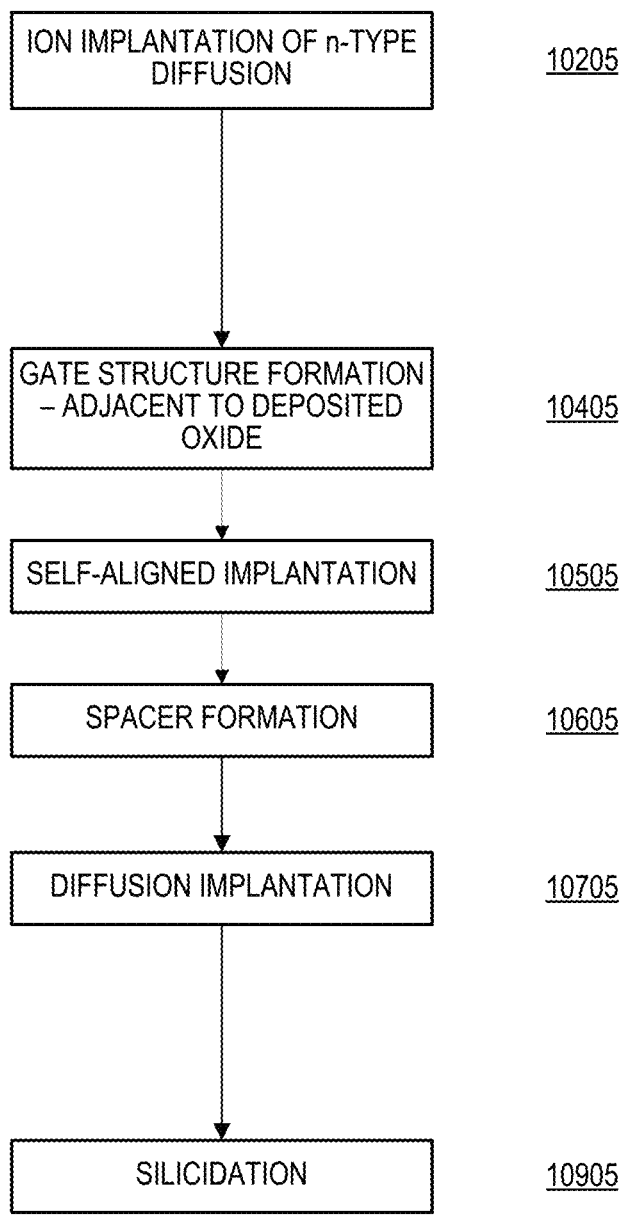
FIG. 29 illustrates a fabrication process for a SAHS LDMOS device of FIG. 14.
Figure 30:
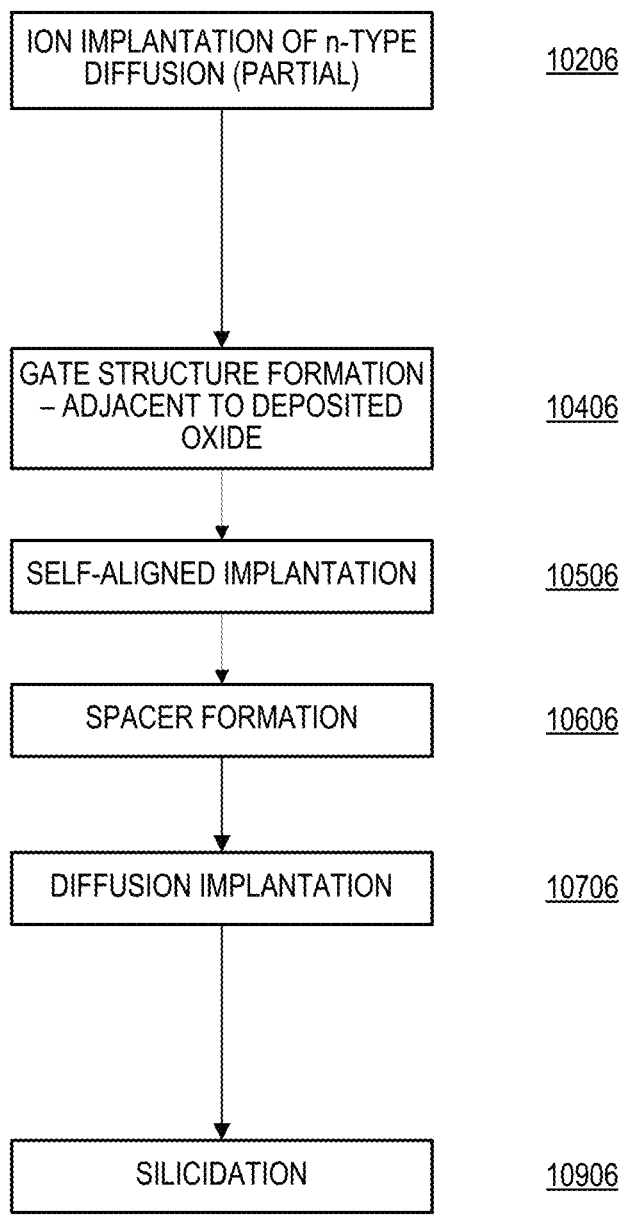
FIG. 30 illustrates a fabrication process for a SAHS LDMOS device similar to FIG. 14.
Figure 31:
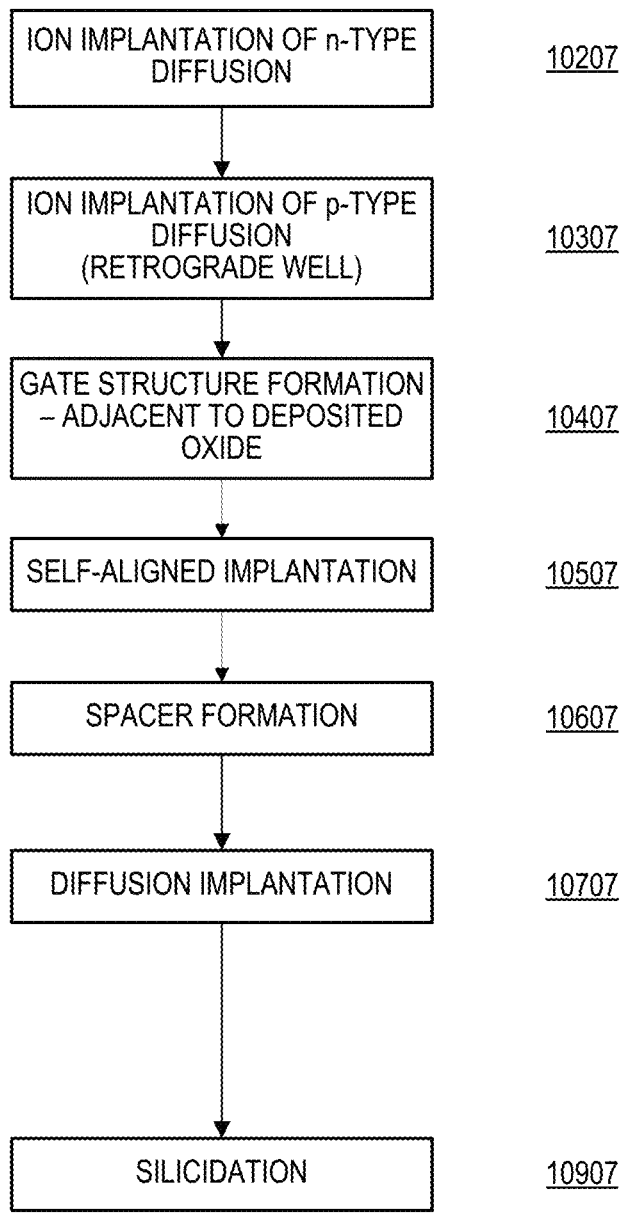
FIG. 31 illustrates a fabrication process for another SAHS LDMOS device similar to FIG. 14.

FIGS. 29-31 illustrate fabrication processes 10005, 10006, 10007 for SAHS LDMOS devices using stepped oxide isolation. More specifically, FIG. 29 illustrates a fabrication process 10005 for a SAHS LDMOS device like the device 120 of FIG. 14; FIG. 30 illustrates a fabrication process 10006 for a SAHS LDMOS device similar to the device 120 of FIG. 14, with stepped oxide isolation formed during gate structure formation 10406, except the photoresist opening restricts the n-type diffusion implant 10206 from covering the entirety of the device, thus creating a partial n-type well region. Finally, FIG. 31 illustrates a fabrication process 10007 for another SAHS LDMOS device similar to the device 120 of FIG. 14, with stepped oxide isolation formed during gate structure formation 10407, but where ion implantation of p-type diffusion with lithographically patterned retrograde well region 10307 results in a deep p-type well.

Figure 15:
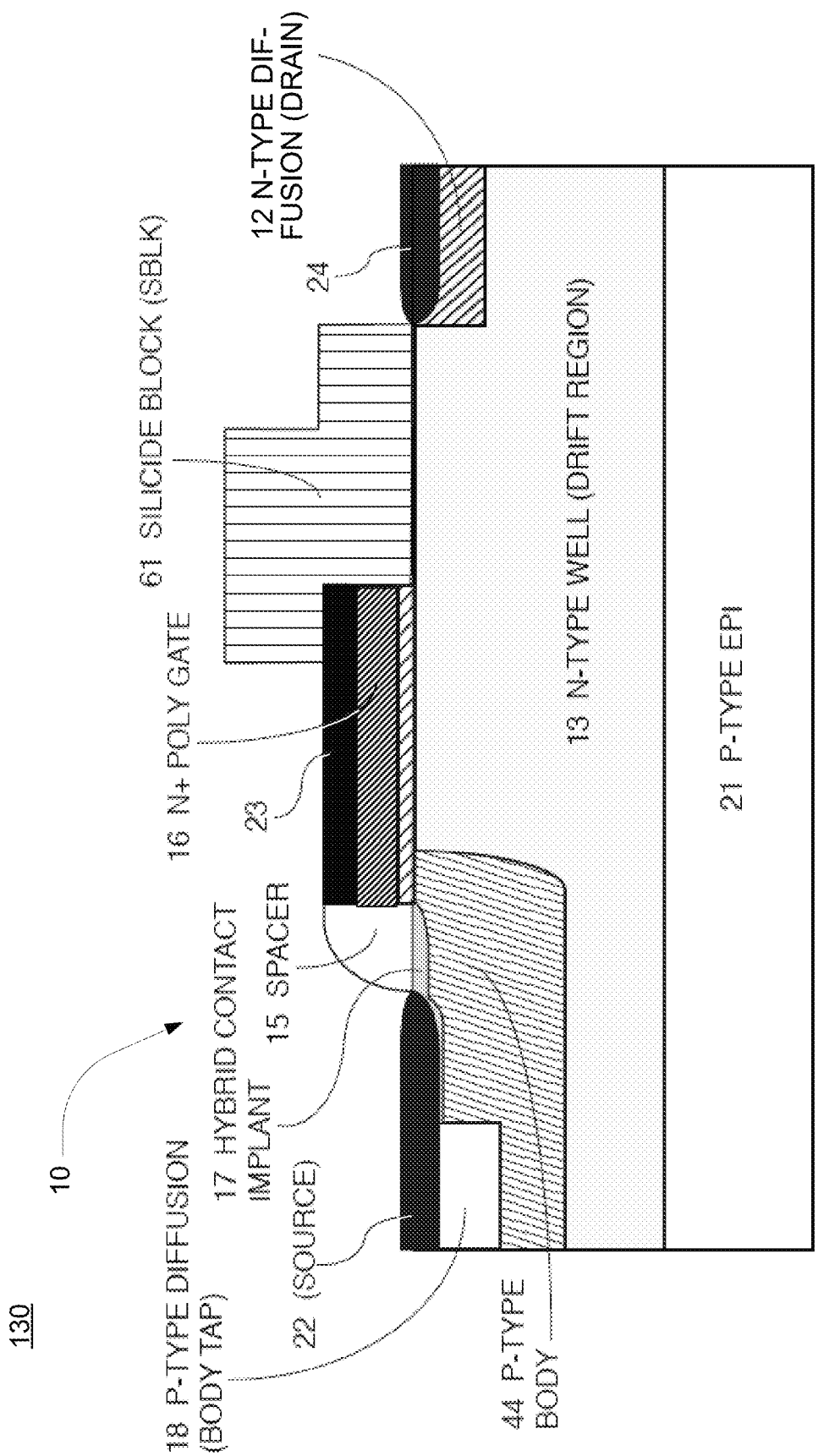
FIG. 15 is a cross-sectional view of an exemplary single-finger SAHS LDMOS device using a silicide block isolation region in accordance with one or more preferred embodiments of the present invention.

FIG. 15 is a cross-sectional view of an exemplary single-finger SAHS LDMOS device 130 using a silicide block isolation region 61 in accordance with one or more preferred embodiments of the present invention. The LDMOS device 130 includes the specific features of a self-aligned p-type body 44, Schottky source through the use of a hybrid contact 10 (hybrid source), silicide block isolation 61 and a global n-type well 13. LDMOS device 130 of FIG. 15, also includes standard LDMOS features such as a p-type substrate 21, a body tap 18, a gate structure 16 (polysilicon on gate oxide) and gate sidewall spacer structure 15, a drain region 12, and ohmic contacts 23,24 at the gate and drain, respectively, formed by silicidation. The hybrid contact 10 is created from the placement of a hybrid contact implant 17 and subsequent silicidation of metal 22. Alternative variations of device 130 are described in fabrication flows (methods) below where the global n-type well 13 may also contain a p-type buried body 58 similar to the device 80 in FIG. 10, or a retrograde body well 45 as shown in FIG. 13.

Other variations are described where device similar to the device 130 of FIG. 15 may have a partial n-type well 113 in place of a global n-type well 13 in a manner similar to the device 100 in FIG. 12.

Figure 32:
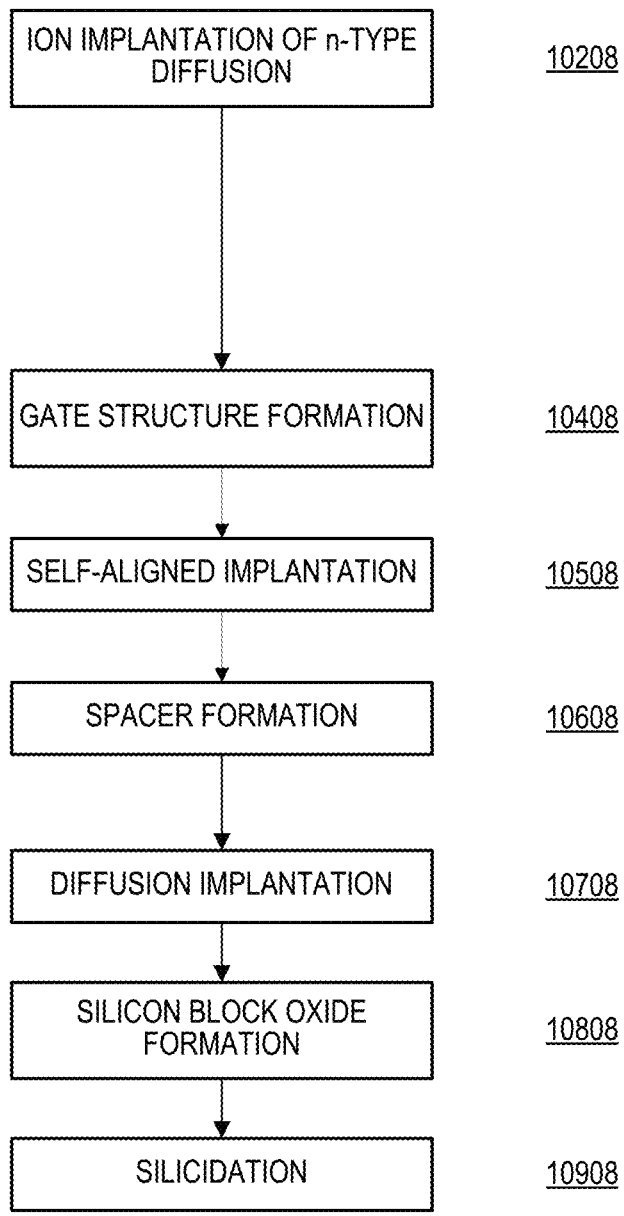
FIG. 32 illustrates a fabrication process for a SAHS LDMOS device of FIG. 15.
Figure 33:
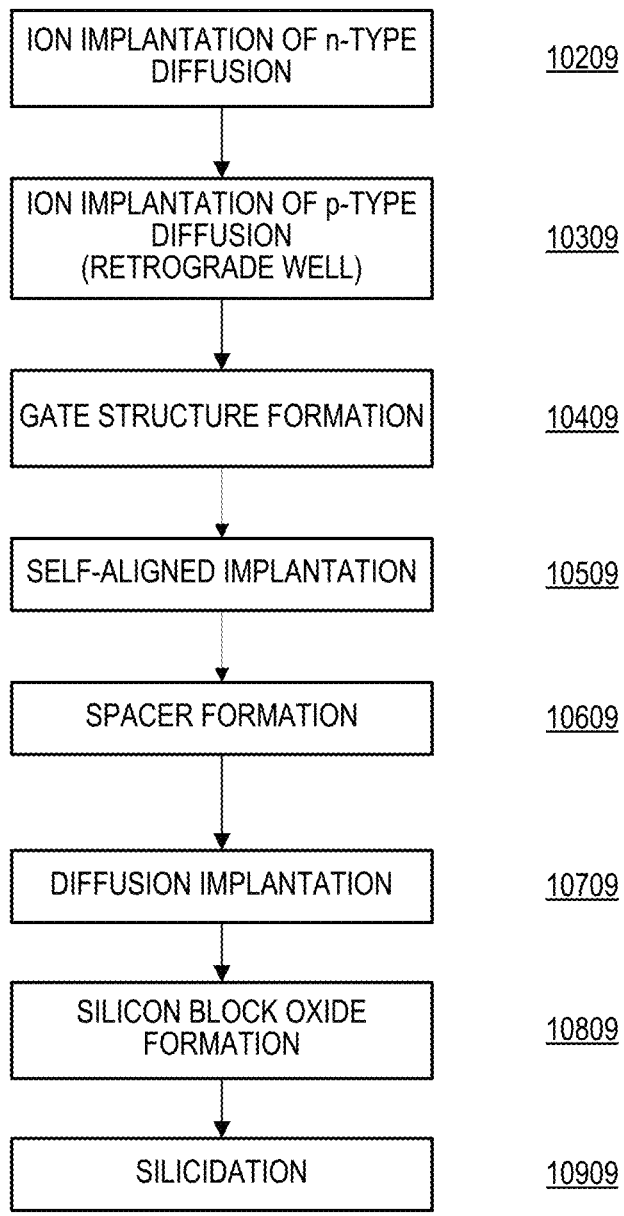
FIG. 33 illustrates a fabrication process for a SAHS LDMOS device similar to FIG. 15.

FIGS. 32 and 33 illustrate fabrication processes 10008, 10009 for SAHS LDMOS devices using a silicide block isolation region. More specifically, FIG. 32 illustrates a fabrication process 10008 for the SAHS LDMOS device 130 of FIG. 15, and FIG. 33 illustrates a fabrication process 10009 for a SAHS LDMOS device similar to the device 130 of FIG. 15, with silicide block isolation at step 10809, except the ion implantation of p-type diffusion with lithographically patterned retrograde well region 10309 results in a deep p-type well.

In further embodiments of a SAHS LDMOS device, a drain-side region that influences the electric field distribution is used in conjunction with the silicide block 61. For example, in Step 5 of the general fabrication process 10000, ion implantation of a self-aligned tilted p-type implant 29 and a self-aligned vertical hybrid contact implant 17 occurs on both the source side and drain side of the polysilicon gate. The combined placement of the p-type body implant 29 and hybrid contact implant 17 on the drain side creates a drain-side region that influences the electric field distribution. Step 8 of the general fabrication process 10000 forms a silicide block oxide partially on the gate and extends into the drain region to form a gate-to-drain isolation region.

Figure 16:
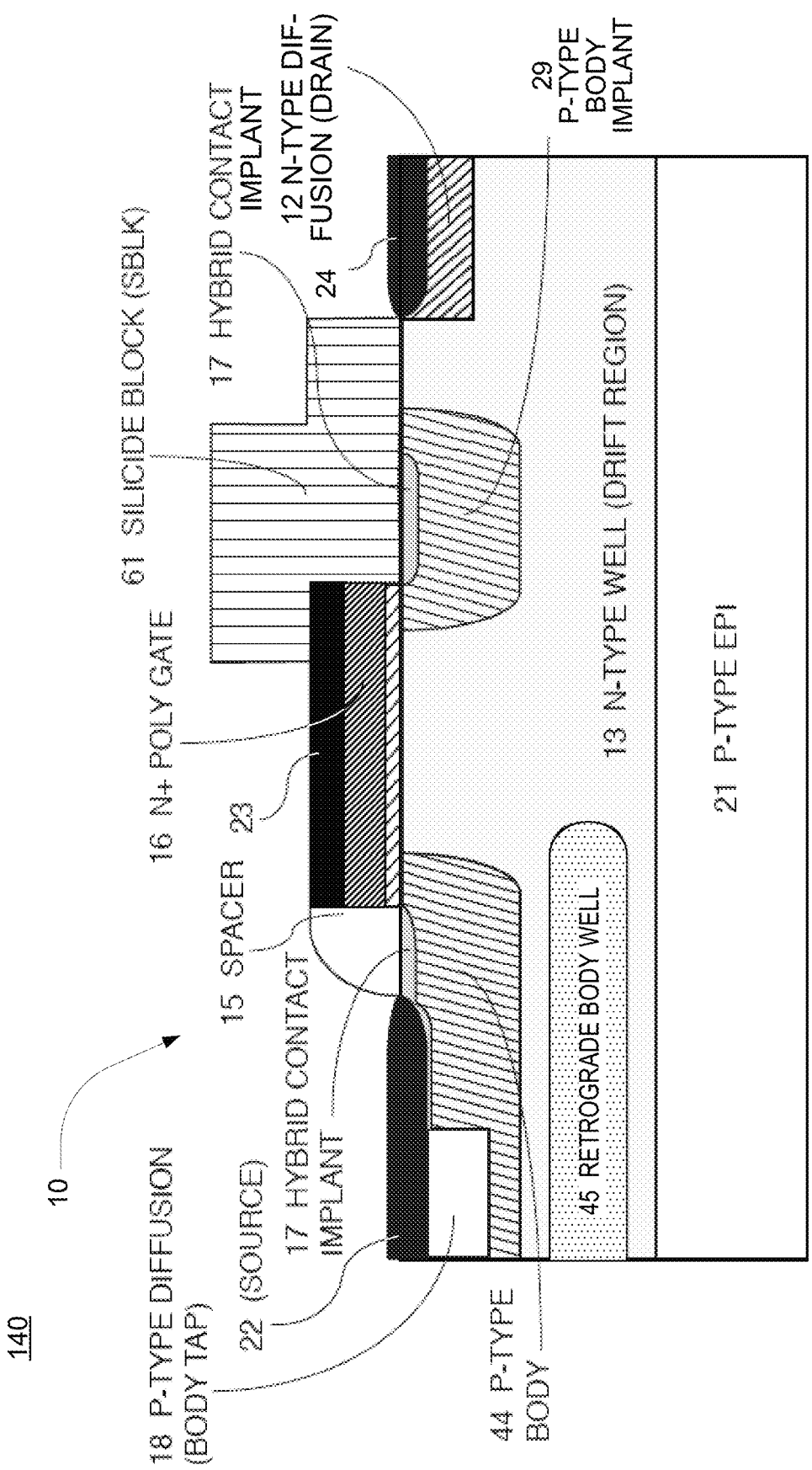
FIG. 16 is a cross-sectional view of an exemplary single-finger SAHS LDMOS device with a drain-side isolation region used in conjunction with silicide block in accordance with one or more preferred embodiments of the present invention.

FIG. 16 is a cross-sectional view of an exemplary single-finger SAHS LDMOS device 140 with a drain-side region that influences the electric field distribution, used in conjunction with silicide block 61, in accordance with one or more preferred embodiments of the present invention. The LDMOS device 140 includes a source side self-aligned p-type body 44, Schottky source through the use of a hybrid contact 10 (hybrid source), a silicide block 61, a drain-side region, a global n-type well 13, and a retrograde body well 45. The drain-side region includes a tilted p-type body implant 29 and a vertical hybrid contact implant 17, self-aligned to the drain side of the polysilicon gate. The LDMOS device 140 of FIG. 16 also includes standard LDMOS features such as a p-type substrate 21, a body tap 18, a gate structure 16 (polysilicon on gate oxide) and gate sidewall spacer structure 15, a drain region 12, and ohmic contacts 23,24 at the gate and drain, respectively, formed by silicidation. The retrograde body well 45 is below, and noncontiguous with, the body region. The hybrid contact 10 is created from the placement of a hybrid contact implant 17 and subsequent silicidation of metal 22. Alternative variations of device 140 are described in fabrication (manufacturing) flows (methods) below where the global n-type well 13 may contain a p-type buried body 58 similar to the device 80 in FIG. 10, in place of a retrograde body well 45. Other variations are described where device 140 may have partial n-type well 113 in place of a global n-type well 13 similar to device 100 in FIG. 12.

Figure 34:
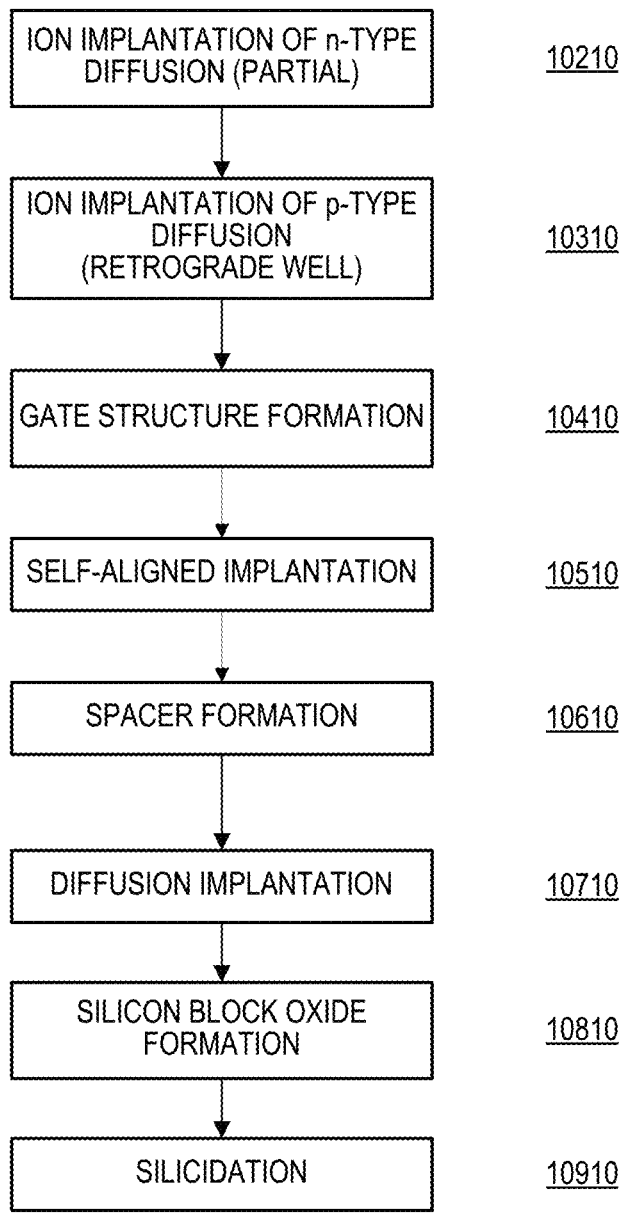
FIG. 34 illustrates a fabrication process for a SAHS LDMOS device similar to FIG. 16.
Figure 35:
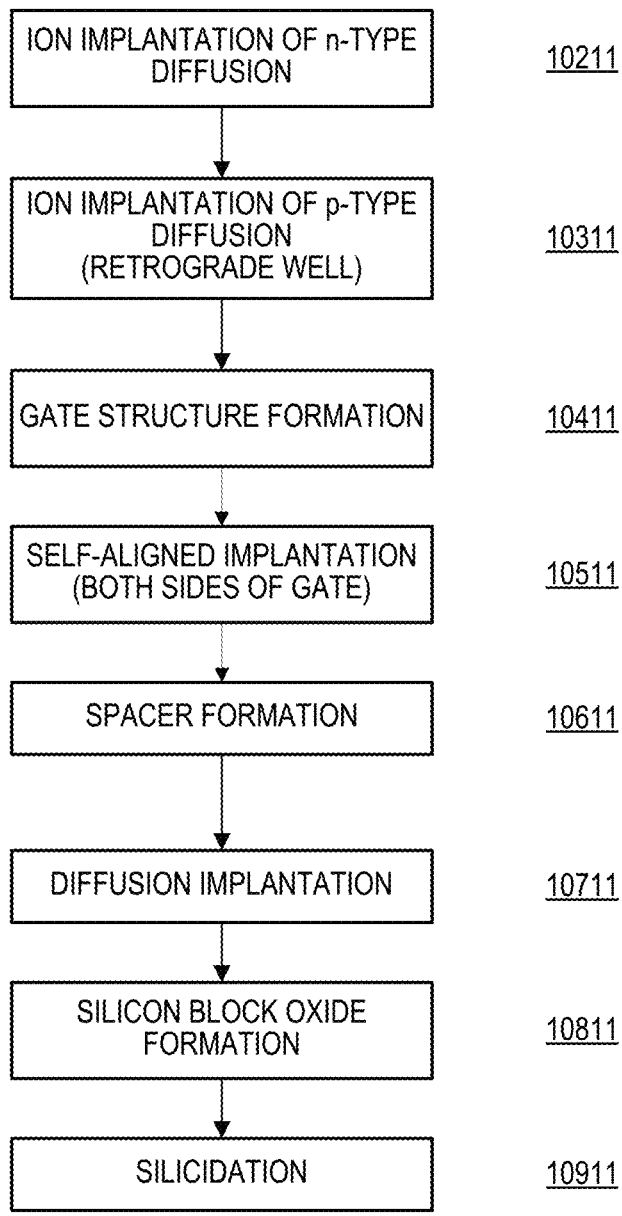
FIG. 35 illustrates a fabrication process for a SAHS LDMOS device of FIG. 16.
Figure 36:
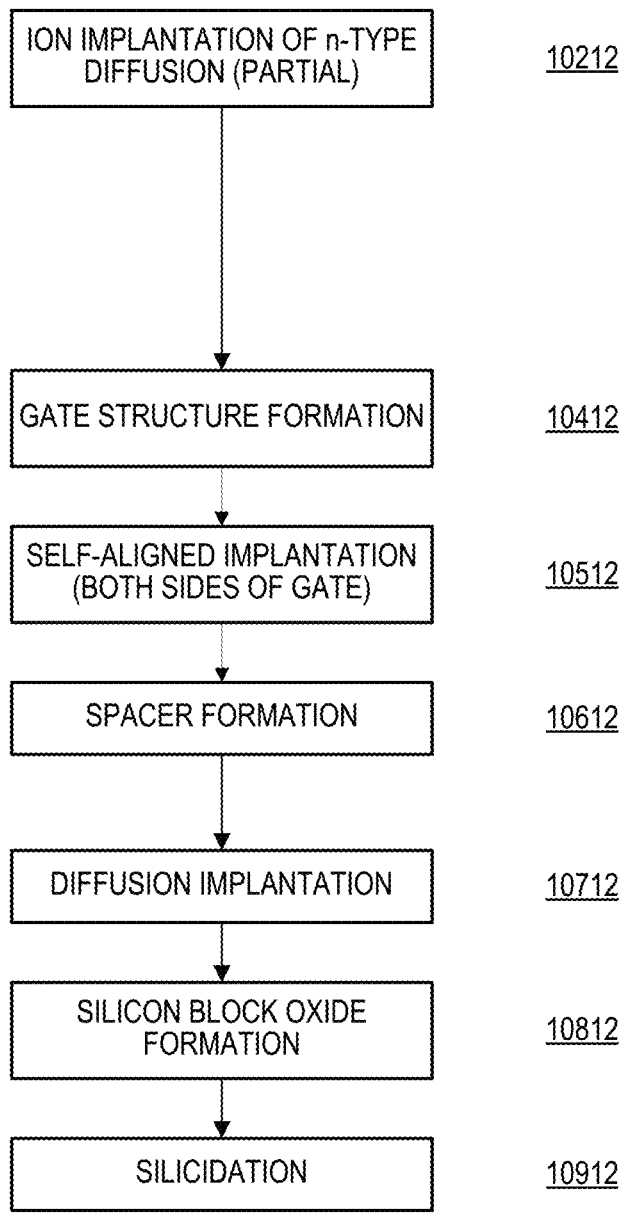
FIG. 36 illustrates a fabrication process for a SAHS LDMOS device similar to FIG. 16.

FIG. 35 illustrates a fabrication process 10011 for a SAHS LDMOS device 140 of FIG. 16. Assuming a p-type substrate from Step 1 of the general fabrication process 10000, the next process step, the lithographically patterned ion implantation of n-type diffusion 10211, n-type diffusion implanted across the entirety of the substrate, creates a global n-type well region,. Next, the ion implantation of p-type diffusion with lithographically patterned retrograde well region 10311 results in a deep p-type well. Next, gate structure formation at step 10411 is done through gate oxide growth, polysilicon deposition and etch. This polysilicon gate structure forms a mask for self-aligned implantation at step 10511, of the subsequent ion implantation of self-aligned p-type implants and self-aligned vertical n-type hybrid contact implants on the source and drain side of the gate structure. The next step 10611 is spacer formation adjacent the source and drain sides of the gate. Then diffusion implantation occurs at step 10711 where n-type diffusion is implanted into both the polysilicon gate and the n-type well or drift region created in step 10211 and p-type diffusion is implanted into the body region (p-type implant on the source side) created in step 10511. Next deposition of a silicon dioxide layer occurs at step 10811 that extends at least partially over the gate polysilicon and extends to the drain region, forming a gate-to-drain isolation region. Finally, at step 10911, silicidation of the blanket layer of metal is performed to form ohmic contacts to the body tap, gate structure, and drain region. It is also the final step in creating a source hybrid contact, whereby a vertical Schottky junction is formed between the silicide and underlying self-aligned p-type body and a lateral ohmic junction is formed between the silicide and hybrid contact implant. FIG. 34 illustrates a fabrication process 10010 for a SAHS LDMOS device similar to FIG. 16, but with a partial n-type well 113 and retrograde well 45. FIG. 36 illustrates a fabrication process 10012 for a SAHS LDMOS device similar to that of FIG. 16 but with a partial n-type well 113 and no retrograde well 45.

The SAHS LDMOS devices 80,90,100,110,120,130,140 specifically described in FIGS. 10-16 are better understood with a more detailed explanation of the formation of each area of the devices created during the general fabrication process 10000 in FIG. 9. Isolation in Step 1 of the fabrication process 10000 is created in an LDMOS device to prevent premature gate to drain breakdown. A dielectric must be formed between the gate polysilicon and the drain region. One form of isolation is that of a shallow trench formed as described in FIGS. 10-13. This is etched into the p-type silicon substrate and subsequently filled with silicon dioxide. Other methods for dielectric isolation exist, such as having an active gap (non STI) offset between the gate polysilicon and drain as described in FIG. 15 and FIG. 16, or depositing an oxide before the gate structure formation (stepped oxide) as described in FIG. 14. The necessary process steps to enable these alternative options occur later in the process flow and are detailed later in the description.

In Step 2, an n-type well acting as a drift region is created. An n-type implantation is performed to form the drift region of the LDMOS. The lithographic mask pattern may be across the entirety of the device (global) or only part of the device (partial).

In Step 3, a deep p-type well may then be implanted into the drift region, in the case of a global drift implant. For partial drift region implantation, this well will be offset from the drift region. This well may take the form of several implantations, of varying implant energy in order to create a relatively consistent vertical doping concentration. The placement of the well is under the self-aligned body, and together with the p-type self-aligned body, forms a continuous vertical p-type body region. The purpose of the deep well is to reduce the body resistance of the device, which has been previously demonstrated to improve the ESD performance of the device. Alternatively in one preferred embodiment due to improved ESD performance through other process steps, the well implantation of Step 3 is not necessary and may be skipped in order to reduce process complexity and cost. However, skipping Step 3 results in a shallow body region, which can be more prone to higher leakage and lower breakdown. Other novel process steps which address these leakage and breakdown issues are described below.

In Step 3, an alternative to the deep PWELL is a p-type retrograde body implant. Like the deep PWELL it will be a deep implant, performed under the self-aligned body region. However, it differs from the above deep PWELL in that it does not merge with the self-aligned body. Instead, an identifiable n-type region is evident between the self-aligned body in the case of a global n-type well implant (ndrift region). In the case of a non-global n-type well implant, the region between the self-aligned body and this retrograde body implant will have a doping concentration that approximates that of the p-type starting substrate. The advantage of including this retrograde body is to mitigate the negative effects of omitting the deep p-type well implant (higher leakage, lower breakdown), while minimizing the impact of this implant on the channel region.

In Step 4, the gate structure is formed. The typical formation involves the growth of silicon dioxide on the silicon substrate, polysilicon deposition and finally polysilicon etch to form a gate stack—polysilicon on gate oxide. This will be on the ndrift region for a global n-type well implant and overlapping the ndrift region for a partial n-type well implant. It is also advantageous to have a thicker oxide at the drain side to increase the dielectric isolation between the gate polysilicon and the drain. In such a case, the gate structure is comprised of a layer of silicon dioxide of varying thickness, whereby the drain side thickness exceeds the source side thickness, and polysilicon is deposited on this silicon dioxide. During this step, an alternative to the STI in Step 1 may also be created. A layer of oxide may be deposited on the silicon in the region between the gate polysilicon and the drain region and may extend partly under the polysilicon. This layer is commonly referred to as stepped oxide.

Figure 17:
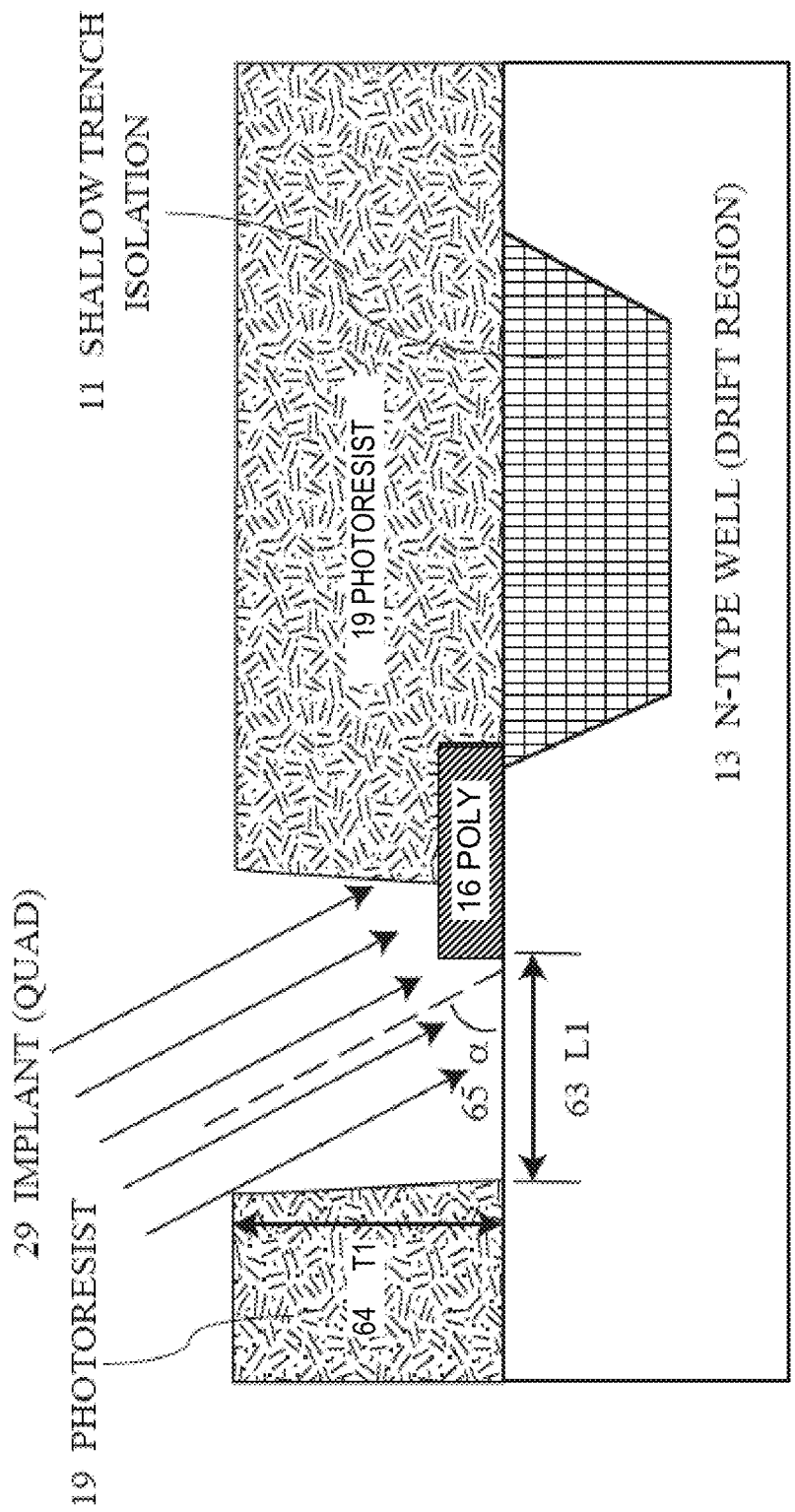
FIG. 17 illustrates the maximum photoresist thickness (T1) in a preferred embodiment of a SAHS LDMOS device.
Figure 18:
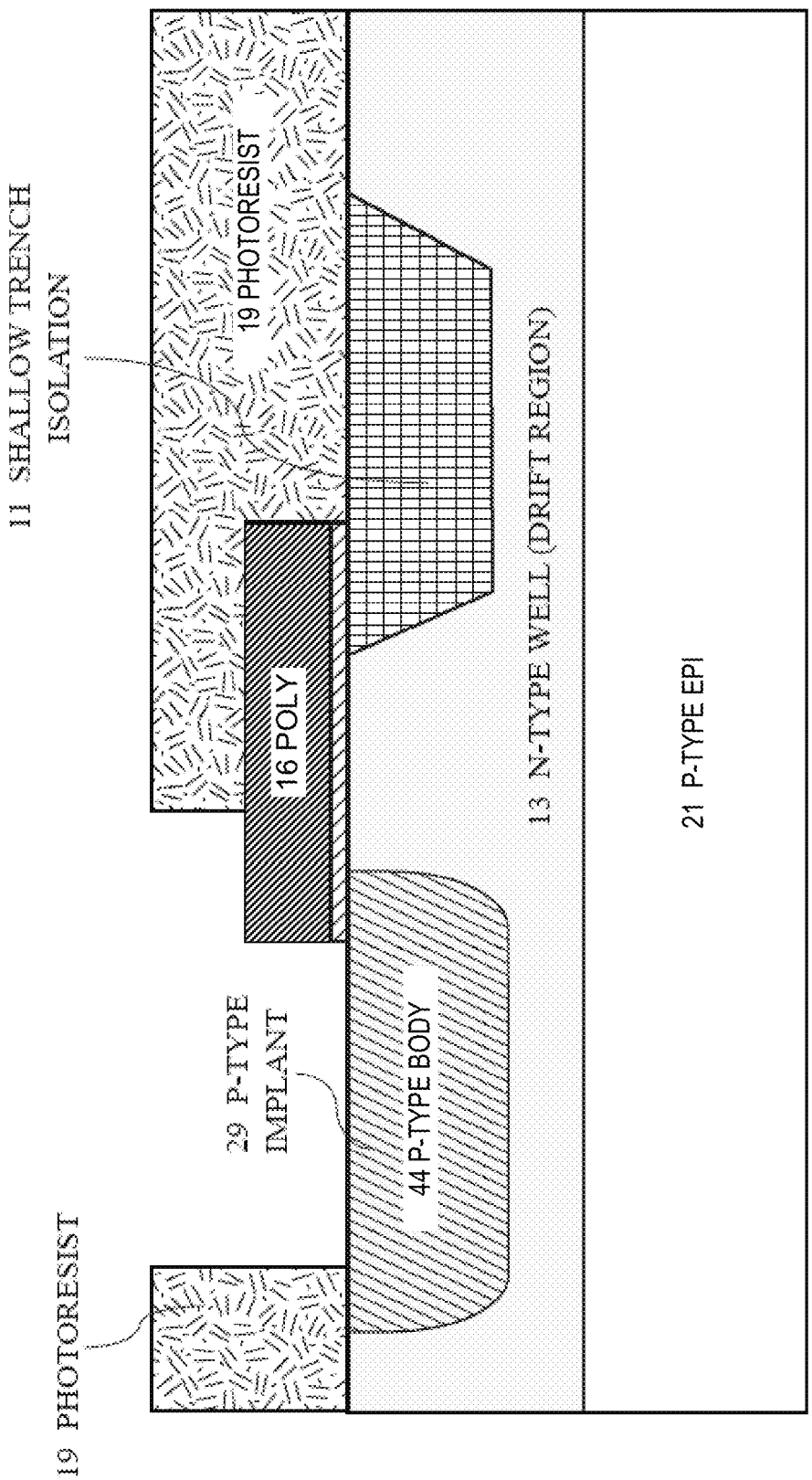
FIG. 18 illustrates areas in a SAHS LDMOS device exposed to self-aligned body implantation, where the photoresist is developed to expose areas that include the body region and at least part of the gate structure.
Figure 19:
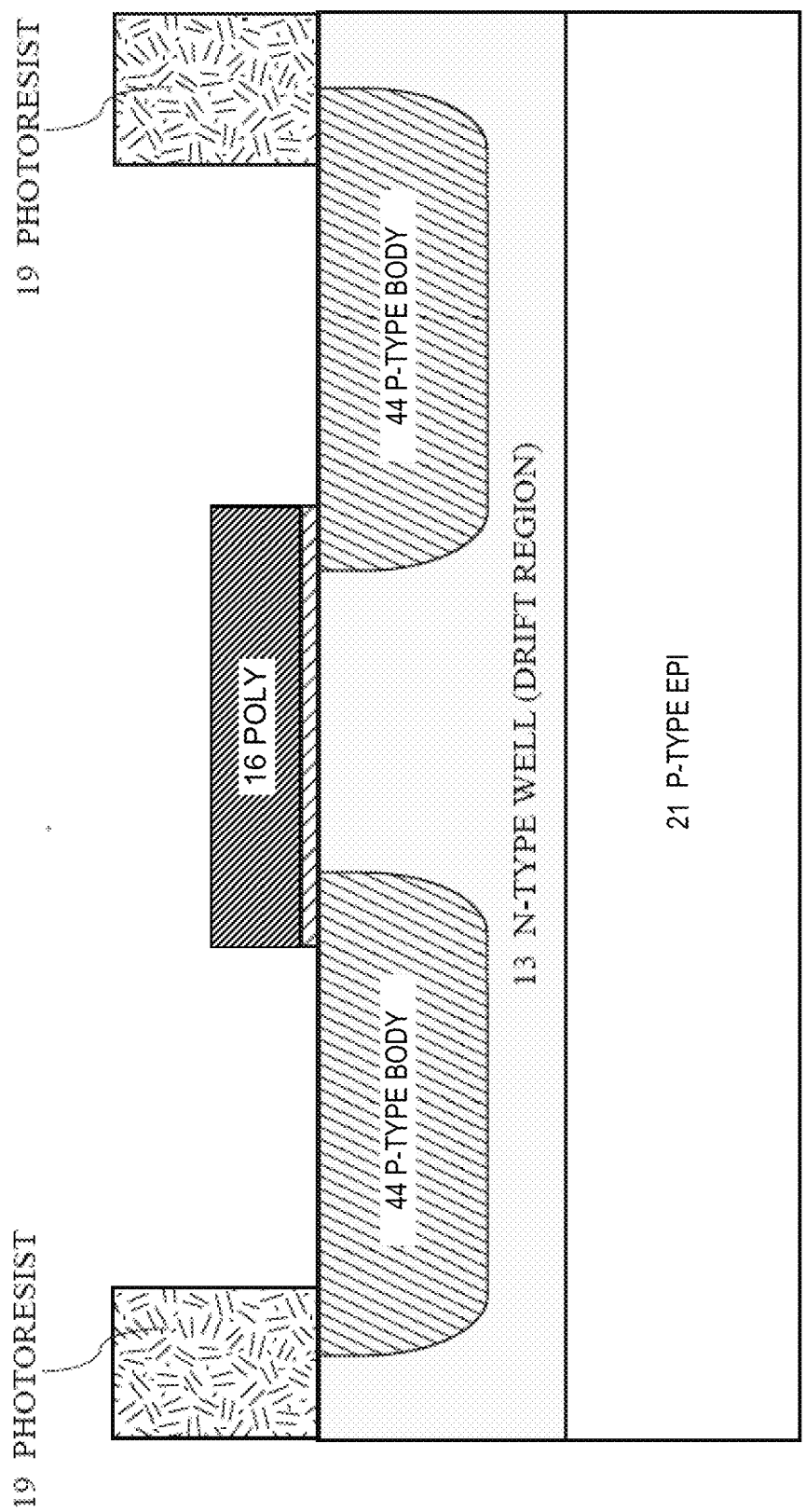
FIG. 19 illustrates areas exposed to self-aligned body implantation in another preferred embodiment of a SAHS LDMOS device

Prior to Step 5, a photoresist coating 59 is applied. Step 5 is the ion implantation of a self-aligned p-type body and a self-aligned vertical n-type hybrid contact implant on the source-side of the device and in some embodiments the drain-side. FIG. 17 illustrates creating a self-aligned body using a p-type, quad rotated, tilted ion implantation 29. The thickness should be sufficient to prevent the subsequent body implantation penetrating the photoresist for regions beyond that of the LDMOS. It should also not be too thick to create implant shadowing for the tilted ion implantation. FIG. 17 illustrates the maximum photoresist thickness 64 (T1) in a preferred embodiment of a SAHS LDMOS device. A practical thickness is 1 μm with the upper limit being tan(α) times L1 63. FIG. 18 illustrates areas in a SAHS LDMOS device exposed to self-aligned body implantation, where the photoresist 59 is developed to expose areas that include the body region and at least part of the gate structure. FIG. 19 illustrates areas exposed to self-aligned body implantation in another preferred embodiment of a SAHS LDMOS device. As illustrated in FIG. 19, the exposed area may extend beyond the gate polysilicon edge at the drain side, in which case the p-type implantation will be done in the source region (resulting in a body), the gate polysilicon region and on the drain side of the gate polysilicon (resulting in a region that influences the electric field distribution of the drift region).

In Step 5, the self-aligned body is created using p-type, quad rotated, tilted ion implantation, as illustrated in FIG. 17. Examples of implant species include boron and indium. The implant angle alpha (α) 65 can in principle be between zero (0) degrees and 90 degrees, but for practical implementation, 30 degrees is reasonable. The maximum projected implant depth is limited to that which can be masked by the polysilicon—thicker polysilicon enables higher implant energy. The dose also requires some consideration, where the minimum dose is governed by desired punch through and leakage performance. For best performance, a high body dose in the region of 9e13 atoms per square centimeter (atoms/cm$^{-2}$) is needed. Reducing this dose results in an increase in leakage between the drain and source regions. A consequence of this high body doping, is that a higher gate voltage is needed to invert the body region and turn on the device. Typically, threshold voltages in excess of 1.5V can be expected.

Figure 20:
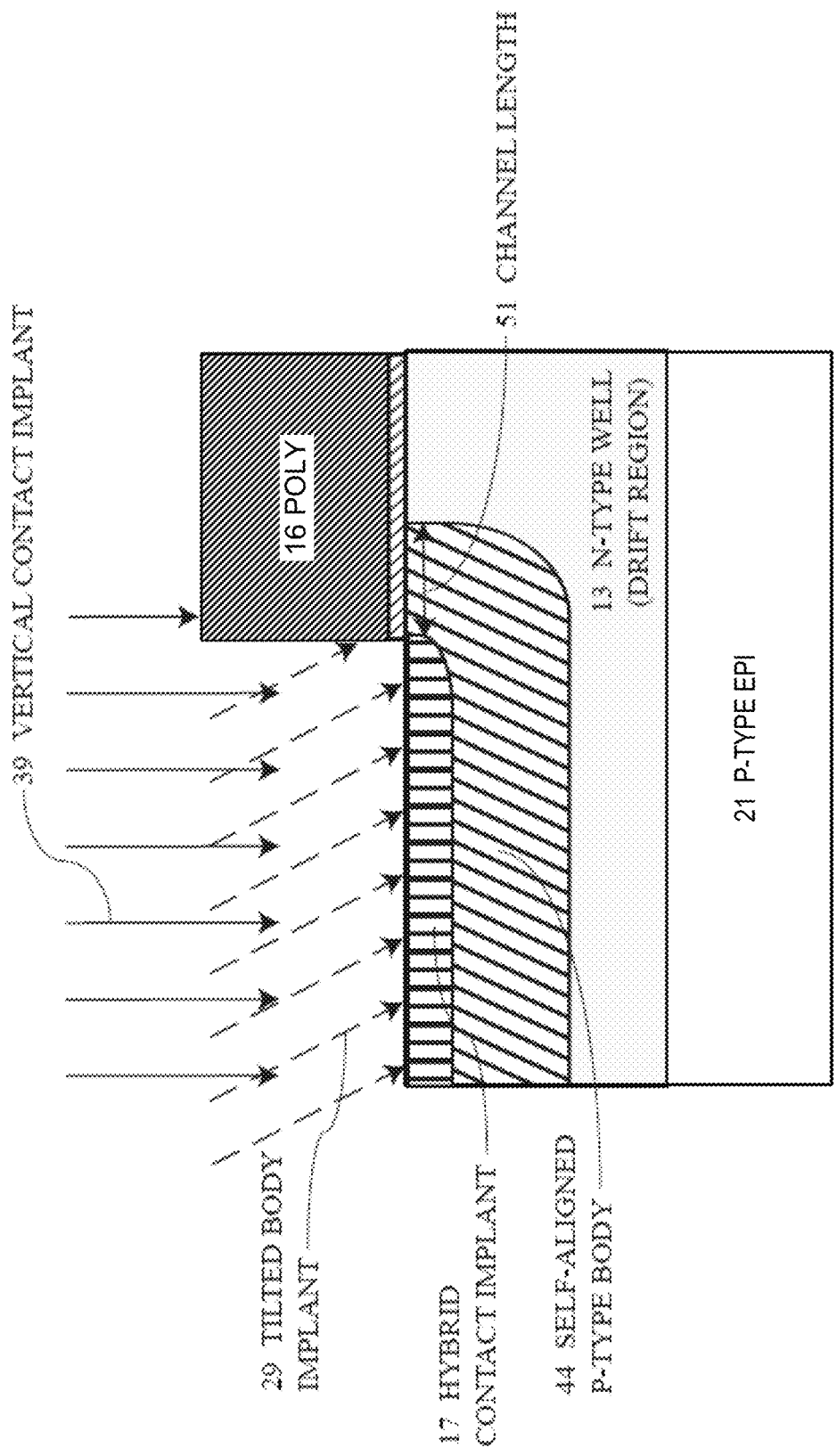
FIG. 20 illustrates the location of self-aligned body and hybrid contact implants on the source side of SAHS LDMOS devices.

Also, in Step 5, either before or after the p-type body implantation, the vertical hybrid contact implant is formed in the same exposed body and polysilicon regions as the self-aligned body, as shown in FIG. 17. In at least some embodiments, the hybrid contact implant may utilize the same mask as that used for the p-type body implantation. FIG. 20 illustrates the location of self-aligned body and hybrid contact implants on the source side of SAHS LDMOS devices. This n-type implantation, a vertical contact implant 39 in FIG. 20, is a vertical, zero-degree implantation and is self-aligned to the gate structure. Typically, arsenic can be used with quite a high dose in the region of 1e15 atoms/cm$^2$. While both the self-aligned body implant and hybrid contact implants are aligned to the gate structure, FIG. 20 illustrates how the difference in implant angle creates an offset in the well positioning to separate the source and body regions, and as a result, a very high degree of control to establish the channel length 51. The implant energy is chosen to satisfy two criteria. The first criteria is to create a hybrid contact implant which is within the self-aligned body otherwise the source would punch through to the underlying n-type drift region. Thus, the implanted depth must be less than that of the body implants. The second desired criteria is to create a Schottky source junction. This requires that a metal silicide to p-type semiconductor junction is created. If the n-type hybrid contact implant depth is greater than that of the silicide, then we will have created a typical PN junction, which must be avoided to satisfy the second criteria. Thus, the as-implanted depth of the hybrid contact implant is sufficiently shallow as to be less than the depth of the silicide. For a 30 nm silicide, an arsenic implant with 10 keV energy meets this second criteria.

Figure 3A:
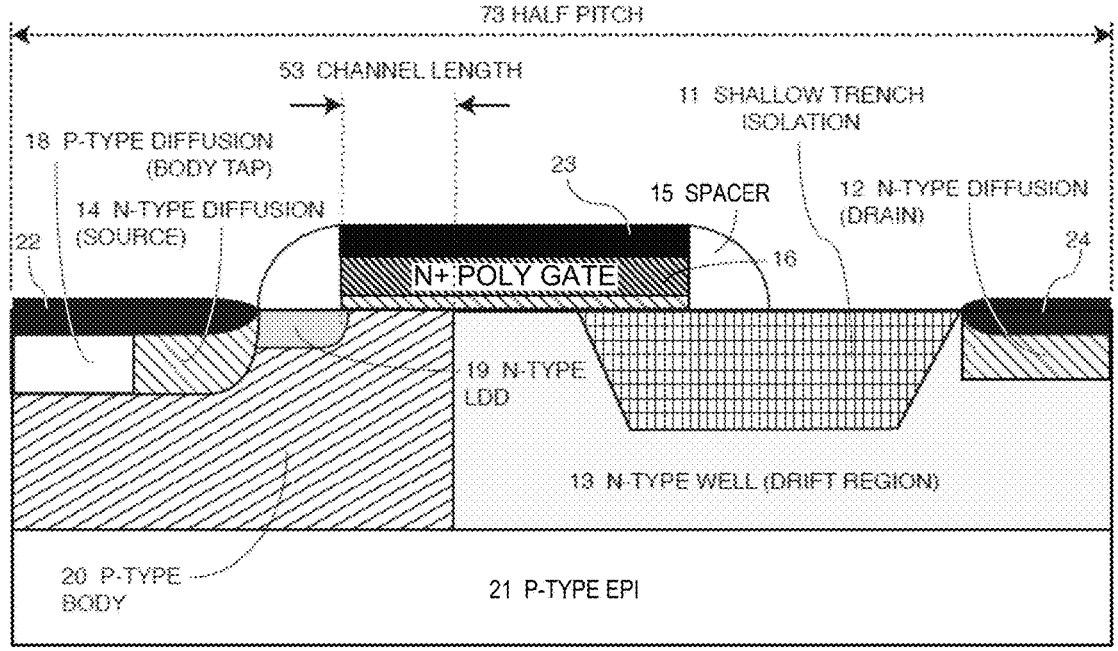
FIG. 3A is a cross-sectional view of a single-finger conventional prior art LDMOS device.
Figure 3B:
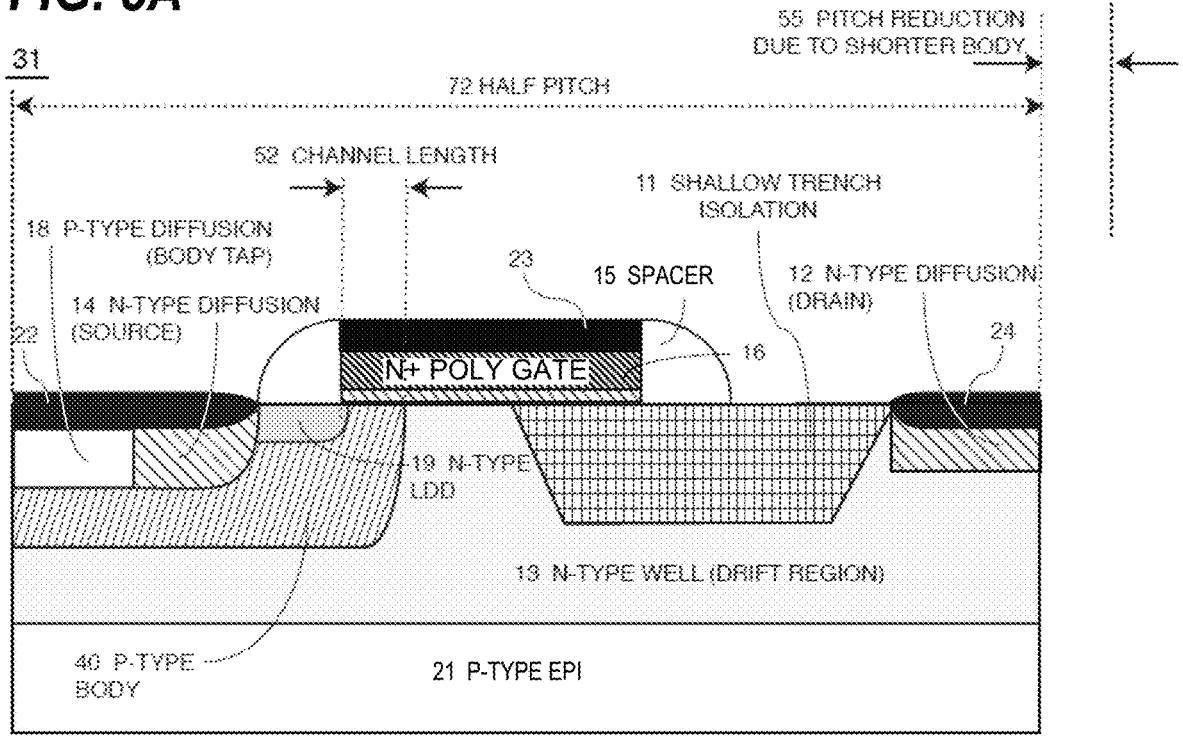
FIG. 3B is a cross-sectional view of a single-finger self-aligned body prior art LDMOS device.
Figure 21:
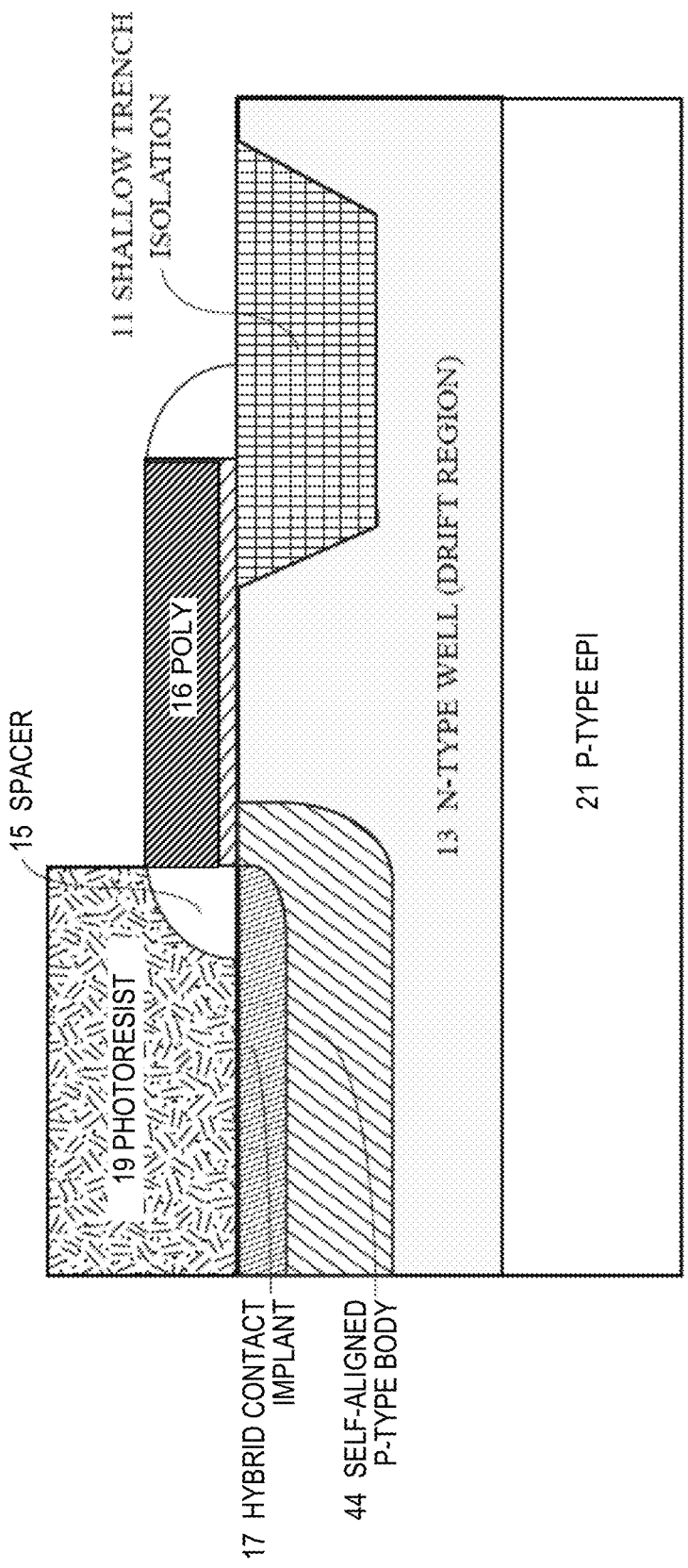
FIG. 21 illustrates the photoresist mask for n+ diffusion in SAHS LDMOS devices.

Step 6 is the formation of the gate sidewall spacer structure. Following the formation of the spacer(s), the n+ and p+ diffusion occurs in Step 7. The order of application for the n+ and p+ diffusion does not affect the function of the device. FIG. 21 illustrates the photoresist mask for n+ diffusion in SAHS LDMOS devices. In one preferred embodiment, photoresist is spun on first, exposed and developed to open a window across the gate structure and drain active regions, as illustrated in FIG. 21. This window enables an n+ diffusion into both the drain region and gate structure. Notably, the source region is covered with photoresist and does not receive the n+ diffusion, as would normally be the case in a conventional self-aligned body LDMOS device 31 in FIG. 3B. The omission of the n+ from the source region in LDMOS device 31 in FIG. 3B will enable a Schottky junction to be created in conjunction with silicidation of the metal contacts, as illustrated in SAHS device 90 in FIG. 11. Following the n+ implant, the photoresist is stripped. A mask patterns a photoresist coating to perform p+ diffusion, and creating a contact to the body region.

A variant of dielectric isolation is active gap isolation, as illustrated in FIG. 15. In some embodiments Step 8 is performed at this point to create a silicide block. A layer of oxide is deposited that extends at least partially over the gate polysilicon and extends to the drain region. This silicide block prevents the formation of silicide in this region, resulting in a gate-to-drain isolation region.

A further variant of the active gap isolation is the simultaneous use of the tilted self-aligned p-type body implant and vertical hybrid contact implant on the drain-side of the polysilicon gate, as illustrated in FIG. 16 and detailed as optional in Step 5. Therefore, when these two implants occur on the drain side of the polysilicon gate in Step 5 in combination with Step 8, silicide block isolation, the result is a drain-side region used in conjunction with a silicide block.

Finally Step 9 is a blanket layer of metal deposited on the substrate. The substrate is annealed. During this high temperature anneal, metal atoms diffuse into the silicon (in the case where the particular metal is the dominant diffusing species and not silicon) and combine with the silicon atoms to form a silicide. In doing so, the n-type hybrid contact implant is displaced and pushed before the growing silicide, forming a narrow region of high doping at the silicide-to-silicon interface. Unreacted metal is stripped before a second annealing is performed to convert the silicide to a low ohmic phase. This forms metal contacts to the source, gate, drain and body regions.

Figure 22A:
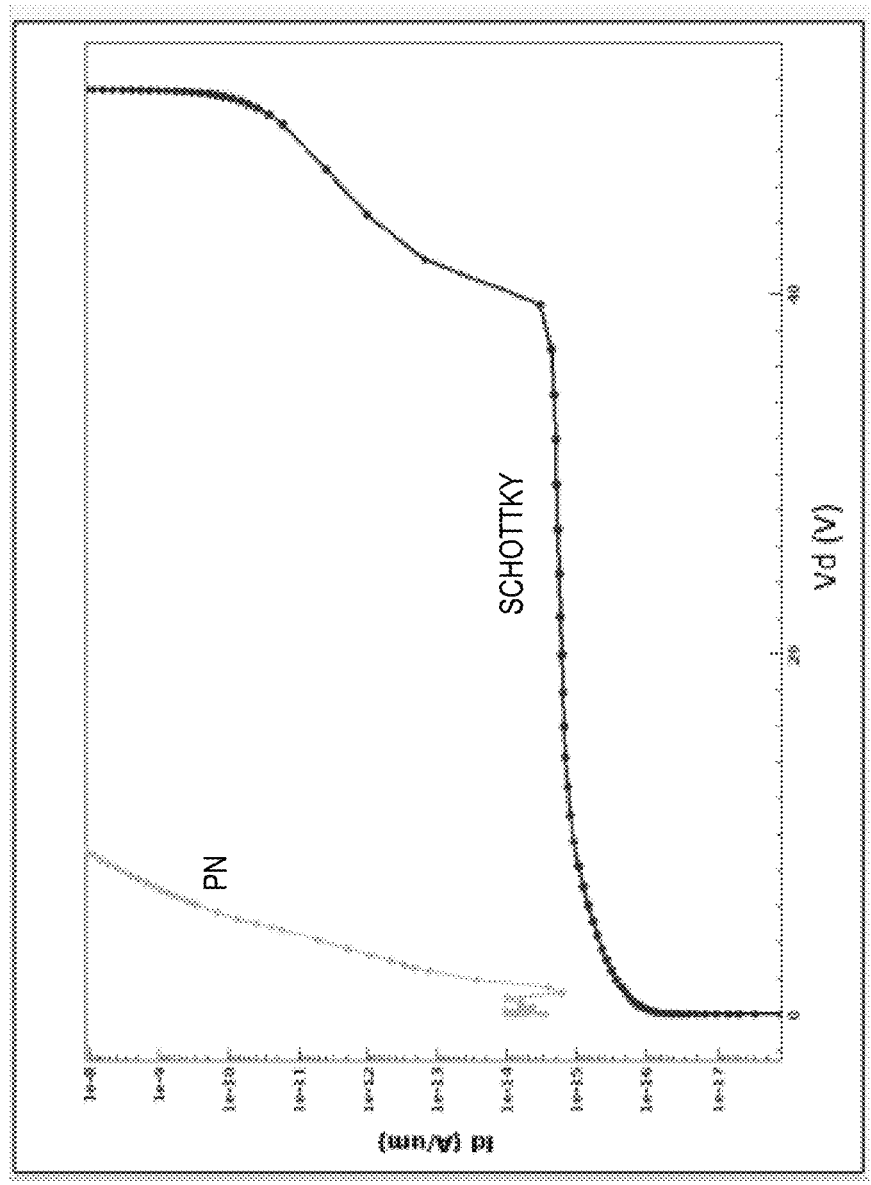
FIG. 22A illustrates punch through IV characteristic for a PN source on a conventional LDMOS device and a hybrid source on a SAHS LDMOS device.
Figure 22B:
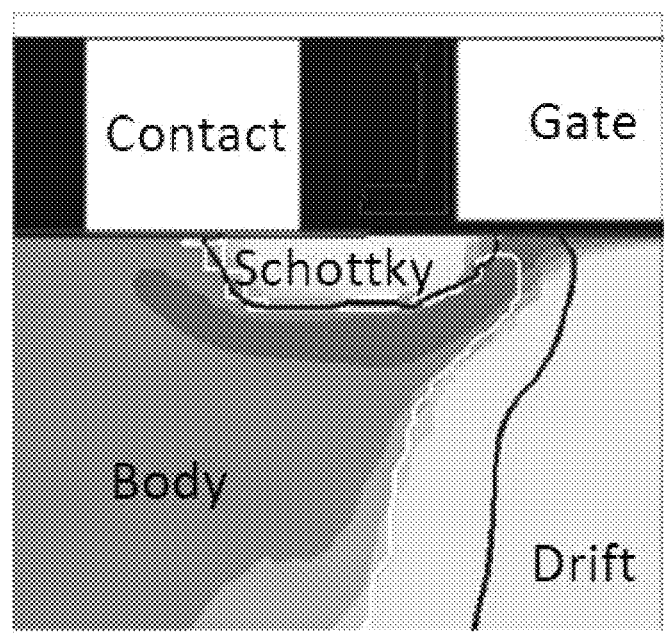
FIG. 22B plots current density, illustrating mitigation of punch through on a SAHS LDMOS device.

Using such a method of manufacture 10000 as described with respect to FIG. 9, the problems of punch through, shallowness of body resulting in limited SOA, and high electric fields causing leakage can be addressed. Revisiting each of those problems in turn, beginning with the punch through. FIG. 22B plots current density, illustrating mitigation of punch through on a SAHS LDMOS device. As illustrated in FIG. 22B, a hybrid source is much shallower than the conventional n+ source implantation, preventing this punch through mechanism. FIG. 22A illustrates punch through IV characteristic for a PN source on a conventional self-aligned LDMOS device similar to device 31 in FIG. 3B, and a hybrid source on a SAHS LDMOS device, similar to device 90 in FIG. 11. In such a case, the shallow hybrid source compensates for the shallow body region to prevent punch through, enabling a higher operating voltage (Vd).

Figure 23:
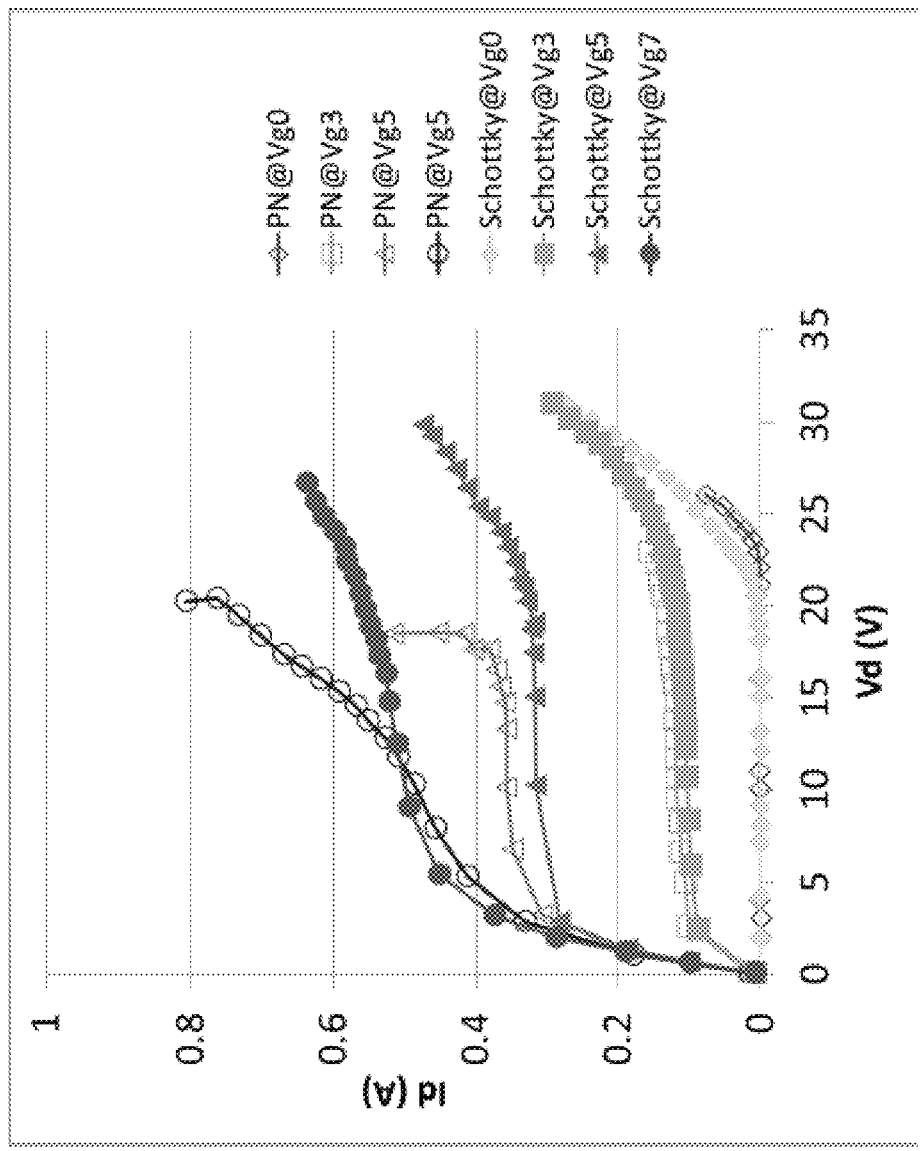
FIG. 23 is a graph showing a 100 ns comparison of a self-aligned body and hybrid contact (Schottky source) and a PN source.

The second cited problem with the self-aligned body method of manufacture is the inherent shallowness of the body region, resulting in high body resistance, premature triggering of the BJT and limited safe operating area. The hybrid source can also compensate for this in at least two ways. The first is that the shallower junction results in a lower base resistance Rbulk 49 in FIG. 6, and thus a lower base-emitter voltage during drain-bulk breakdown, which delays the turn-on and triggering of the parasitic BJT 41. Secondly, the Schottky source junction, even when forward biased, has poor electron injection efficiency to the body, which acts to suppress the triggering of the parasitic BJT. Both effects together lead to an improvement in the E-SOA, as illustrated by the TLP comparison in FIG. 23. FIG. 23 is a graph showing a 100 ns comparison of a self-aligned body and hybrid source and a PN source.

Figure 5:
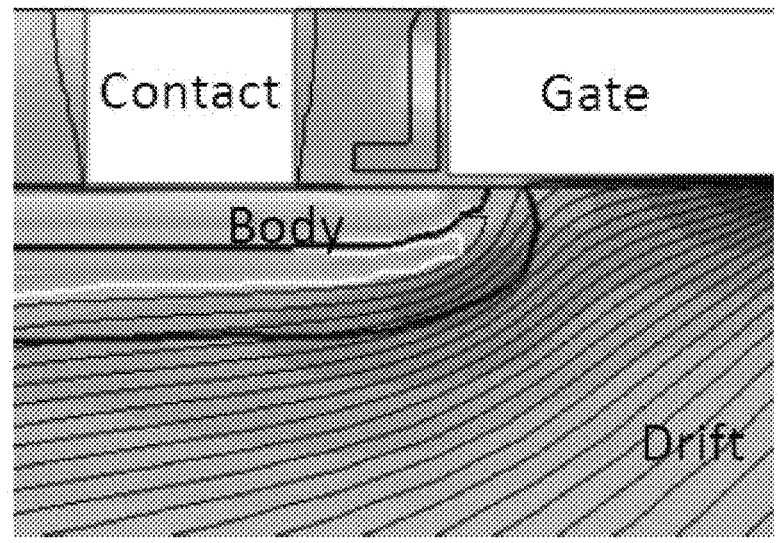
FIG. 5 illustrates a high electric field at the corner of a shallow, self-aligned body under the polysilicon gate.
Figure 6:
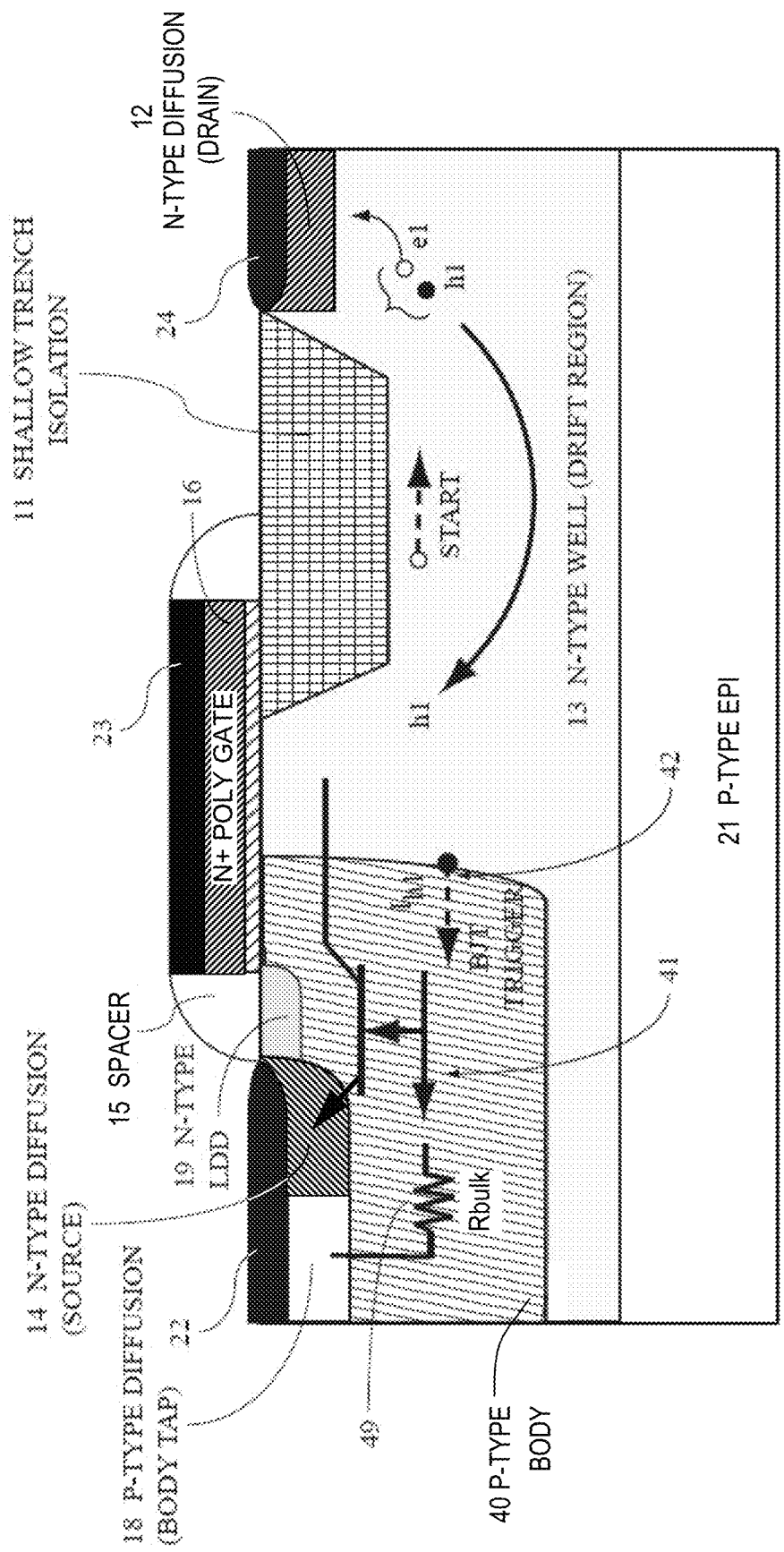
FIG. 6 is a cross-sectional view of a single-finger conventional self-aligned body prior art LDMOS device.
Figure 7:
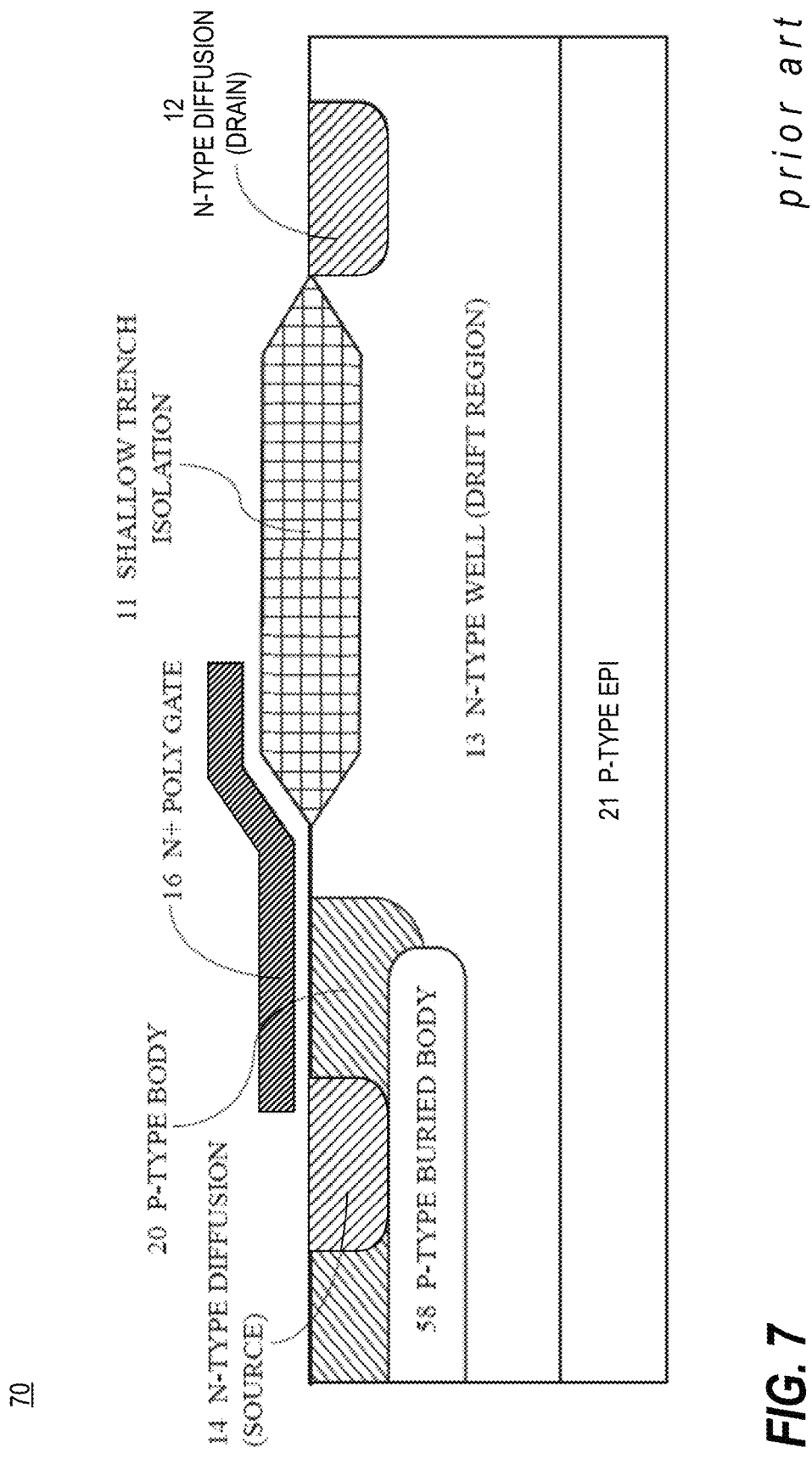
FIG. 7 is a cross-sectional view of a single-finger conventional prior art LDMOS device with deep p-type buried body.
Figure 8:
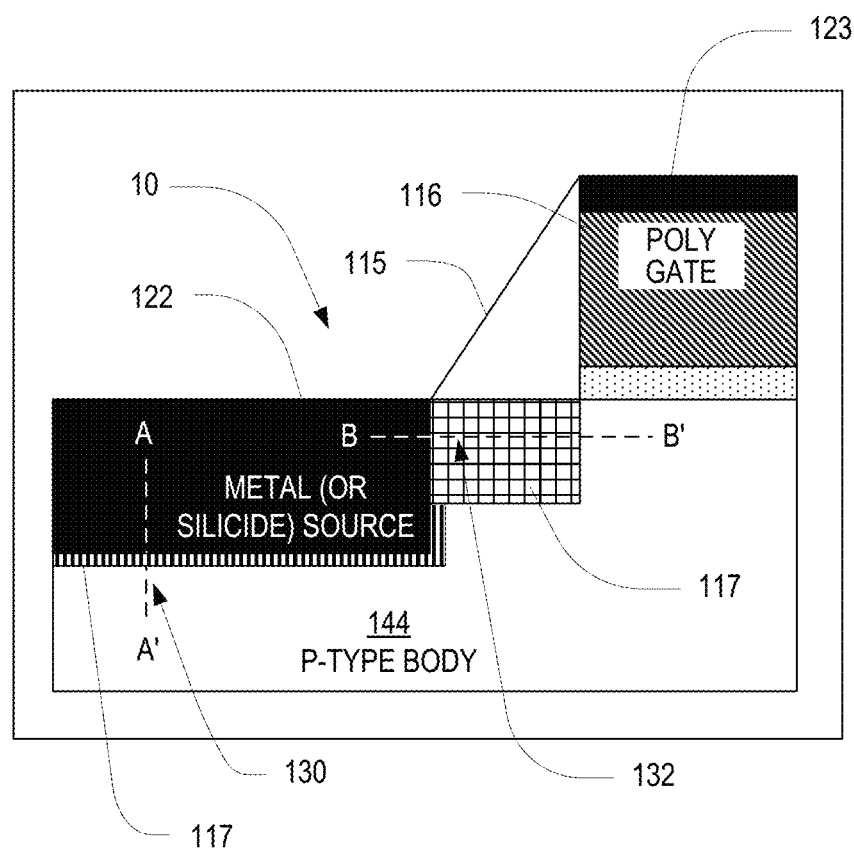
FIG. 8 is an enlarged cross-sectional view of an exemplary prior art hybrid contact.
Figure 24:
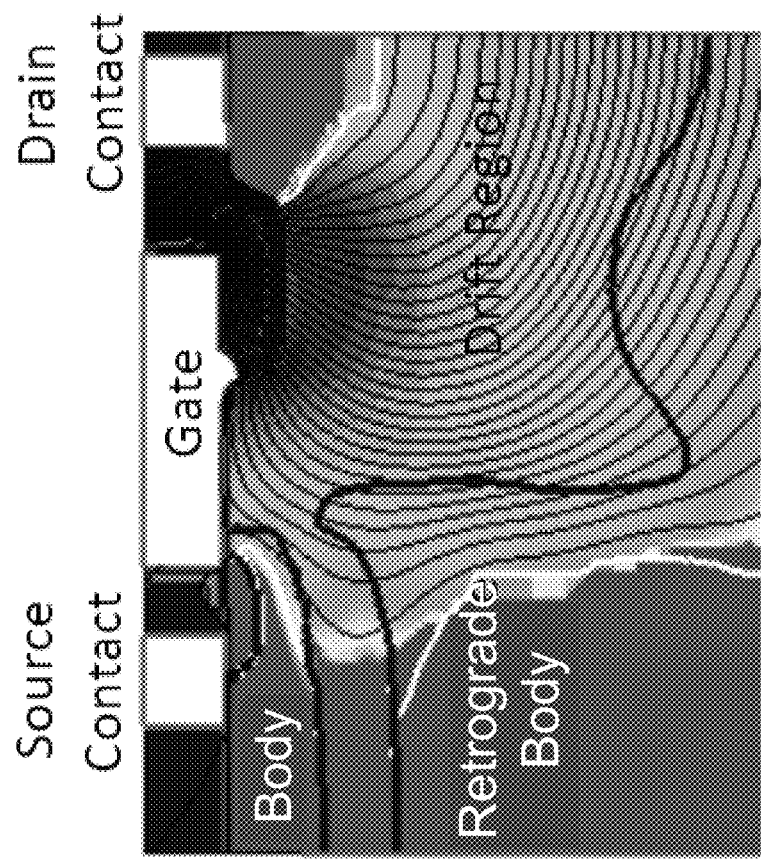
FIG. 24 illustrates improved electric field and impact ionization with retrograde body.

Lastly, the third cited problem with the self-aligned body method of manufacture is the existence of high electric fields at the corner of the self-aligned body. The proposed additional retrograde body implant, shown in FIGS. 13, 40B, 41B, and 41C, addresses this problem by manipulating the high electric field profile shown in FIG. 5, resulting in the improved electric field profile shown in FIG. 24. The use of a deep, floating retrograde p-type region that is discontinuous from the shallow body region 44 enhances the leakage current and breakdown voltage without impacting the channel region, because the retrograde body well leaves little dopant at the silicon surface.

Figure 37A:
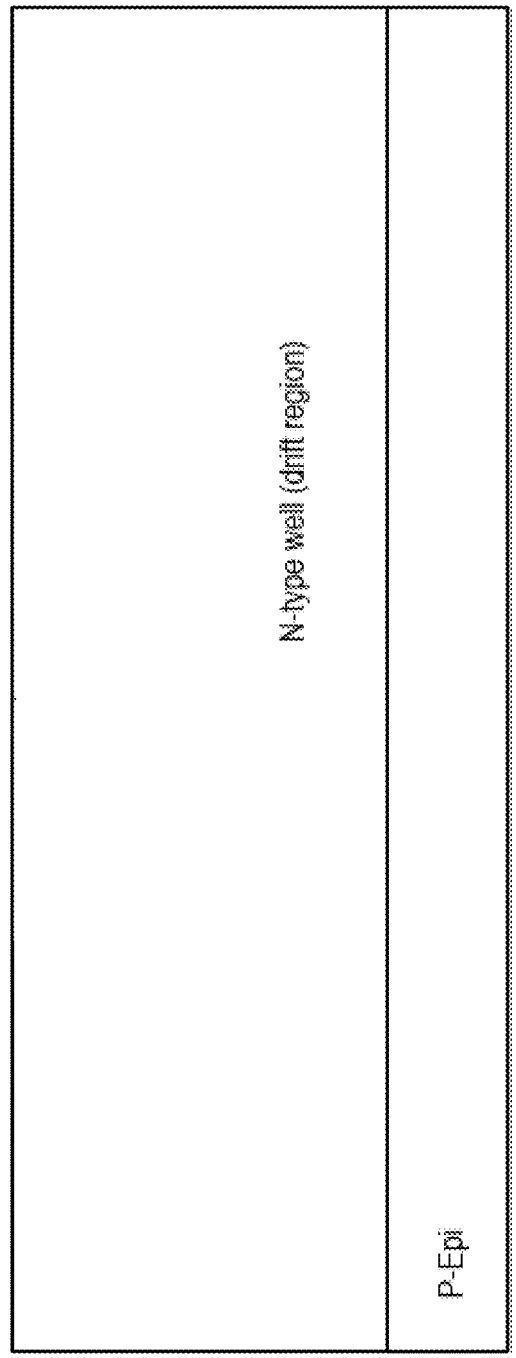
FIGS. 37A-37H are cross-sectional views illustrating various steps in a method of fabricating a SAHS LDMOS device with drain-side p-type implant, silicide block, and retrograde body well, as shown in FIG. 16.
Figure 37B:
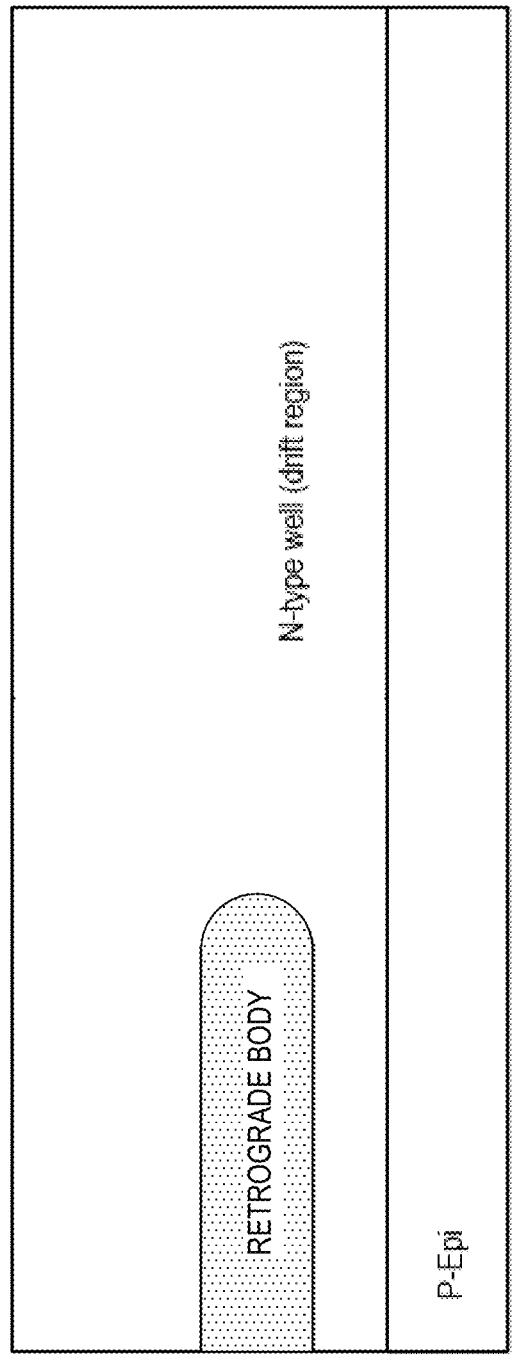
Figure 37C:
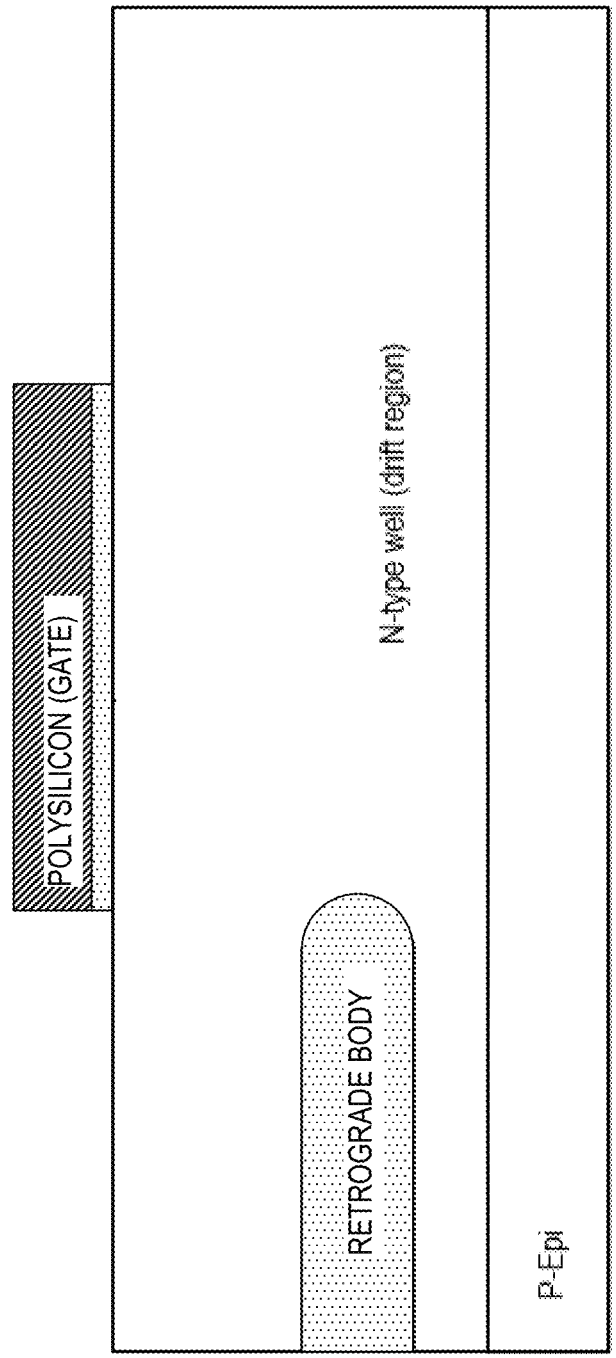
Figure 37D:
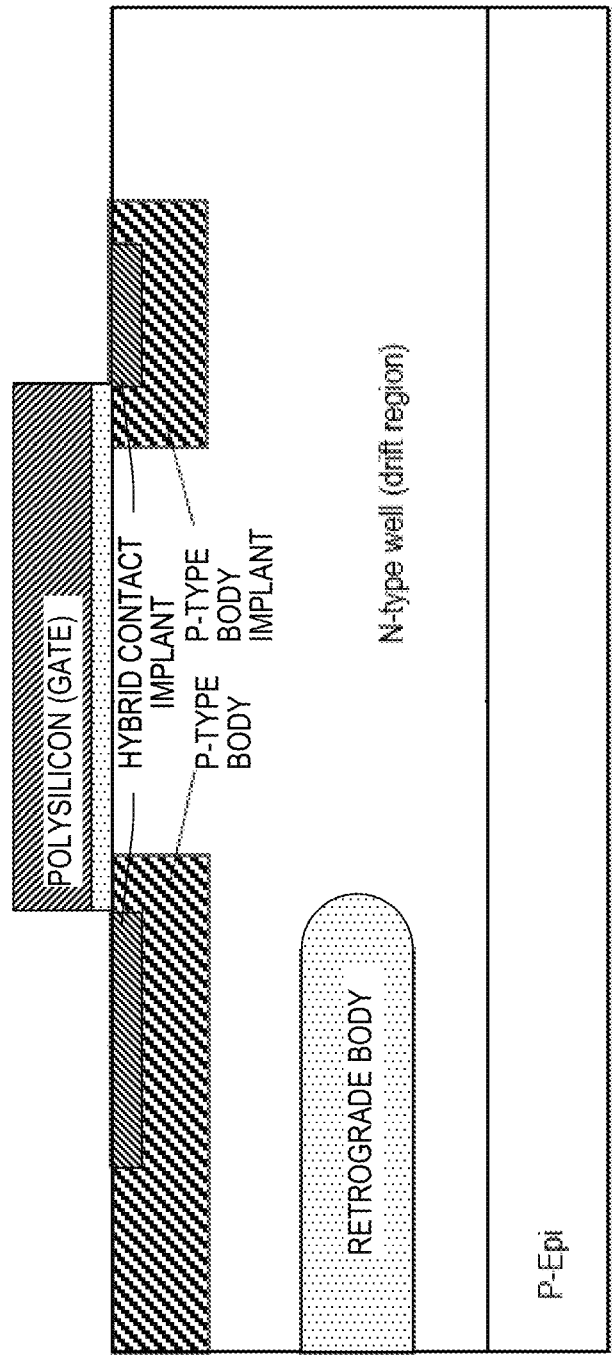
Figure 37E:
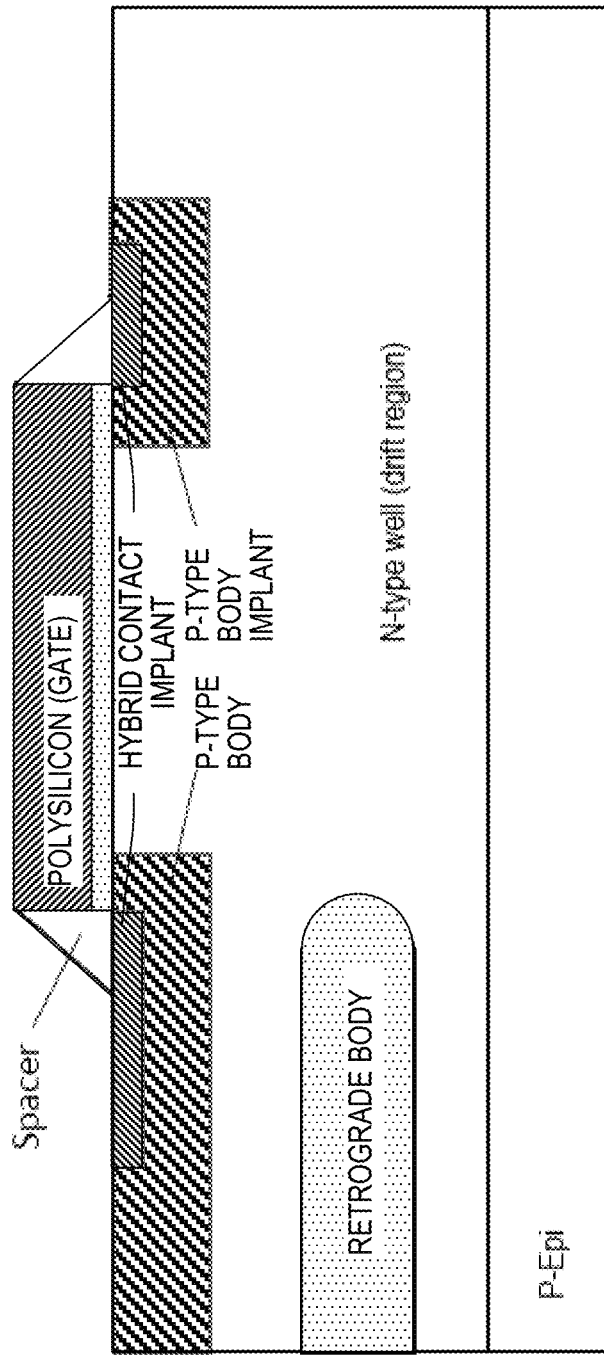
Figure 37F:
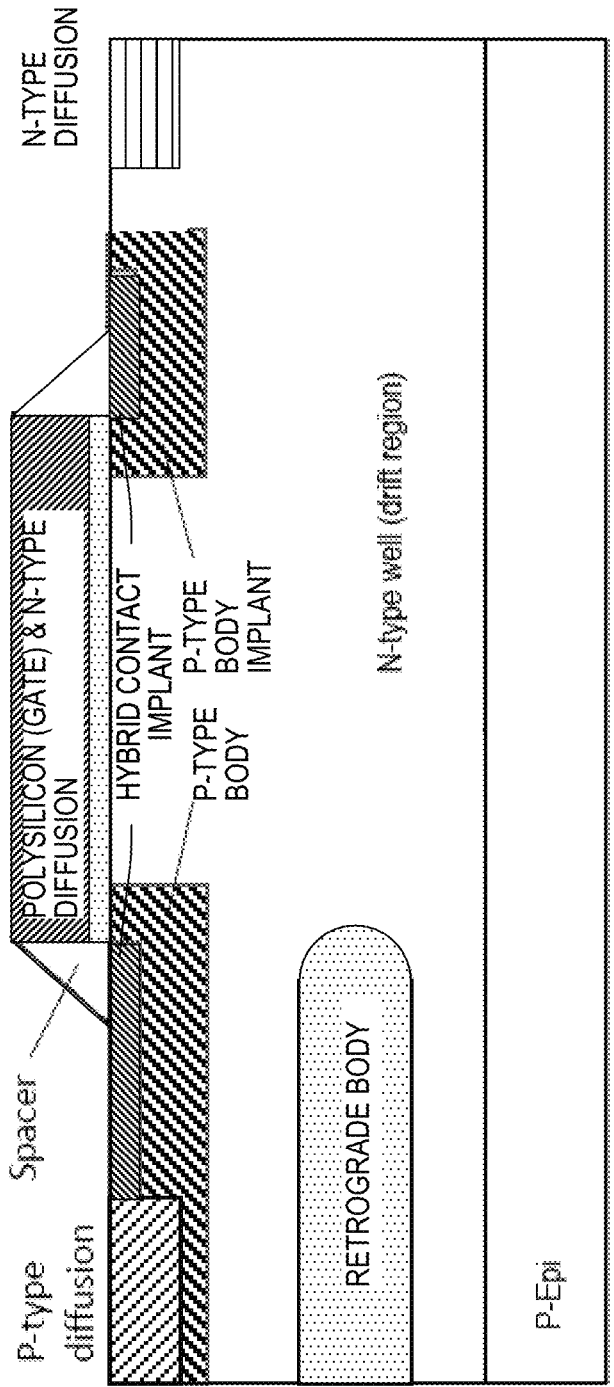
Figure 37G:
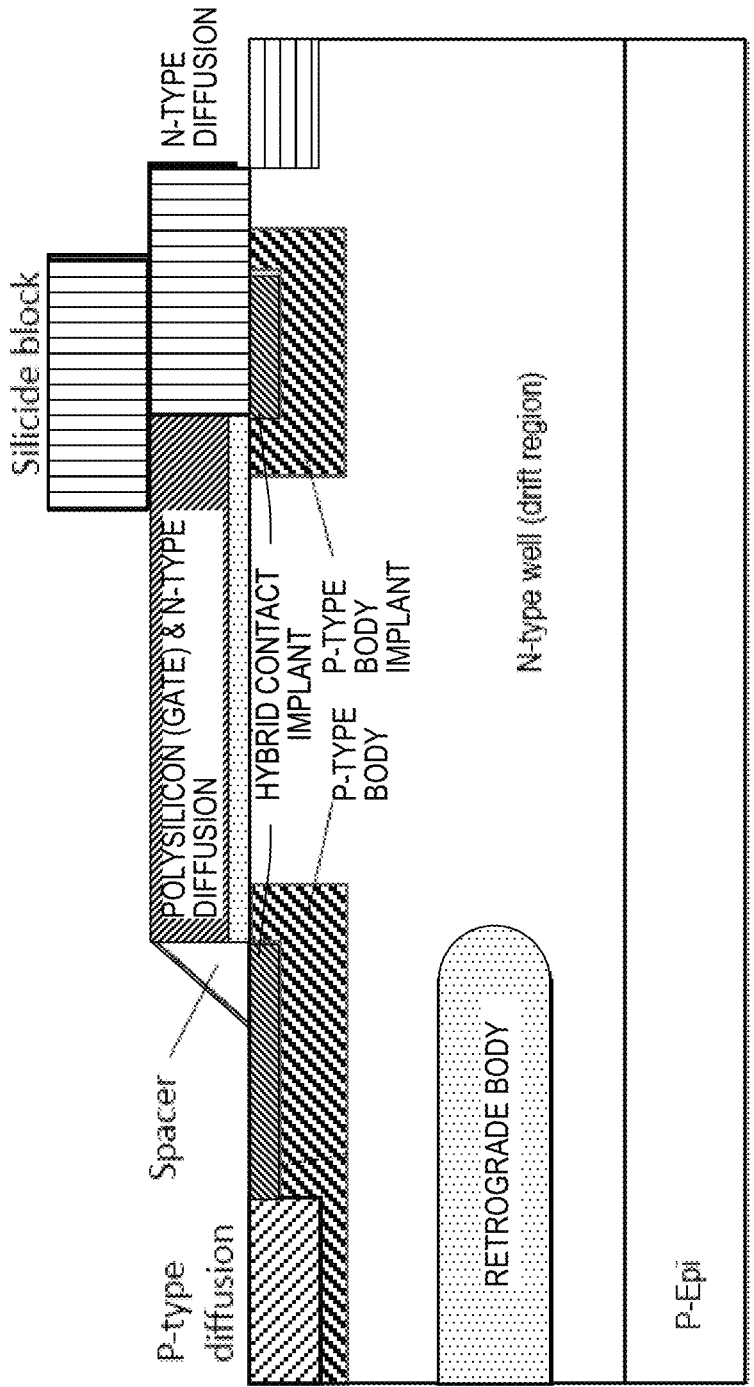
Figure 37H:
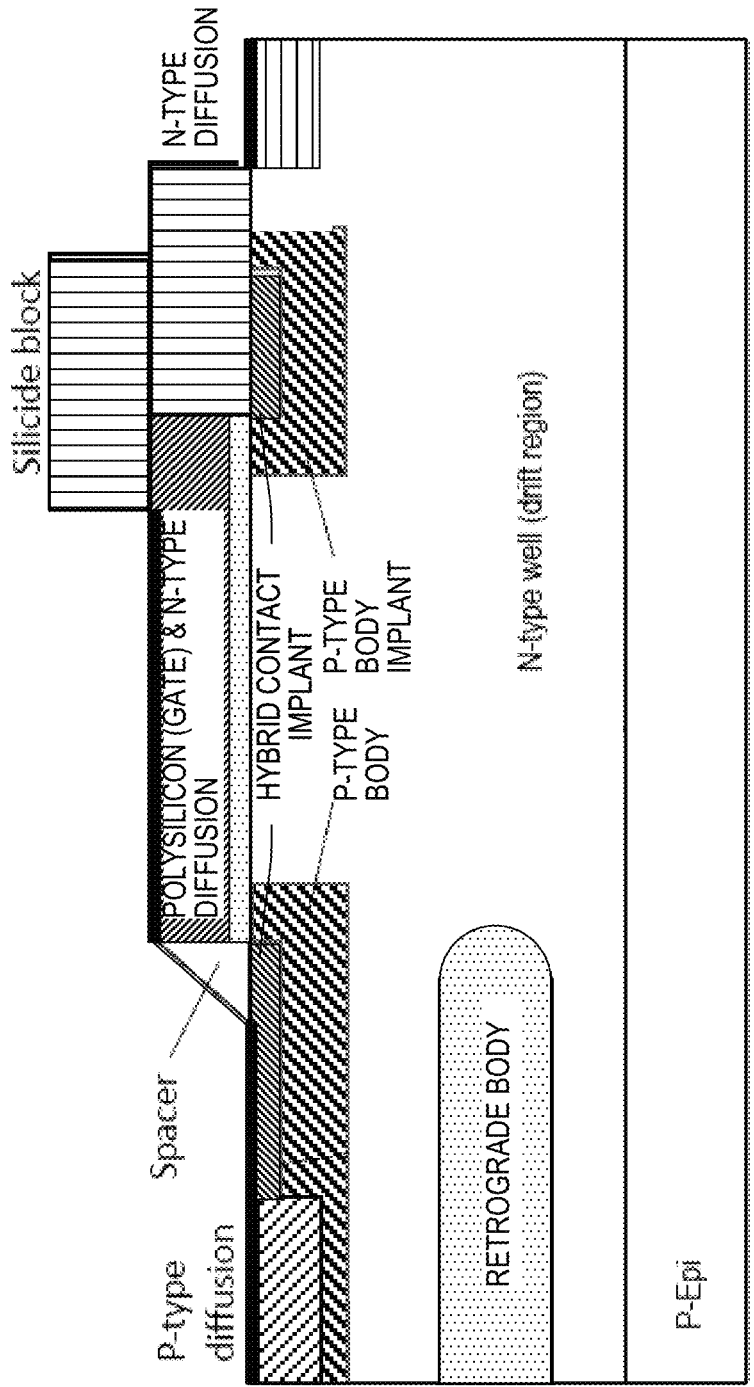

FIGS. 37A-37H are cross-sectional views illustrating various steps in a method of fabricating a SAHS LDMOS device with drain-side p-type implant, silicide block, and retrograde body well, as shown in FIG. 16 and the corresponding fabrication process flow 10011 in FIG. 35. More specifically, FIG. 37A is a cross-sectional view illustrating the global n-type implant shown in FIG. 35 at process step 10211. FIG. 37B is a cross-sectional view illustrating the retrograde well implant shown in FIG. 35 at process step 10311. FIG. 37C is a cross-sectional view illustrating the poly deposition and poly etch to fabricate the gate structure shown in FIG. 35 at process step 10411. The mask for the self-aligned body implant and self-aligned vertical hybrid contact implants exposing the entire gate structure and adjacent regions was described above with respect to FIG. 19. FIG. 37D is a cross-sectional view illustrating the shallow body implantation and the hybrid contact implantation shown in FIG. 35 at process step 10511. FIG. 37E is a cross-sectional view illustrating the formation of the gate sidewall spacer structure shown in FIG. 35 at process step 10611. FIG. 37F is a cross-sectional view illustrating the n-type diffusion into both the gate structure and the drift region to form a drain region, and the p-type diffusion into the body region to form the body tap shown in FIG. 35 at step or process 10711. FIG. 37G is a cross-sectional view illustrating the silicon dioxide deposition layer shown in FIG. 35 at process step 10811 partially covering the gate polysilicon and extending to the drain region to prevent formation of silicide in this region. Finally, FIG. 37H is a cross-sectional view illustrating the formation of the hybrid contact at the source and ohmic contacts at the body tap, the gate structure, and the drain region during the fabrication of the SAHS LDMOS device. The silicidation process preferably involves laying down a blanket layer of metal, which may be via sputtering, and silicidation shown in FIG. 35 at step or process 10911. In at least some embodiments, this may involve a first anneal to form a silicide on regions where the metal is in contact with silicon, removing the unreacted metal, and a second anneal which transforms the silicide to a low ohmic phase. The sequence of process steps in FIGS. 37A-37H may be used, for example, to fabricate the SAHS LDMOS device 140 of FIG. 16.

This novel process flow addresses many of the problems that are inherent to conventional, self-aligned body LDMOS transistors. Combining the hybrid source approach with conventional self-aligned body formation provides synergistic advantages.

There is a first manufacturing synergy between the self-aligned body and hybrid source formation that does not exist for either independently. Implantation for both can be performed at the same photolithography step. At this point in the process, the photoresist is spun on, exposed and developed. The resulting exposed area includes the body region and at least part of the gate polysilicon. A tilted ion implantation is then performed to form the polysilicon aligned body. Immediately after, a vertical implantation of the second dopant polarity is performed for the hybrid contact implant to enable a Schottky source. Thus, with one photo step, all body and source implantation can be completed, enabling process simplicity and cost reduction.

There is a second manufacturing synergy between the self-aligned body and the hybrid source that does not exist for either independently. Both the body implant and the hybrid contact implant are self-aligned to the gate structure. This provides accurate positioning of the source implant relative to the body implant. Thus, an accurately placed ESD solution is provided that is insensitive to process variability. In contrast, a standard self-aligned body that utilizes deep implants to improve ESD will be susceptible to the lithographic placement of that implant, the width of the photoresist opening over the body region and even the slope of the photoresist.

Figure 4:
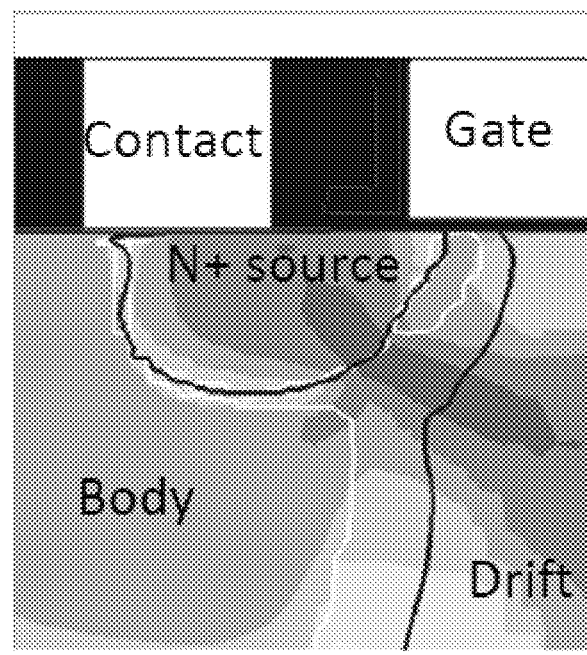
FIG. 4 plots current density for a PN source, illustrating the punch through mechanism from n+ source to n-type drift well.

There is a first technical synergy between the self-aligned body and the hybrid source that does not exist for either independently. Self-aligned implants tend to be shallow. With no underlying implantation of the first polarity as the body implant, there is a tendency for a conventional source implant of the second polarity to punch through to an underlying drift region of the second polarity, as illustrated in FIG. 4.

There is a second technical synergy of the self-aligned body and the hybrid source, since the tilted self-aligned body implant and vertical hybrid contact implant may be utilized to simultaneously create gate-aligned implants on the drain-side of the polysilicon gate. The resulting p-type body implant region immediately adjacent to the polysilicon gate, provides a drain-side region that influences the electric field distribution of the drift region, in the active gap isolation architecture.

The novel retrograde body provides additional advantages to the hybrid source and self-aligned body construction by the way of junction leakage and breakdown voltage, without contributing dopant to the silicon surface—which would negatively impact the channel region. This retrograde body is distinct from others, such as Hower, Jung '774, and Jung '100, in that the self-aligned body and retrograde body do not form a continuous, vertical p-type region, but are separated by a narrow n-type drift region, in the global implant architecture. Instead, the non-continuous retrograde body enhances the self-aligned body by manipulating the high electric field at the corner of the self-aligned body. Furthermore, this novel vertical doping profile is enabled by the hybrid source for two reasons. The first is that the hybrid source is sufficiently shallow to mitigate punch through of the underlying shallow body region to the underlying n-type drift region, as can happen with a conventional PN source. This means that a continuous p-type body region formed from both the self-aligned body and deeper body implant is not needed. The second reason relates to the ruggedness and the ability to achieve a large operating area without device breakdown or destruction. Generally, the region directly below the source is highly doped to reduce the parasitic BJT base resistance and suppress triggering of the BJT. Purposefully omitting p-type dopant from under the source to form the retrograde body is the opposite of this conventional wisdom and is, generally speaking, a bad idea. However, when used with the hybrid source, good ESD robustness can still be maintained. Although the body resistance is increased, the intrinsically poor electron injection from the hybrid source still suppresses the parasitic BJT, thereby maintaining a robust device with a good electrical safe operating area. These effects cannot be achieved when using a conventional self-aligned body and PN source in conjunction with a retrograde body. Instead, conventional wisdom dictates that a continuous p-type vertical profile is used, as proposed by Jung '774, Hower, Edwards, McGregor, Jung '100, and Kim.

Thus, although significant benefits are achieved through use of self-aligned body and hybrid source, the manufacturing synergy of the trinity of features—self-aligned body, hybrid source and retrograde body—enables all of the traditional problems of a self-aligned body to be successfully addressed. Devices in accordance with such preferred embodiments are shown in FIGS. 13 and 40A-41C, each of which shows an LDMOS with self-aligned body and hybrid source with a retrograde body well under the self-aligned body.

However, it will be appreciated that the use of a retrograde body well 45 with a self-aligned body in an LDMOS device (as shown, for example, in FIGS. 40A-41C) offers additional advantages, particularly related to the relative size thereof, compared to the use of a buried body 58 with a self-aligned body device (as shown in FIGS. 38A-39C). The buried body 58 is established in one of two ways, either with a mask prior to the gate structure formation, or during the gate structure formation whereby the buried body is implanted immediately after a dedicated polysilicon etch. In both cases there are disadvantages with the buried body that are not observed with the retrograde body. First, with the mask-defined buried body, any implanted dopant that overlaps the polysilicon gate or resides in the surface under the gate edge will adversely impact the device electrical characteristics, such as increasing threshold voltage and/or on-resistance. In order to avoid problems due to maximum mask misalignment, the standoff 81 provides a lateral separation between the poly-edge and the buried body implant, but this increases the poly-to-poly length, which increases the active device area of the LDMOS device. In contrast, the retrograde body well 45 can extend under the gate poly, as there is little surface dopant to impact the channel region of the device. As such, the use of a deep, floating retrograde p-type region that is noncontiguous with the shallow body region 44, enhances the leakage current and breakdown voltage without impacting the channel region or affecting the poly-to-poly length.

Second, integrating the buried body with the polysilicon etch process also has a number of disadvantages. The need for a dedicated polysilicon etch for the source/body region and the associated additional mask adds to both the process complexity and cost. The same photoresist is used to both define the region for the buried body and the polysilicon to be etched. Since the buried body length mask opening will be larger than what can be patterned for the polysilicon, the minimum poly-to-poly length cannot be used, resulting in a larger device pitch. Although the buried body implantation is coincident with the polysilicon edge, the practical realities of lithography and ion implantation (e.g. well proximity effects), mean that some of the buried body dopant is implanted in the channel region, which again adversely affects the electrical characteristics.

Finally, it will be appreciated that in some embodiments, a corresponding fabrication process has applicability for various other self-aligned body MOS devices.

It should be noted that the description and drawings merely illustrate basic principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of fabricating a power transistor structure, comprising the steps of:
   (a) providing a substrate of a first dopant polarity;
   (b) forming a drift region, of a second dopant polarity, on or within the substrate;
   (c) forming a gate structure by oxide growth, polysilicon deposition, and polysilicon etch at least over a portion of the drift region, wherein the gate structure has a source side and a drain side;
   (d) implanting a dopant of the first dopant polarity into the drift region on the source side of the gate structure to form a body region, the body region being self-aligned to, and extending under, the gate structure;
   (e) implanting a dopant of the second dopant polarity into the self-aligned body region, the implanted dopant defining a hybrid contact implant that has a first depth;
   (f) forming a gate sidewall spacer structure such that a first portion of the hybrid contact implant is disposed beneath the gate sidewall spacer structure and a second portion of the hybrid contact implant is exposed adjacent to the gate sidewall spacer structure;
   (g) diffusing a dopant of the first dopant polarity into the body region to form a body tap;
   (h) applying a photoresist coating to the body region, including the body tap, but leaving the gate structure and drift region entirely or nearly entirely exposed;
   (i) diffusing a dopant of the second dopant polarity into the gate structure and into the drift region to form a drain region;
   (j) depositing a blanket layer of metal;
   (k) annealing the metal of the blanket layer to react with exposed silicon/polysilicon on the body tap, the drain region, the gate structure and the second portion of the hybrid contact implant to form a silicide, wherein the silicide formed on the second portion of the hybrid contact implant has a second depth, and wherein the second depth is greater than the first depth; and
   (l) removing unreacted portions of the blanket layer of metal, thereby resulting in metal contacts to the body tap, the drain region, the gate structure, and the hybrid contact implant;

(m) whereby the silicide, the first portion of the hybrid contact implant, and the second portion of the hybrid contact implant together form a hybrid contact, which constitutes a source region, and wherein a channel region is established between the source region and the drift region; and (n) whereby the resulting hybrid contact defines first, second, and third electrical junctions, wherein the first electrical junction is a Schottky junction formed vertically between the silicide and the substrate, wherein the second electrical junction is an ohmic junction formed laterally between the silicide and the first portion of the hybrid contact implant, and wherein the third electrical junction is a rectifying PN junction between the first portion of the hybrid contact implant and the channel region.

2. The method of claim 1, wherein the step of implanting a dopant to form a body region includes implanting the dopant via tilted implantation.

3. The method of claim 2, wherein the step of forming a drift region on or within the substrate includes forming the drift region across the entirety of the power transistor structure, and wherein the step of implanting a dopant via tilted implantation to form a body region includes implanting the dopant via tilted implantation into the drift region on the source side of the gate structure to form the body region.

4. The method of claim 3, wherein the hybrid contact implant is a first hybrid contact implant, and wherein the method further comprises:

(o) via tilted implantation, implanting a body implant, of the first dopant polarity, on the drain side of the gate structure, the body implant being self-aligned to, and extending under, the gate structure; and (p) implanting a dopant of the second dopant polarity into the body implant, the implanted dopant defining a second hybrid contact implant.

5. The method of claim 1, wherein the self-aligned body region is a shallow self-aligned body region, and wherein the method further comprises a step of implanting a retrograde body well, of the first dopant polarity, beneath and noncontiguous with the self-aligned body region.

6. The method of claim 1, wherein the step of implanting a dopant of the first polarity is carried out before or after the step of implanting a dopant of the second polarity but is carried out using the same mask.

* * * * *